United States Patent [19]
Ikeda et al.

[11] Patent Number: 5,497,028
[45] Date of Patent: Mar. 5, 1996

[54] LC ELEMENT AND SEMICONDUCTOR DEVICE HAVING A SIGNAL TRANSMISSION LINE AND LC ELEMENT MANUFACTURING METHOD

[76] Inventors: Takeshi Ikeda, 2-5-6-213, Sanno, Ohta-Ku, Tokyo, Japan; Susumu Okamura, 4-1-12-1305, Hiroo, Shibuya-ku, Tokyo, Japan

[21] Appl. No.: 335,420

[22] Filed: Nov. 2, 1994

[30] Foreign Application Priority Data

| Nov. 10, 1993 | [JP] | Japan | 5-305954 |
| Nov. 29, 1993 | [JP] | Japan | 5-323149 |
| Dec. 28, 1993 | [JP] | Japan | 5-353810 |

[51] Int. Cl.$^6$ ............................................. H01L 29/00
[52] U.S. Cl. .................. 257/531; 257/532; 257/534; 333/185
[58] Field of Search ........................ 257/528, 531, 257/532, 534; 333/185, 181; 336/200, 225

[56] References Cited

U.S. PATENT DOCUMENTS

| 5,039,964 | 8/1991 | Ikeda | 333/185 |
| 5,070,317 | 12/1991 | Bhagat | 336/200 |
| 5,095,357 | 3/1992 | Andoh et al. | 257/531 |
| 5,111,169 | 5/1992 | Ikeda | 333/185 |
| 5,132,650 | 7/1992 | Ikeda | 333/185 |
| 5,278,526 | 1/1994 | Ikeda | 333/185 |
| 5,367,275 | 11/1994 | Esaki et al. | 333/185 |

FOREIGN PATENT DOCUMENTS 3-259608  11/1991  Japan ............................ 257/531

OTHER PUBLICATIONS

"Microelectronics", pp. 142–144, by J. Millman et al., McGraw–Hill, 1988.

Primary Examiner—Rolf Hille
Assistant Examiner—Minhloan Tran
Attorney, Agent, or Firm—Oliff & Berridge

[57] ABSTRACT

An LC element and an semiconductor device comprising a second electrode having a predetermined shape formed in direct contact with the surface of a semiconductor substrate, and a first electrode having a predetermined shape formed interspaced by an insulation layer on the semiconductor substrate surface; and a method of manufacturing the LC element. A channel formed along the first electrode on application of a predetermined gate voltage to a control electrode connected to the first electrode and the second electrode respectively function as inductors, while a distributed constant type capacitor is also formed between these; and by using the channel as a signal transmission line, the LC element and a semiconductor device give excellent attenuation characteristics. The LC element and semiconductor device are easily manufactured, while parts assembly work in subsequent processing can be abbreviated, formation as a portion of an IC or LSI device is possible, and characteristics can also be controlled.

82 Claims, 53 Drawing Sheets

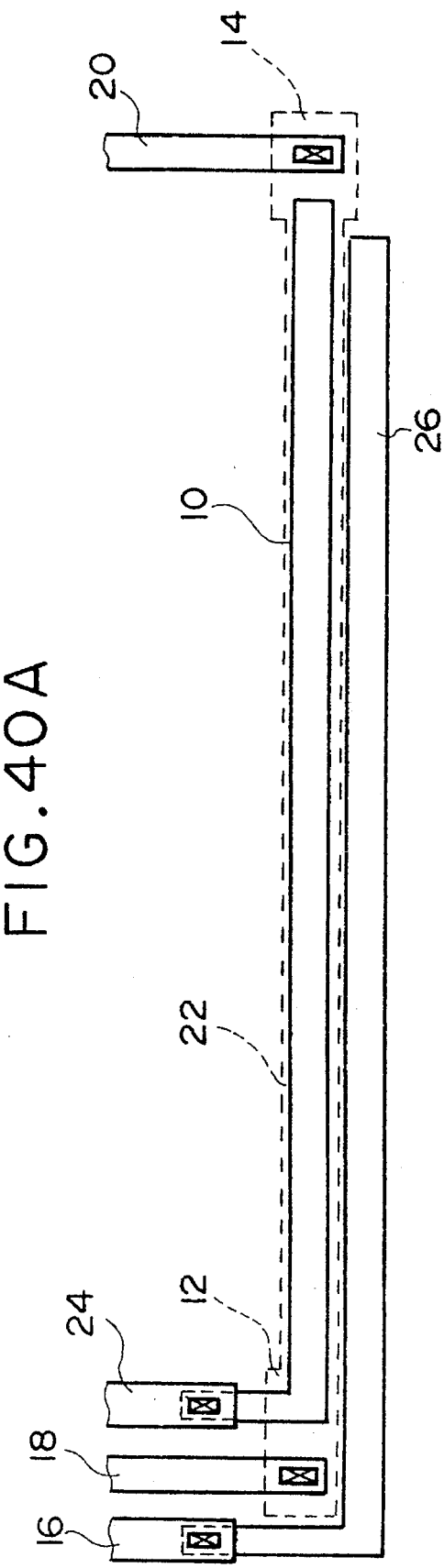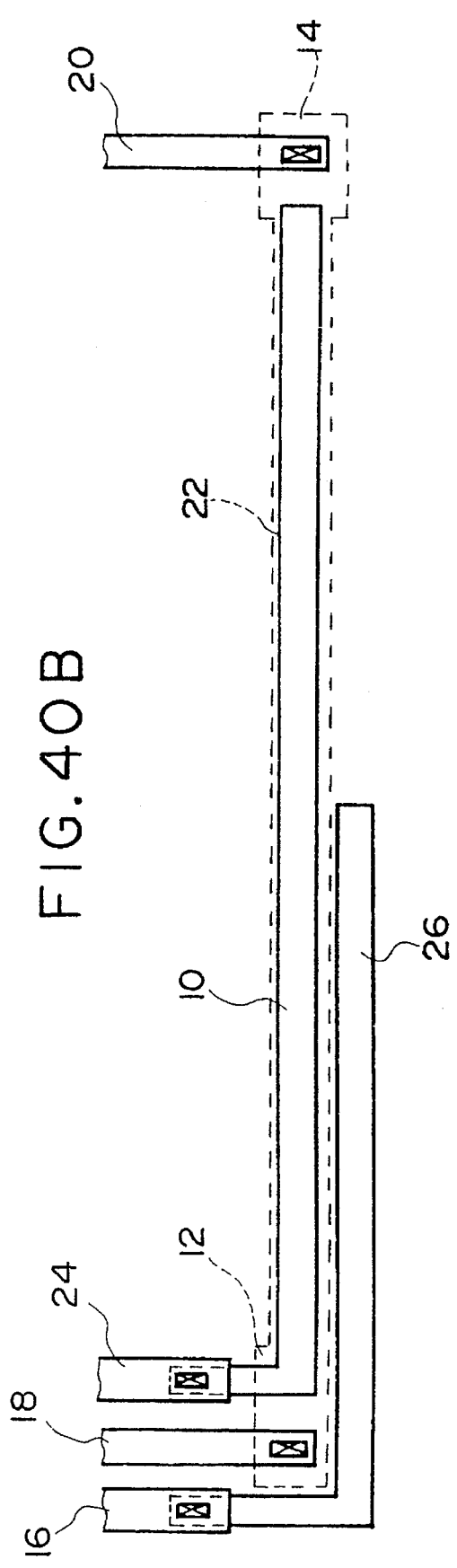

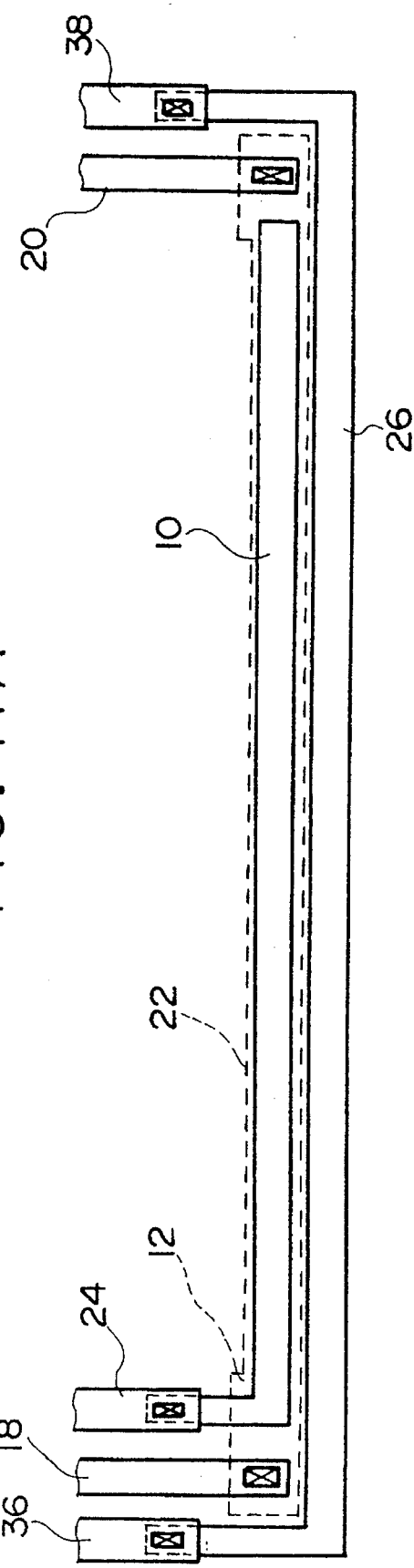
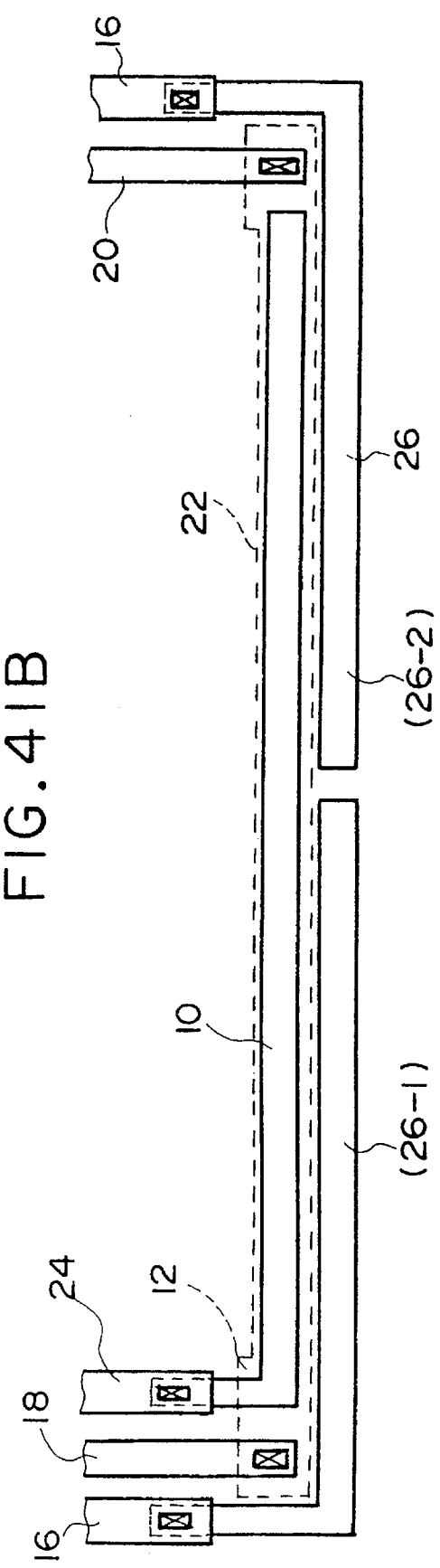
FIG. 41A
FIG. 41B

LC ELEMENT AND SEMICONDUCTOR DEVICE HAVING A SIGNAL TRANSMISSION LINE AND LC ELEMENT MANUFACTURING METHOD

BACKGROUND OF THE INVENTION

1. Field of the Invention

The present invention relates to an LC element capable of attenuating a predetermined frequency band and used either as part of a semiconductor or other device, or as a discrete element, a semiconductor device including such an LC element and a method for manufacturing such an LC element.

2. Background Art

The rapid advancement of electronics technology in recent years has brought about the use of electronic circuits in an increasingly broad range of fields. Therefore, stable operation of these electronic circuits is sought without being affected by external conditions.

However, electronic circuits are directly or indirectly subject to the incursion of external noise. Consequently, a problem exists whereby operating error is caused in electronic products using electronic circuits.

In particular, there are many cases of using switching regulators as electronic circuit DC power supplies. As a result of transient current produced by such operations as switching, or by load fluctuations arising from switching operation of utilized digital ICs, intense noise having many frequency components is often produced in the switching regulator power supply line. This noise is conveyed via the power supply line or by radiation to other circuits in the same product, giving rise to such effects as operating error and impaired signal to noise ratio, and in some cases even causing operating error in other nearby electronic products.

Various types of noise filters are presently being used with respect to electronic circuits in order to remove noise. In particular, since a great many electronic products of numerous types have come into use in recent years, the regulations against noise have grown ever more stringent, and development of an LC element having functions as a compact high performance noise filter capable of reliably removing such noise is desired.

One example of this type of LC element is an LC noise filter disclosed in Japanese Patent Application Laid-open No. 3-259608. In the case of this LC noise filter, the L (inductance) and C (capacitance) components exist as distributed constants, and compared to a lumped constant type LC filter, favorable attenuation response can be obtained over a relatively wide band.

However, manufacturing process of this LC noise filter is complicated because this LC noise filter is formed by folding an insulation sheet which has been provided with the conductor on both sides to form the inductor and the capacitor.

Also, wiring is required when directly inserting this LC filter into an IC or LSI power supply or signal line, thus necessitating time and labor for installing the components. In addition, since this LC filter is formed as a discrete component, inclusion in an IC or LSI circuit, i.e., insertion into the internal wiring of an IC, LSI or other device is nearly impossible.

Furthermore, in the case of this LC noise filter, since a capacitor formed in the manner of a distributed constant is determined by the respective shape and arrangement of the conductors which also functions as the inductors, after completion of the product, the capacitance is fixed. Consequently, the problem arises whereby the overall characteristics are also fixed and use for general purpose applications is restricted. For example, in order to change only the capacitance, the shape of the capacitor type conductor must be changed. Freely changing the capacitance of the LC noise filter which has been connected to a particular circuit according to requirements is difficult.

SUMMARY OF THE INVENTION

The present invention considers the above mentioned points and objects are to provide an LC element and a semiconductor device which enable simplified manufacturing, eliminate the parts assembly operations in subsequent processing, and which can be formed as part of an IC or LSI device, and to provide a manufacturing method of such an LC element.

Another object of the present invention is to provide an LC element, semiconductor device and LC element manufacturing method allowing characteristics to be changed by changing the distributed constant type capacitance and/or resistance according to requirements.

In order to resolve the above mentioned problems, an LC element according to this invention comprises:

either one of an n region or a p region formed as a single layer on the surface of a semiconductor substrate, a first electrode functioning as a gate and having a predetermined shape formed on an insulation layer on the semiconductor substrate, a second electrode having a predetermined shape formed on the semiconductor substrate essentially adjacent and essentially parallel to the first electrode, a first diffusion region formed near one end of a channel formed in correspondence to the first electrode in the semiconductor substrate, and a second diffusion region formed near the other end of the channel in the semiconductor substrate, wherein inductors are respectively formed by the channel and second electrode, and a distributed constant type capacitor is formed between these, and at least the channel formed in correspondence to the first electrode is used as a signal transmission line.

In the case of this LC element, the first and second electrodes having predetermined shapes are formed essentially in parallel on the semiconductor substrate surface. Also, an insulation layer is formed between at least one of these two electrodes and the semiconductor substrate. The first or second electrode, insulation layer and semiconductor substrate comprise an MOS construction.

In general, a conductor functions as an inductor by forming in a spiral shape. However, by modifying the conductor shape or when using with a particular frequency band, the function of an inductor can also be obtained with conductor shapes other than spiral.

In this manner, in regard to the LC element according to this invention, the second electrode and the channel formed in correspondence to the first electrode having a predetermined shape respectively function as inductors. Also, in the same manner as an ordinary MOSFET, since a depletion layer is formed in the outer circumference of the channel, a distributed constant type capacitor is produced between the channel and surrounding semiconductor substrate. In addition, the semiconductor substrate is connected directly or indirectly via an insulation layer to the second electrode, thereby forming a distributed constant type capacitor between the channel and second electrode.

Consequently, when a signal input to the first or second diffusion region formed at one end of the channel is transmitted via the distributed constant type inductors and capacitors, excellent attenuation characteristics over a wide band can be obtained.

In particular, this LC element can be manufactured by forming the first or second diffusion region on a semiconductor substrate, then on this surface forming the insulation layer and first and second electrodes having predetermined shapes. Manufacturing is thus extremely easy. Also, since this LC element is formed on a semiconductor substrate, it can be formed as a portion of an IC or LSI device and when formed in this manner, parts assembly work in subsequent processing can be abbreviated.

An LC element according to another aspect of this invention comprises:

either one of an n region or a p region formed as a single layer on the surface of a semiconductor substrate, a first electrode functioning as a gate and having a predetermined shape formed on an insulation layer on the semiconductor substrate, a second electrode having a predetermined shape formed on the semiconductor substrate adjacent and essentially parallel to the first electrode, and a diffusion region formed near one end of a channel formed in correspondence to the first electrode in the semiconductor substrate, wherein inductors are respectively formed by the channel and second electrode, a distributed constant type capacitor is formed between these, and the second electrode is used as a signal transmission line.

In contrast to the above mentioned LC element, wherein the channel is used as the signal transmission line, in the LC element of this aspect, the second electrode is used as the signal transmission line and since the signal is not transmitted via the channel, either one of the first or second diffusion region is omitted.

Consequently, in the same manner as the above mentioned LC element, the channel and second electrode respectively function as inductors and a distributed constant type capacitor is formed between these. This LC element thus has excellent attenuation characteristics over a wide band, while manufacture is easy and it can be formed as a portion of a substrate.

An LC element according to another aspect of this invention comprises:

a first electrode functioning as a gate and having a predetermined shape formed on an insulation layer on the semiconductor substrate, a second electrode having a predetermined shape formed on the other side of the semiconductor substrate at essentially the opposite position of the first electrode, a first diffusion region formed near one end of the channel formed in correspondence to the first electrode in the semiconductor substrate, and a second diffusion region formed near the other end of the channel in the semiconductor substrate, wherein the channel formed in correspondence to the first electrode and the second electrode respectively function as inductors and a distributed constant type capacitor is formed between these, and at least the channel formed in correspondence to the first electrode is used as the signal transmission line.

Compared to the above mentioned LC element, wherein the first and second electrodes having predetermined shapes are disposed essentially in parallel on the same plane, in the case of this LC element, these are disposed essentially in opposition astride the semiconductor substrate. The channel formed in correspondence with the first electrode and the second electrode respectively function as inductors, while between these, a depletion layer is formed to comprise a distributed constant type capacitor. Consequently, this LC element has excellent attenuation characteristics over a wide band, manufacture is easy and it can be formed as a portion of a substrate. In addition, the required semiconductor substrate surface area can be made smaller in comparison to the above mentioned LC element.

An LC element according to another aspect of this invention comprises:

a first electrode having a predetermined shape and functioning as a gate formed on an insulation layer on one surface of a semiconductor substrate, a second electrode having a predetermined shape formed on the other surface the semiconductor substrate at essentially the opposite position of the first electrode, and a diffusion region formed near one end of a channel formed in correspondence to the first electrode in the semiconductor substrate, wherein inductors are respectively formed by the channel and second electrode, a distributed constant type capacitor is formed between these, and the second electrode is used as a signal transmission line.

In the case of this LC element as well, the first and second electrode having predetermined shapes are disposed essentially in opposition astride the semiconductor substrate. The channel formed in correspondence to the first electrode and the second electrode respectively function as inductors, while a distributed constant type capacitor is formed between these. Consequently, this LC element has excellent attenuation characteristics over a wide band, manufacture is easy and it can be formed as a portion of a substrate. In addition, the required semiconductor substrate surface area can be made small.

According to another aspect of this invention, in the case of the above mentioned LC elements wherein the first and second electrodes are formed on the same side of the semiconductor substrate, an inversion layer comprising an n region or a p region is formed along the first and second electrodes.

This LC element differs with respect to the type of above mentioned LC element wherein the first and second electrodes are formed on the same side of the semiconductor substrate and a single layer comprising an n region or a p region is used, in that a semiconductor substrate with an inversion layer comprising an n region or p region of predetermined shape formed along the first and second electrodes is used. In other words, when adjacent inversion layers having predetermined shape are noted, since an npn or pnp construction is formed, excellent isolation can be obtained. Consequently, the state wherein a distributed constant type capacitor is formed only between the second electrode disposed adjacently to the channel formed in correspondence to the first electrode can be easily produced, and this LC element can have excellent attenuation characteristics over a wide band.

According to another aspect of this invention, in the case of the above mentioned LC elements wherein the first and second electrodes are formed respectively on opposite sides of the semiconductor substrate, the semiconductor substrate is replaced by a semiconductor substrate comprising an inversion layer comprising either one of an n region or a p region formed between the neighboring conductor portions of the first electrode and between the neighboring conductor portions of the second electrode.

Compared with the above mentioned type of LC element wherein the first and second electrodes are respectively formed on opposite sides of the semiconductor substrate, this LC element differs in that an inversion layer is formed between adjacent first and second electrodes in the semiconductor substrate. In other words, except for the essentially opposing channel and second electrode, since connection is via an interposing npn or pnp construction, excellent isolation can be attained. Consequently, a state wherein a distributed constant type capacitor is formed only between the pair of oppositely disposed channel and second electrode can be easily produced. This LC element can be made to have excellent attenuation characteristics over a wide band.

The first and second electrode shapes of the above mentioned LC elements according to this invention include spiral, meander, curved line and straight line shapes.

By using spiral shapes for the first and second electrodes, adjacent electrodes can be positioned closely, thereby effectively utilizing space. Also, when meander or wave shapes are used for the first and second electrodes, each convex and concave bend comprises an approximately ½ turn coil and since these are connected in series, an overall predetermined inductance can be obtained. Furthermore, in cases when usage is limited to the high frequency band, even curved line or straight line shaped electrodes can have predetermined inductances and operate in the same manner as spiral shaped electrodes.

Another aspect of this invention relates to the above mentioned LC elements wherein at least the channel is used as the signal transmission line and further comprises:

first and second input/output electrodes electrically connected respectively to the first and second diffusion regions, and a ground electrode electrically connected near one end of the second electrode, wherein a signal input to either one of the first or second input/output electrodes is obtained as an output from the other of these input/output electrodes, while the ground electrode is connected to a fixed potential power supply or grounded.

In the case of this LC element, the first and second input/output electrodes are respectively connected to the first and second diffusion regions near the respective ends of the channel formed in correspondence to the first electrode and by providing the ground electrode in proximity to one end of the second electrode, a three-terminal type LC element using the channel as the signal transmission line can be easily comprised.

Another aspect of this invention relates to the above mentioned LC elements wherein the second electrode is used as the signal transmission line and further comprises:

first and second input/output electrodes respectively connected electrically to one end and the other end of the second electrode, and a ground electrode electrically connected to the diffusion region formed near one end of the channel formed in correspondence with the first electrode or divided electrode segments of the first electrode, wherein a signal input to either one of the first or second input/output electrodes is obtained as an output from the other of these input/output electrodes, while the ground electrode is connected to a fixed potential power supply or grounded.

In the case of this LC element, the first and second input/output electrodes are respectively provided near the respective ends of the second electrode and by providing the ground electrode connected to the first or second diffusion region formed near one end of the channel, a three-terminal type LC element using the second electrode as the signal transmission line can be easily comprised.

Another aspect of this invention relates to the above mentioned LC elements wherein at least the channel is used as the signal transmission line and further comprises:

first and second input/output electrodes electrically connected respectively to the first and second diffusion regions, and third and fourth input/output electrodes respectively connected electrically to the respective ends of the second electrode, wherein both the second electrode and the channel formed in correspondence to the first electrode are used as signal transmission line, thereby enabling use as a common mode type element.

In the case of this LC element, together with providing the first and second input/output electrodes respectively for the first and second diffusion regions formed at the respective ends of the channel, by providing third and fourth input/output electrodes respectively near the respective ends of the second electrode, a four-terminal common mode type LC element can be easily comprised.

Another aspect of this invention relates to the type of above mentioned LC element wherein at least the channel is used as the signal transmission line, only the channel is used as the signal transmission line, the second electrode is divided into a plurality, and the respective plurality of divided electrode segments are mutually connected electrically.

In the case of this LC element, the second electrode is divided into a plurality of electrode segments and portions of these are connected electrically. In this case, the self-inductance region of each divided segment is small and a distributed constant type LC element can be comprised wherein the influence of these self-inductances is small.

Another aspect of this invention relates to the above mentioned LC elements wherein the second electrode is used as the signal transmission line and wherein the first electrode is divided into a plurality, diffusion regions are provided respectively near one end of each of a plurality of channels formed in correspondence to the respective plurality of divided electrode segments, and the plurality of diffusion regions are connected electrically.

In the case of this LC element, by dividing the first electrode into a plurality of electrode segments, the channel formed in correspondence thereof is also divided into a plurality. Consequently, the self-inductance region of each divided channel is small and a distributed constant type LC element can be comprised wherein the influence of these self-inductances is small.

Another aspect of this invention relates to any one of the above mentioned LC elements wherein:

by variably setting the gate voltage applied to the first electrode, at least the resistance of the channel can be variably controlled.

In the case of this LC element, by variably setting the gate voltage applied to the first electrode, the width, i.e., resistance, of the channel having a predetermined shape and formed in correspondence to the first electrode is varied. Also, since variation occurs in the depletion layer formed at the periphery of the channel, the capacitance of the capacitor formed between the channel and second electrode can also be varied. Consequently, by varying the gate voltage, the channel resistance and the capacitance of the distributed constant type capacitor formed between the channel and second electrode can be varied, thereby allowing variable control of the attenuation characteristics according to requirements.

Another aspect of this invention relates to any one of the above mentioned LC elements wherein:

carriers are injected beforehand at a position corresponding to the first electrode near the semiconductor substrate surface.

In the case of this LC element, a depletion type element is formed by injecting carriers at a position corresponding to the first electrode. Without changing the characteristics of the LC element itself, the channel can be formed in the state without voltage (gate voltage) applied to the first electrode, or the relationship between an applied gate voltage and the channel width and the like can be changed.

Another aspect of this invention relates to any one of the above mentioned LC elements wherein:

by making the second electrode longer or shorter than the first electrode, portional correspondence is provided between the channel and second electrode.

In the case of this LC element, either one of the first or second electrode is formed shorter than the other, and in this case as well, the first and second electrodes having different lengths respectively function as inductors and a distributed constant type capacitor is formed between these electrodes astride a depletion layer. Consequently, this LC element has excellent attenuation characteristics over a wide band, while manufacturing is easy and the LC element can be formed as a portion of a substrate.

Another aspect of this invention relates to any one of the above mentioned LC elements wherein:

a buffer is connected to the output side of the signal transmission line.

In the case of this LC element, a buffer is connected for amplifying the signal output via the channel of an above mentioned LC element. The voltage level of a signal attenuated by the relatively high resistance (compared to a metal material such as aluminum) channel can be restored with excellent SN ratio.

Another aspect of this invention relates to any one of the above mentioned LC elements wherein:

a protector circuit is provided for bypassing at least excess voltage in the first electrode to the operating power supply side or ground side.

In the case of this LC element, a protector circuit is connected to at least one of the first or second electrodes, and when an excess voltage is applied with respect to these electrodes, bypass current flows in the operating power supply line side or the ground side. As a result, insulation breakdown between the first or second electrode and the semiconductor substrate can be prevented.

Another aspect of this invention relates to any one of the above mentioned LC elements and further comprises:

terminals are provided by forming an insulation film on the entire surface, perforations are opened in portions of the insulation film by etching or laser light emission, and the perforations are closed by applying solder to the extent of protruding slightly from the surface.

In the manufacturing process, after the LC element is formed on a semiconductor substrate, the insulation film is formed on the entire surface by a process such as chemical liquid phase deposition. Perforations are opened in portions of the insulation film by etching or laser light emission, then solder is applied to the perforations to provide terminals. Consequently, a surface mounting type LC element can be easily manufactured, in which case work for installing the LC element is also easy.

A semiconductor device according to this invention comprises:

any one of the above mentioned LC elements formed in an integrated manner as a portion of a substrate, wherein:

at least one of the channel formed in correspondence to the first electrode, or the second electrode is inserted in the signal line or power supply line.

In the case of this semiconductor device, any one of the above mentioned LC elements is formed as a portion of a substrate so as to be inserted into a signal line or power supply line. As a result, the LC element can be manufactured in a unitized manner with other components on the semiconductor substrate. Manufacturing is easy, while parts assembly work in subsequent processing is unnecessary.

An LC element manufacturing method according to this invention comprises the steps of:

a first process whereby first and second diffusion regions are formed by portionally injecting impurities into a semiconductor substrate, a second process whereby an insulation layer is formed on the entire surface or portionally on the semiconductor substrate, a first electrode having a predetermined shape is formed in a manner so as to couple the first and second diffusion regions, and a second electrode having a predetermined shape is formed at an adjacent position essentially parallel and essentially along the first electrode, and a third process whereby a wiring layers are formed so as to be connected to the first and second diffusion regions, and the first and second electrodes electrically.

Another LC element manufacturing method according to this invention comprises the steps of:

a first process whereby a diffusion region is formed by portionally injecting impurities into a semiconductor substrate, a second process whereby an insulation layers are formed on the entire surface or portionally on the semiconductor substrate, a first electrode having a predetermined shape is formed at a position near one end of the diffusion region, and a second electrode having a predetermined shape is formed at an adjacent position essentially parallel and essentially along the first electrode, and a third process whereby a wiring layers are formed so as to be connected to the diffusion region, and the first and second electrodes electrically.

The two LC element manufacturing methods mentioned above are appropriate for manufacturing the above mentioned LC elements by applying semiconductor manufacturing technology. In other words, in the first process, either or both first and second diffusion regions are formed on the semiconductor substrate; in the second process, the insulation layer and first and second electrodes are formed on the semiconductor substrate surface; and in the third process, the LC element is completed by forming the wiring layer including input/output electrodes and the like.

In this manner, the above mentioned LC elements can be manufactured by utilizing ordinary semiconductor manufacturing technology (particularly MOS manufacturing technology). In addition to enabling down-sizing and cost reduction, a plurality of individual LC elements can be mass produced simultaneously.

DESCRIPTION OF THE DRAWINGS

FIGS. 40A, 40B, 41A and 41B are plan views of LC elements n accordance with a ninth embodiment of this invention;

DETAILED DESCRIPTION OF THE INVENTION

Following is a description of the preferred embodiments of the LC elements in accordance with this invention with reference to the attached drawings. Since the construction of the LC elements according to this invention correspond to MOSFET, terminology related to a field effect transistor is used in the following description, in other words, one diffusion region is termed the source, the other diffusion region is termed the drain, and the gate electrode is termed the gate, respectively. Consequently, in the following description, the source and drain are basically equivalent, and these can be interchanged.

First Embodiment

Figure 1:
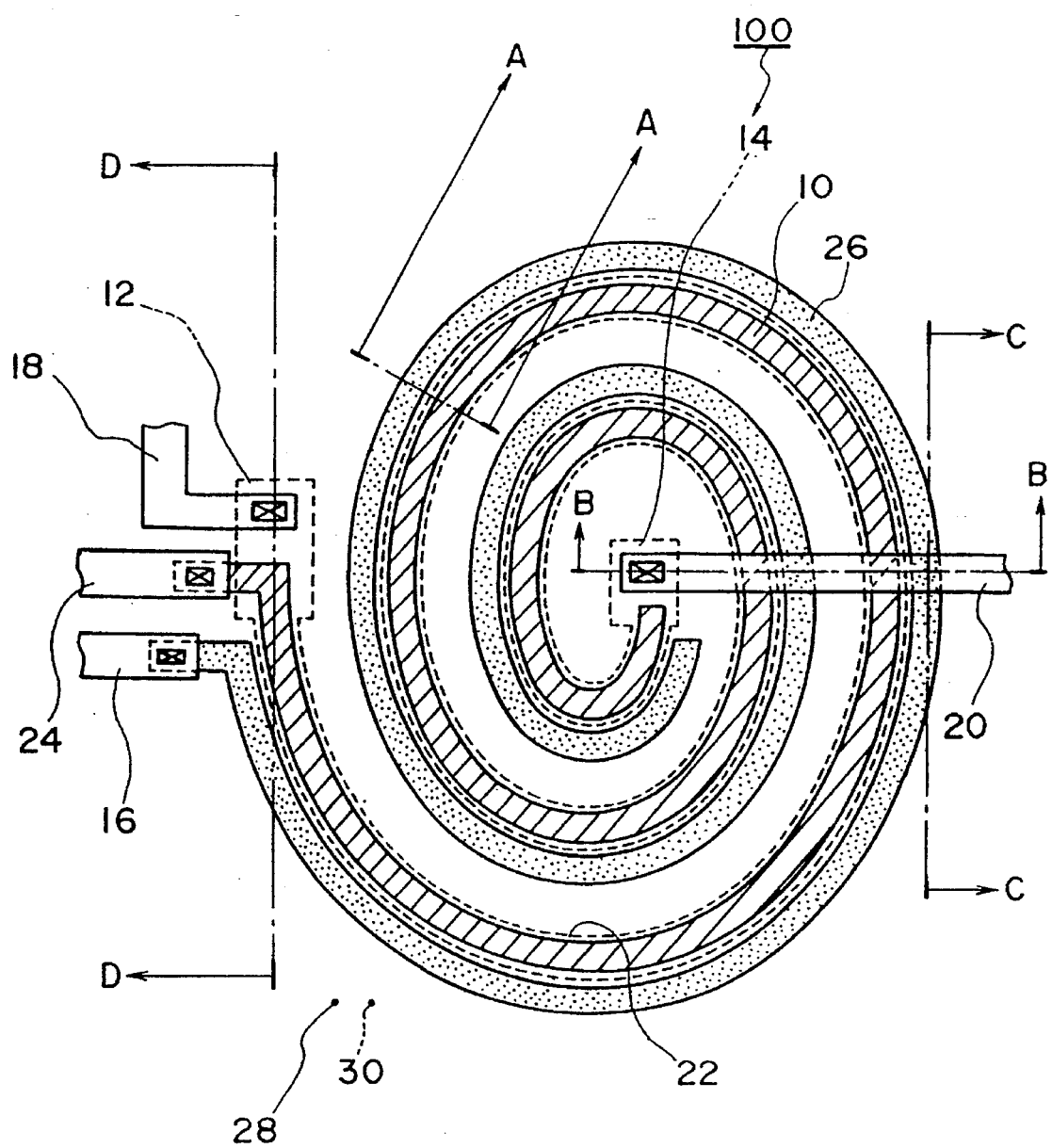
FIG. 1 is a plan view of an LC element in accordance with a first embodiment of this invention.

FIG. 1 is a plan view of an LC element in accordance with a first embodiment of this invention. FIGS. 2, 3, 4 and 5 are enlarged cross-sectional views viewed along lines A—A, B—B, C—C, and D—D in FIG. 1 respectively. As indicated in the figures, the LC element 100 of this embodiment comprises a source 12 and drain 14 formed at separated positions near the surface of a semiconductor substrate 30 comprising p-type silicon (p-Si) and connected by a channel 22 formed by applying a voltage to a spiral shaped first electrode 10 disposed between these.

The source 12 and drain 14 are formed as inverted $n^+$ regions of the p-Si substrate 30. For example, these are formed by increasing the impurity concentration by injecting $As^+$ ions by thermal diffusion of ion implantation.

The first electrode 10 functions as a gate and is formed on an insulation layer 28 formed on the surface of the p-Si substrate 30 in a manner whereby one end of the spiral shape overlaps the source 12 and the other end overlaps the drain 14. The first electrode 10 is formed by aluminum of other film, or by large p doping by diffusion or ion injection.

Figure 2A:
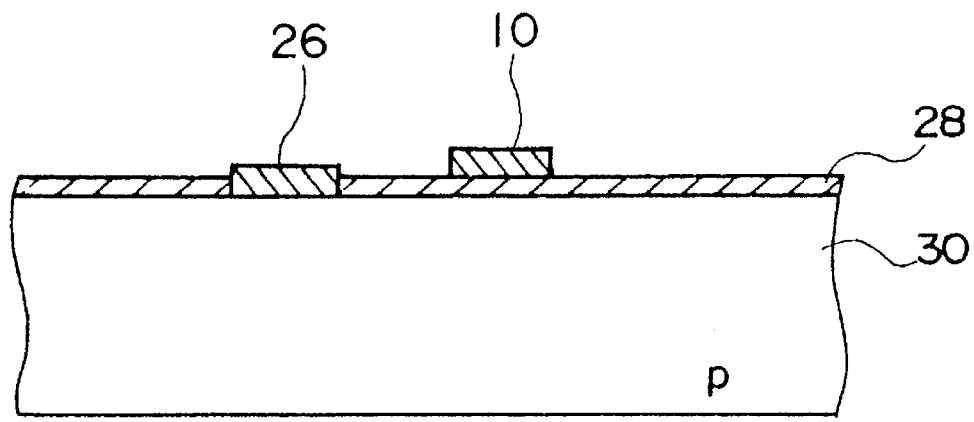
FIG. 2A and 2B are enlarged cross-sectional views viewed along line A—A in FIG. 1.

Also, the insulation layer 28 at the p-Si substrate 30 surface serves to insulate the p-Si substrate 30 and first electrode 10. As indicated in FIG. 2A, with the exception of a second electrode 26 (described below), the insulation layer 28 covers the entire surface of the p-Si substrate 30. In addition, the first electrode 10 is formed on the surface of this insulation layer 28. The insulation layer 28 comprises, for example, p added $SiO_2$ (P-glass).

The second electrode 26 is formed essentially in parallel with the first electrode 10. By applying a predetermined gate voltage between the second electrode 26 and first electrode 10, the channel 22 is formed on the p-Si substrate 30 surface so as to oppose the first electrode 10.

Figure 2B:
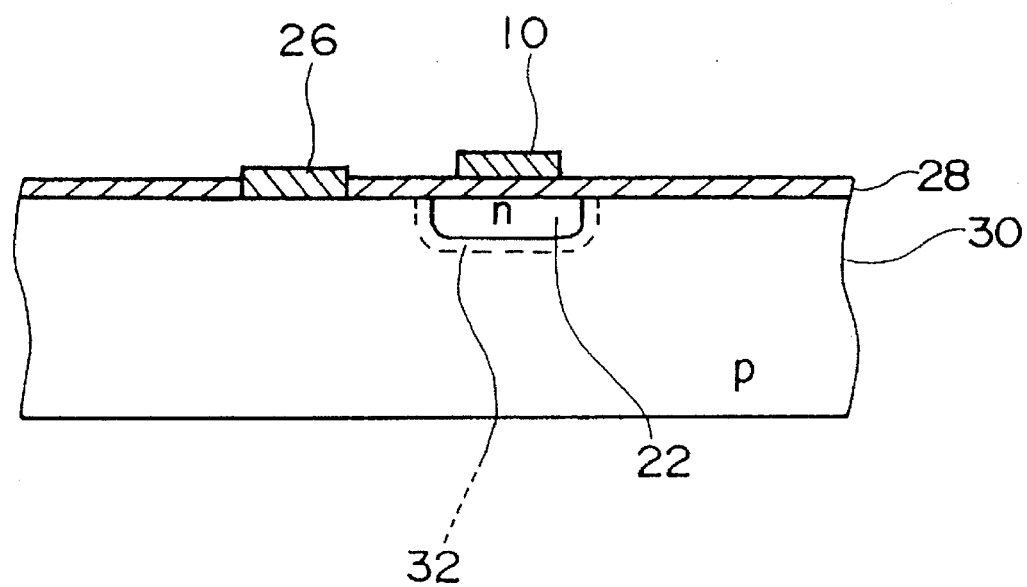
Figure 3:
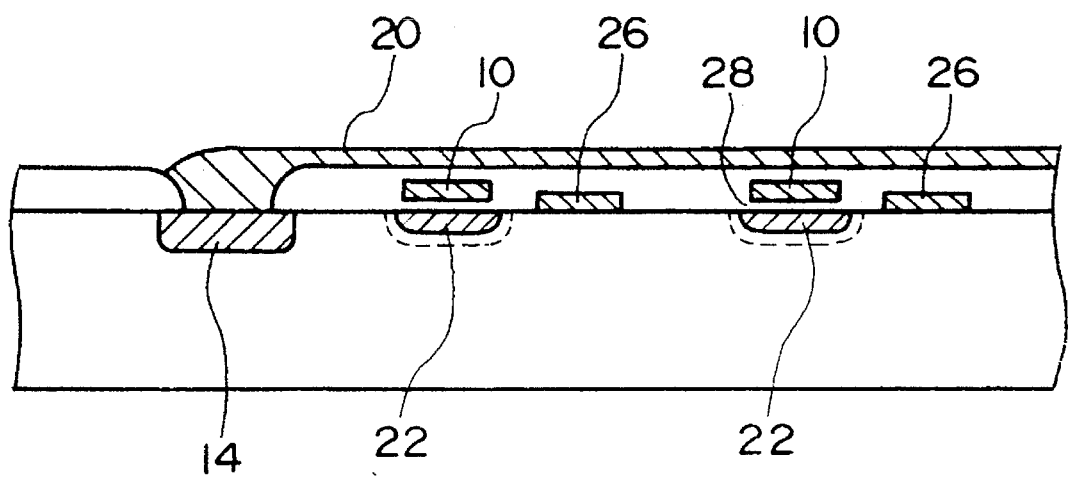
FIG. 3 is an enlarged cross-sectional view viewed along line B—B in FIG. 1.
Figure 4:
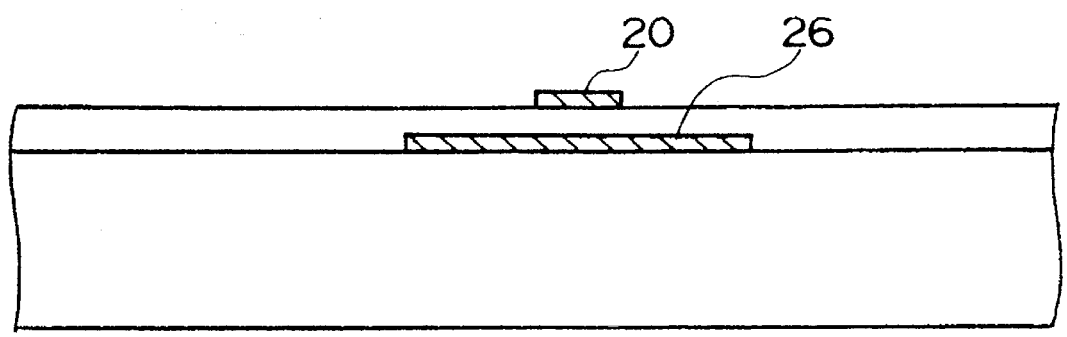
FIG. 4 is an enlarged cross-sectional view viewed along line C—C in FIG. 1.
Figure 5:
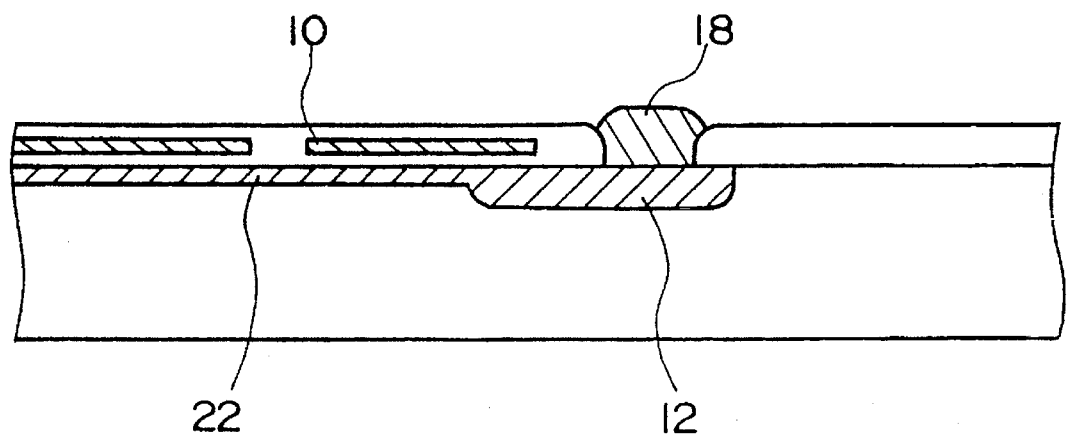
FIG. 5 is an enlarged cross-sectional view viewed along line D—D in FIG. 1.

As indicated in FIGS. 1–6, a ground electrode 16, input/output electrodes 18 and 20, and a control electrode 24 are respectively connected to the first electrode 10, source 12, drain 14 and second electrode 26. In order not to damage the thin gate film, the control electrode 24 attachment to the first electrode 10 is performed external to the active region as indicated in FIG. 1. Also, as indicated in FIGS. 3 and 5, after exposing part of the source 12 and drain 14, input/output electrode 18 attachment to the source 12, and input/output electrode 20 attachment to the drain 14 are performed by applying aluminum or other metal film. In addition, in the same manner as the control electrode 24, the ground electrode 16 attachment to the second electrode 26 is performed at a position separated from the active region in order not to damage the thin gate film.

By utilizing an n-channel enhancement construction for an LC element 100 having the above mentioned construction, the channel 22 is formed when a positive voltage is applied to the first electrode 10.

FIGS. 2A and 2B indicate the channel 22 forming state. As indicated in FIG. 2A, in the state where a positive gate voltage is not applied with respect to the first electrode 10, i.e., to the control electrode 24 connected to the first electrode 10, the channel 22 does not appear in the p-Si substrate 30 surface. Consequently, in this state, the source 12 and drain 14 indicated in FIG. 1 are insulated.

Conversely, when a positive gate voltage is applied with respect to the first electrode 10, as indicated in FIG. 2B, the channel 22 comprising an n region appears near the p-Si substrate 30 surface in correspondence to the first electrode 10. Also, by applying this positive gate voltage to the first electrode 10, positive holes are removed to form a depletion layer 32 at the outer side of the channel 22 in the p-Si substrate 30. Consequently, electrons in the channel 22 and positive holes in the p-Si substrate 30 are opposingly arranged at opposite sides of this depletion layer 32 to form a capacitor. Also since this capacitor is formed essentially over the entire length of the first electrode 10, a distributed constant type capacitor is formed between the second electrode 26 connected to the p-Si substrate 30 and the channel 22.

The gate voltage applied to the first electrode 10 is positive with respect to the p-Si substrate 30 voltage, i.e., the voltage applied to the second electrode 26 formed in the p-Si substrate 30 surface. In addition, in order to have connection between the source 12 and drain 14 by the channel 22, a relatively positive voltage is also needed with respect to the source 12 and drain 14.

Figure 6:
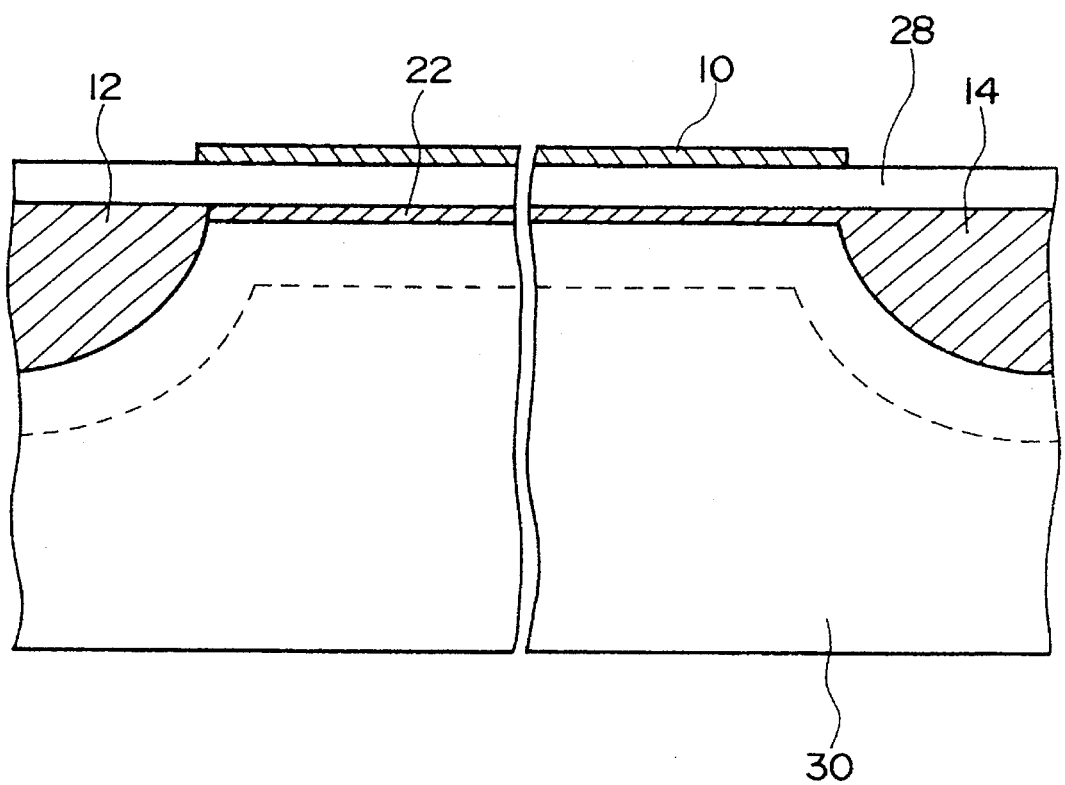
FIG. 6 shows a cross-sectional construction in the longitudinal direction of an LC element in accordance with the first embodiment of this invention.

FIG. 6 indicates the cross-sectional construction of the LC element 100 as viewed in the first electrode 10 longitudinal direction. As indicated in the figure, the channel 22 is formed in parallel with the electrode 10, and the conductive state is produced between the source 12 and drain 14 by this channel 22. For example, in the case of an enhancement type, the channel 22 is formed in the state with gate voltage applied to the first electrode 10, and the conductive state is produced between the source 12 and drain 14. By varying the gate voltage applied to the first electrode 10, since the channel 22 width and depth are changed, the resistance between the source 12 and drain 14 can be varied.

Also, as indicated in FIG. 2B, by changing the channel 22 width and depth, the channel 22 surface area is also changed and consequently the surface area of the depletion layer 32 is changed. In other words, because of this change in surface area, the capacitance of the distributed constant type capacitor formed between the channel 22 and second electrode 26 changes, and as a result, the capacitance can also be varied by changing the gate voltage.

In an LC element 100 having this type of construction, the channel 22 formed in correspondence with the spiral shaped first electrode 10 and the second electrode 26 respectively function as inductors. Also, a capacitor is formed between the channel 22 and second electrode 26 on opposite sides of the depletion layer 32 formed at the outer circumference of the channel 22. Consequently, the inductors formed by the channel 22 and second electrode 26, and the capacitor formed astride to the depletion layer 32 exist as distributed constants.

Figure 7A:
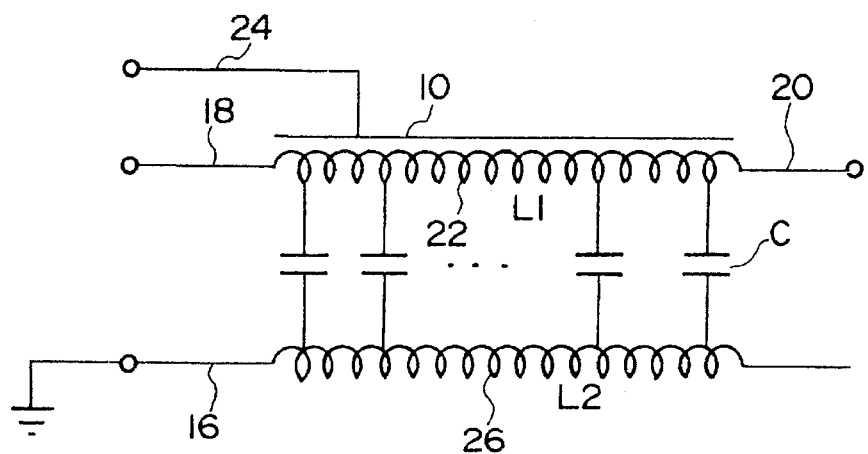
FIGS. 7A, 7B and 7C are schematic diagrams indicating equivalent circuits of LC elements in accordance with the first embodiment.
Figure 7B:
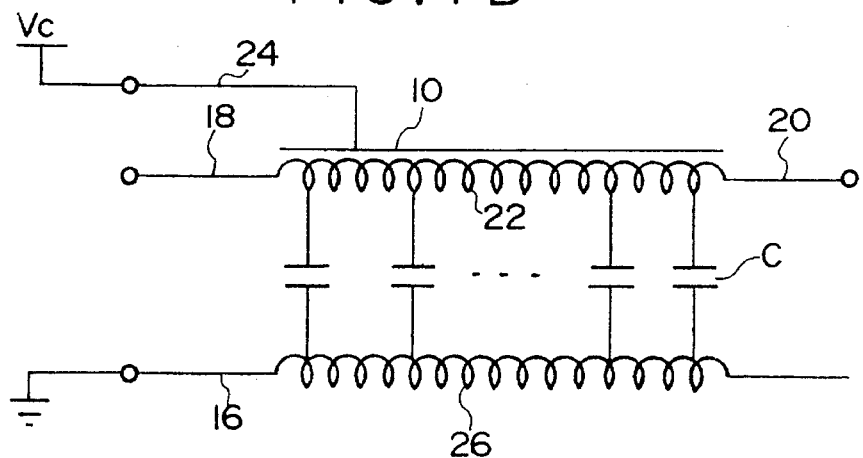
Figure 7C:
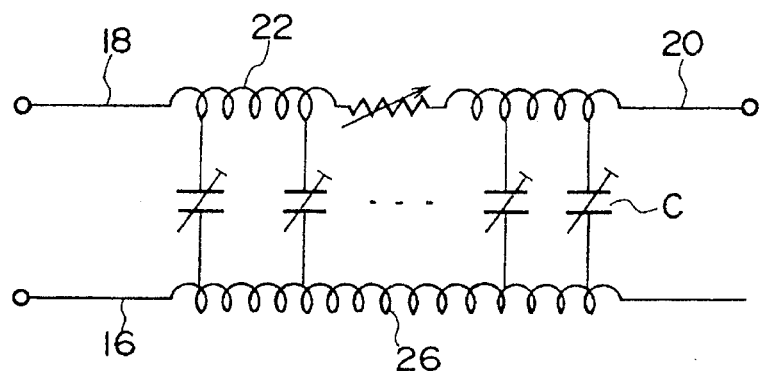

FIGS. 7A, 7B and 7C indicate equivalent circuits for the LC element 100 of the first embodiment. In the FIG. 7A equivalent circuit, the channel 22 is formed by applying a predetermined gate voltage to the control electrode 24. The channel 22 is used as the signal transmission line, while the ground electrode 16 is grounded, thereby providing the functions as a three-terminal type element.

In this case, the channel 22 functions as an inductor having inductance L1, while the second electrode 26 functions as an inductor having inductance L2. Between these two inductors, a distributed constant type capacitor is formed having a predetermined capacitance C. Consequently, this LC element 100 is capable of superb attenuation characteristics not to be found with conventional lumped constant type elements. Only the predetermined frequency components are removed from an input signal applied to either one of the input/output electrodes 18 or 20 and obtained as an output from the other of these electrodes.

Although FIG. 7A indicates the ground electrode 16 as grounded, the ground electrode 16 can also be connected to a power supply having a predetermined potential.

FIG. 7B indicates an equivalent circuit when a control voltage Vc is applied with respect to the control electrode 24. The control voltage Vc applied to the control electrode 24 is the gate voltage itself and since the channel 22 depth is varied by varying this voltage Vc, the channel 22 mobility is changed and as a result, the resistance between the source 12 and drain 14 can be varied as desired. At the same time, the capacitance C between the channel 22 and second electrode 26 can also be changed in the same manner as described above.

Consequently, the overall attenuation characteristics of the LC element 100 are varied by changing the channel 22 resistance and the distributed constant type capacitance C between the channel 22 and second electrode 26. In other words, by changing this control voltage Vc, the characteristics of the LC element 100 can be changed as desired within a certain range.

FIG. 7C indicates an further functional equivalent circuit to that shown in FIG. 7B. By changing the control voltage Vc, the resistance of a variable resistor connected in series with the channel 22 and the capacitance of a variable distributed constant type capacitor formed between the channel 22 and second electrode 26 can be varied.

The above description referred to an LC element 100 wherein an n channel was formed between the source 12 and drain 14, in which case the mobility of the electrons used as carriers is high and the channel 22 resistance is small. Conversely, the above mentioned LC element 100 can also comprise a p channel formed on an n-Si substrate. In this case, since holes are used as carriers, the channel 22 resistance is comparatively large and the characteristics differ from the above mentioned n channel case.

Figure 8A:
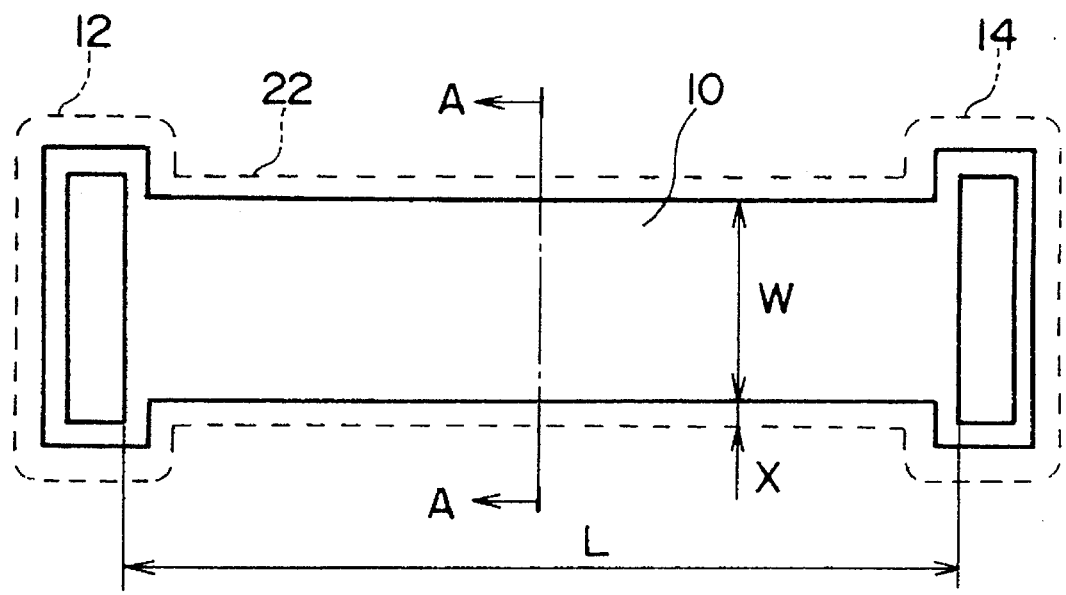
FIGS. 8A and 8B are descriptive drawings for describing the channel resistance value.
Figure 8B:
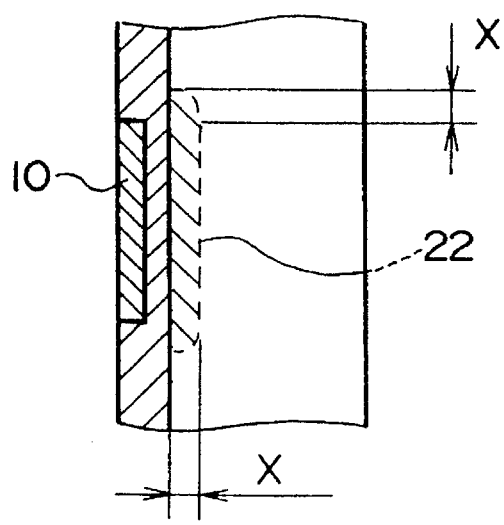

FIGS. 8A and 8B are descriptive drawings for describing the channel 22 resistance R when the channel 22 depth etc. are changed by varying the gate voltage (control voltage) applied to the first electrode 10. FIG. 8A is a plan view where the actually spiral shaped first electrode 10 is rendered as a straight shape for the sake of description. FIG. 8B is a cross-sectional view along line A—A in FIG. 8A.

In FIGS. 8A and 8B, W is the gate width, and X is the channel depth. In this manner, when the channel 22 is formed by the first electrode 10 having width W, the width of this channel becomes (W+2X). Consequently, the resistance R of the channel 22 between the source 12 and drain 14 can be computed as follows.

$$R = \rho/(W+2X)$$

In the above, $\rho$ is the resistance per unit area of the channel 22; and it is shown that the channel resistance R is proportional to the channel length L and inversely proportional to the channel width (W+2X).

Following is a description of a manufacturing process for the LC element 100 according to this embodiment.

FIGS. 9A–9G indicate an example of a manufacturing process for an enhancement type LC element 100. The figures show cross-sections of the spiral shaped gate electrode 10 viewed in the longitudinal direction.

(1) Oxidized Film Formation

Figure 9A:
FIGS. 9A–9G indicate an example of a manufacturing process for an LC element in accordance with the first embodiment.

First, silicon dioxide $SiO_2$ is formed on the p-Si substrate 30 surface by thermal oxidation (FIG. 9A).

(2) Opening Source and Drain Windows

Figure 9B:
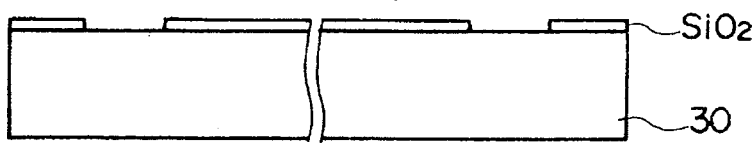

Portions corresponding to the source 12 and drain 14 are opened by photo-etching the oxidized film on the p-Si substrate 30 surface (FIG. 9B).

(3) Source and Drain Formation

Figure 9C:
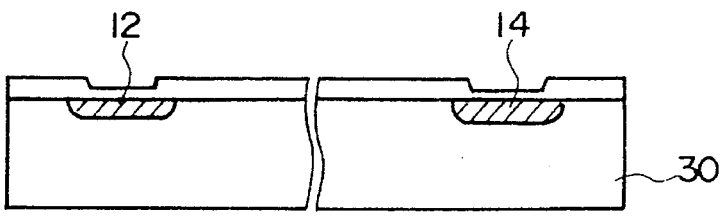

The source 12 and drain 14 are formed by injecting n type impurities into the opened portions (FIG. 9C). For example, $As^+$ is used as n type impurities and injected by thermal diffusion. If the impurities are injected by ion implantation, the window opening of FIG. 9B is not required.

(4) Gate Area Removal

Figure 9D:
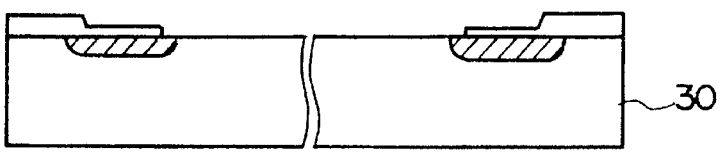

A gate area open portion is produced by removing the oxidized film from the area for forming the spiral shaped gate electrode 10 (FIG. 9D). In the case of this embodiment, the gate open portion is also formed in a spiral shape in correspondence with the spiral shaped gate electrode 10. In this manner, only the portion of the p-Si substrate 30 corresponding to the spiral shaped gate electrode 10 is exposed.

(5) Gate Oxidation Film Formation

Figure 9E:
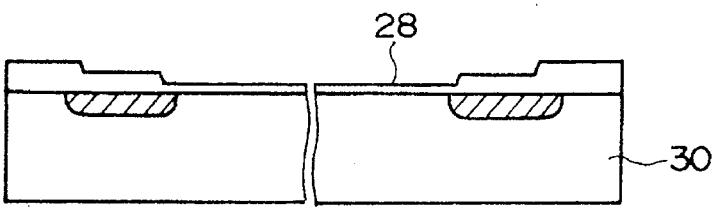

A new oxidation film, i.e., the insulation layer 26, is formed on the partially exposed p-Si substrate 30 (FIG. 9E).

(6) Gate and Electrode Formation

Figure 9F:
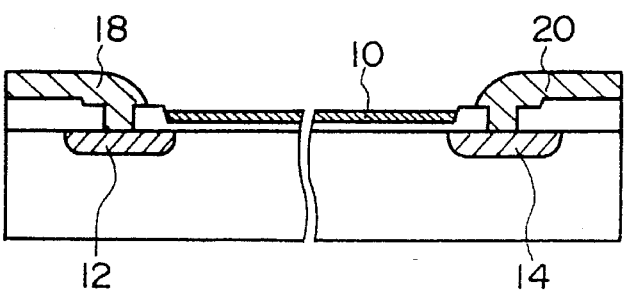

The spiral shaped gate electrode 10 functioning as a gate is formed, for example, by vapor deposition of aluminum or other material, as well as the input/output electrode 18 connected to the source 12 and the input/output electrode 20 connected to the drain 14 (FIG. 9F).

Before, after or in parallel with above steps 4–6, a window is opened in the portion corresponding to the second electrode 26, and the second electrode 26 and the ground electrode 16 connected thereto are formed.

(7) Insulation Layer Formation

Figure 9G:
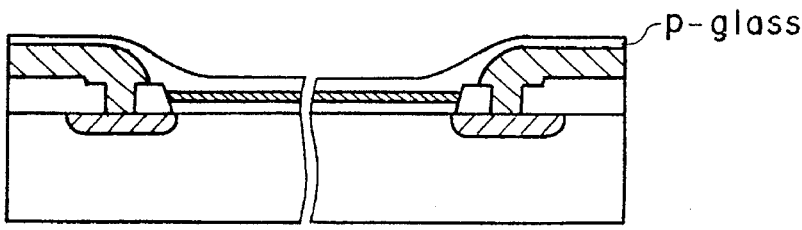

Finally, P-glass is applied to the overall surface, after which heating provides a smooth surface (FIG. 9G).

In this manner, the LC element 100 manufacturing process basically resembles the ordinary MOSFET manufacturing process and can be said to differ only in the shape and other qualities of the first electrode 10. Consequently, formation is enabled on the same substrate with an ordinary MOSFET or bipolar transistor and formation is possible as a portion of an IC or LSI device. Moreover, when formed as a portion of an IC or LSI device, assembly operations in subsequent processing can be omitted.

As explained, the LC element 100 according to this embodiment, the channel 22 formed in correspondence to the first electrode 10 and the second electrode 26 respectively comprise inductors, while a distributed constant type capacitor is formed between the channel 22 and second electrode 26.

Consequently, in a case where the ground electrode 16 provided at one end of the second electrode 26 is grounded or connected to a fixed potential and the channel 22 is used as the signal transmission 11he, the resulting LC element possesses excellent attenuation characteristics with respect to the input signal over a wide band.

Also, as mentioned above, since this LC element can be manufactured by utilizing ordinary MOSFET type manufacturing technology, production is both easy and applicable to down-sizing and other requirements. In addition, when the LC element is manufactured as a portion of a semiconductor substrate, wiring to other components can be performed simultaneously, and assembly and other work during subsequent processing becomes unnecessary.

Also, in regard to the LC element 100 of this embodiment, the channel 22 resistance value and the capacitance of the distributed constant type capacitor formed between the channel 22 and second electrode 26 can be variably controlled by changing the gate voltage (control voltage Vc) applied to the first electrode 10, and the overall frequency response of the LC element 100 can be adjusted or changed.

Figure 10:
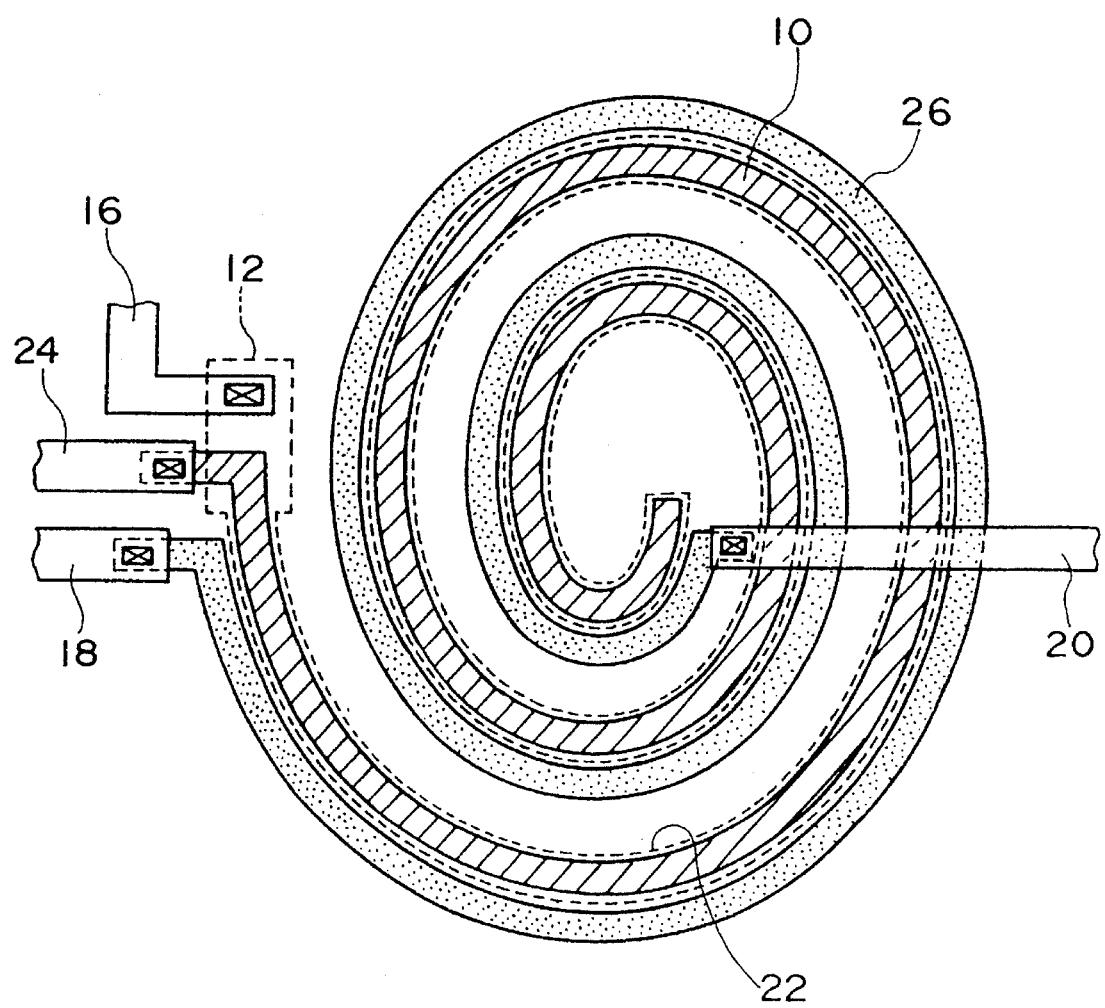
FIG. 10 indicates an example of a variation of an LC element in accordance with the first embodiment.

In the foregoing description of the first embodiment, the channel 22 formed in correspondence with the first electrode 10 was used as the signal transmission line, but it is also acceptable to interchange the functions of the channel 22 and second electrode 26. In other words, as indicated in FIG. 10, by respectively connecting the input/output electrodes 18 and 20 to the respective ends of the second electrode 26, connecting the ground electrode 16 to the source 12 (or drain 14) formed at one end of the channel 22, then connecting the ground electrode 16 to a ground or a fixed potential, the second electrode 26 can be used as the signal transmission line. However, in this case, since either one of the source 12 or drain 14 is connected to the ground electrode 16, the other of these can be omitted.

Figure 11:
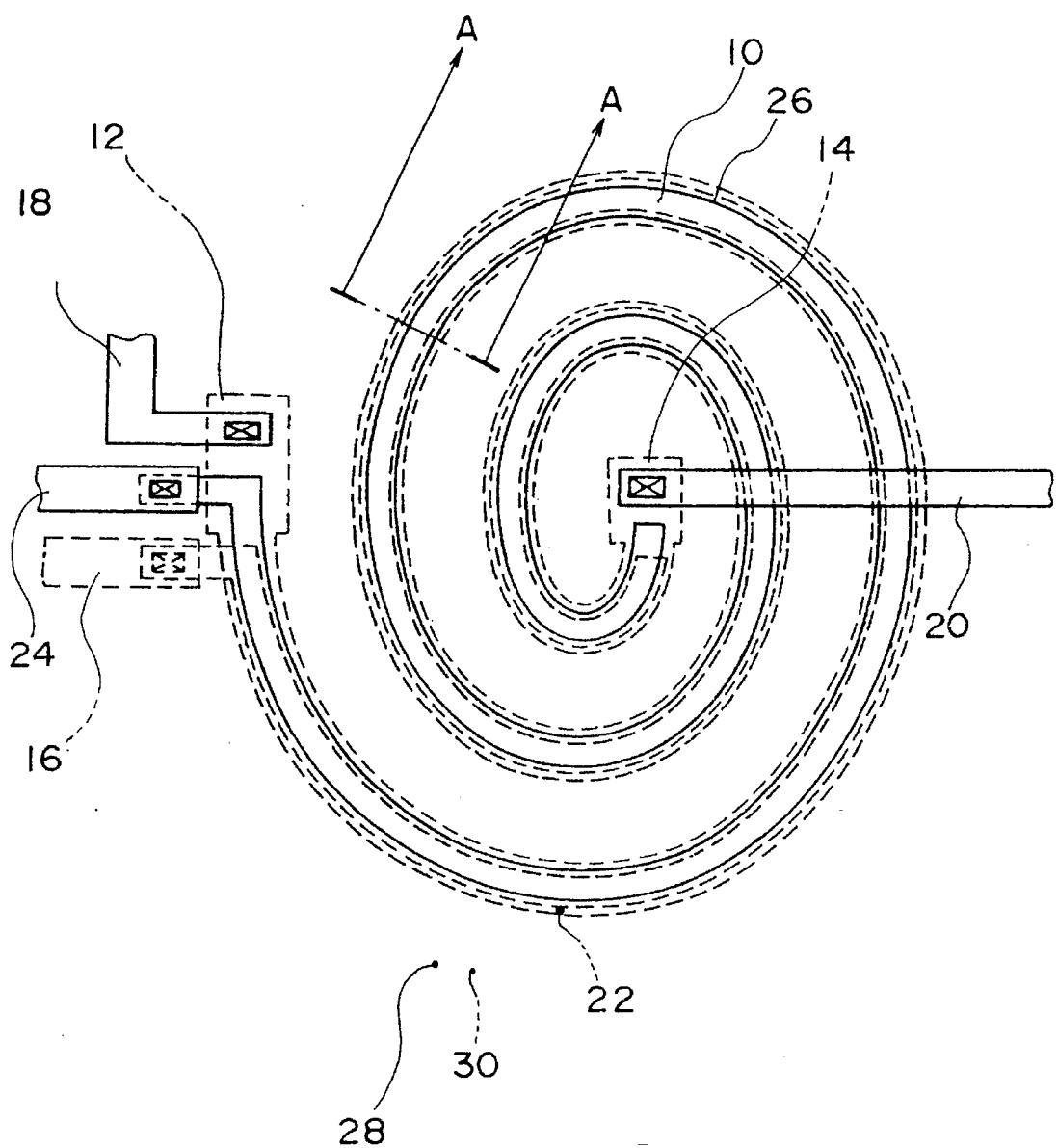
FIG. 11 indicates an example of a variation of an LC element in accordance with the first embodiment.
Figure 12A:
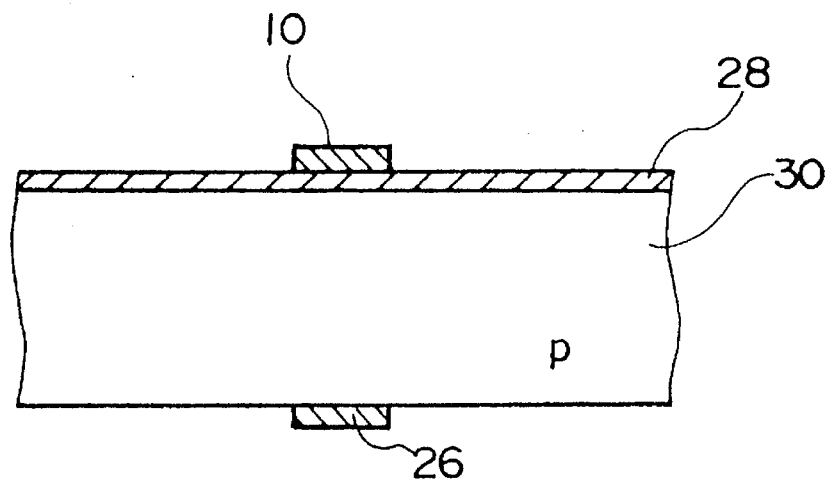
FIGS. 12A and 12B are an enlarged cross-sectional view viewed along line A—A in FIG. 11.
Figure 12B:
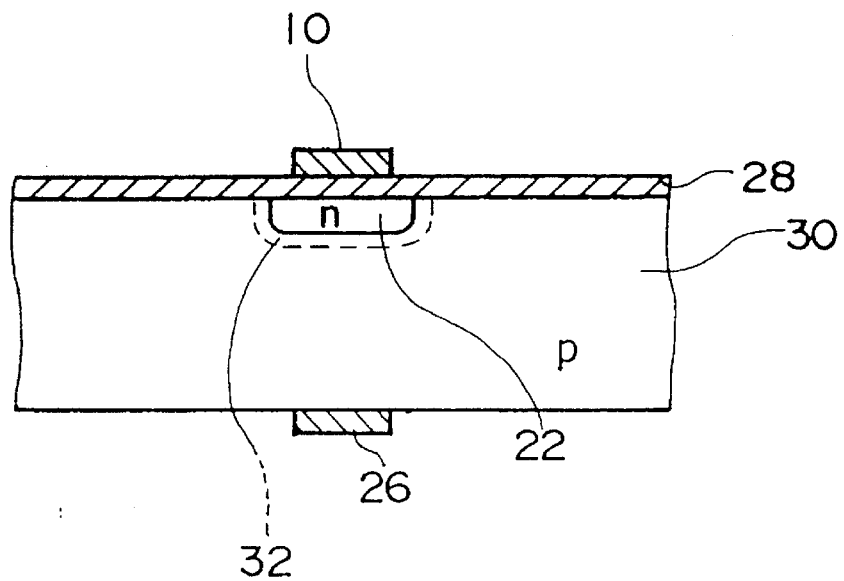
Figure 13:
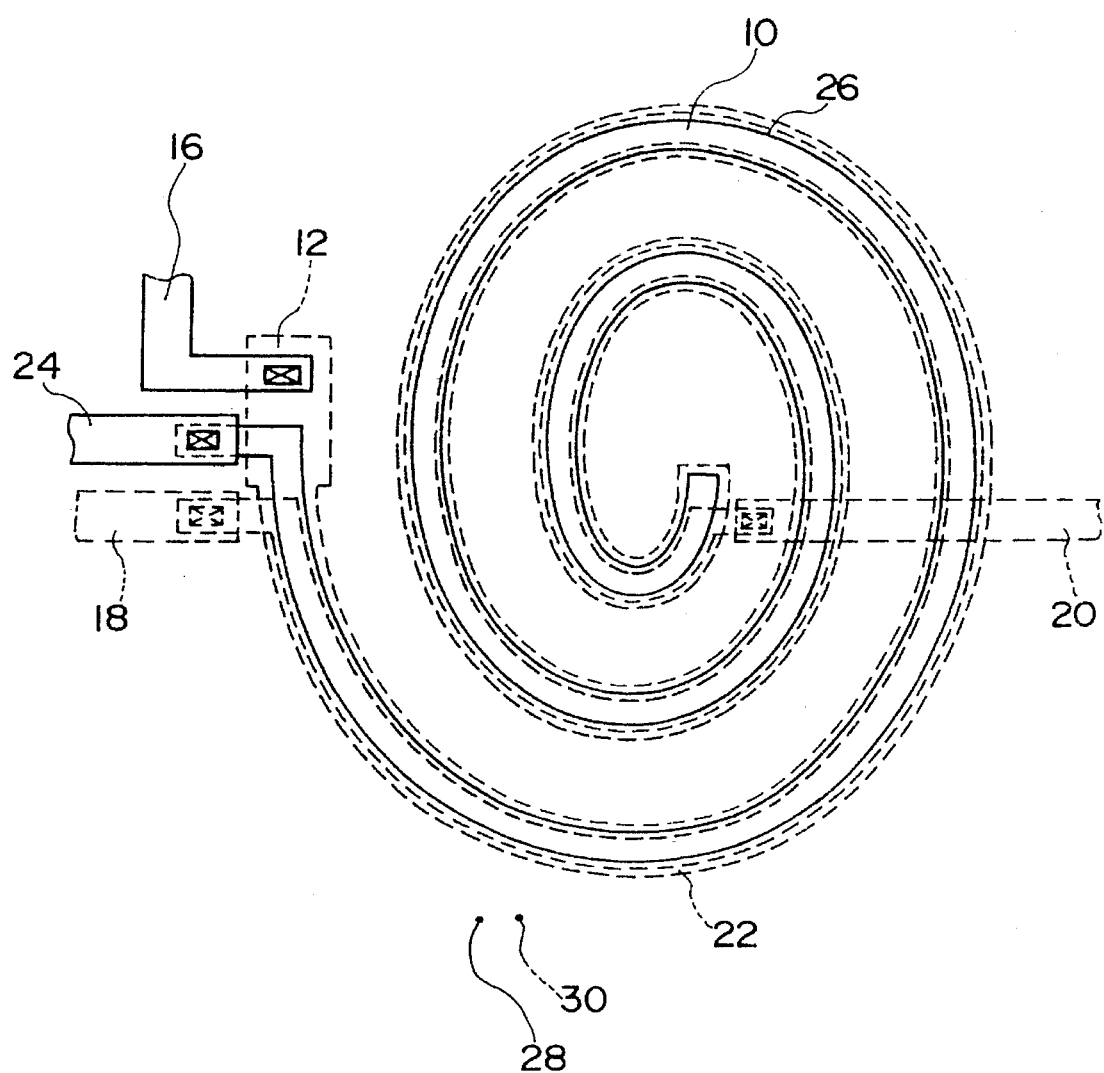
FIG. 13 indicates an example of a variation of an LC element in accordance with the first embodiment.

FIG. 11 indicates an example of a variation of the first embodiment wherein the second electrode 26 is disposed so as to essentially oppose the first electrode 10 on the opposite (rear) side of the p-Si substrate 30. For the sake of illustration in order to allow discerning the rear electrode shape, the position is shifted slightly toward the lower right in the figure. FIG. 12 is an enlarged cross-sectional view viewed along line A—A in FIG. 11 and corresponds to FIG. 2. FIG. 13 indicates an example, using the LC element shown in FIG. 11 wherein the second electrode 26 is used as the signal transmission line and corresponds to FIG. 10.

In this manner, even when the spiral shaped first and second electrodes are disposed essentially in opposition on opposite sides of the p-Si substrate 30, i.e., the channel 22 and second electrode 26 are disposed essentially in opposition, in the same manner as the LC element 100 indicated in FIGS. 1 and others, the channel 22 and second electrode 26 respectively function as inductors, while a distributed constant type capacitor is formed between these. Consequently, an LC element having such advantages as excellent frequency response and easy manufacture can be obtained. In particular, when the first and second electrodes are essentially opposingly arranged in this manner, compared to the case where these are disposed essentially in parallel on the same plane as indicated in FIG. 1, an advantage of reduced installation area is obtained.

Second Embodiment

Following is a description of an LC element in accordance with a second embodiment of this invention with reference to the attached drawings.

An LC element in accordance with the second embodiment differs from the first embodiment mainly by using non-spiral shapes for the first electrode 10 and second electrode 26. Naturally, the channel 22 formed along the first electrode 10 is also non-spiral shape. In the figures, the same designations are used for items that correspond to those of the first embodiment.

Figure 14:
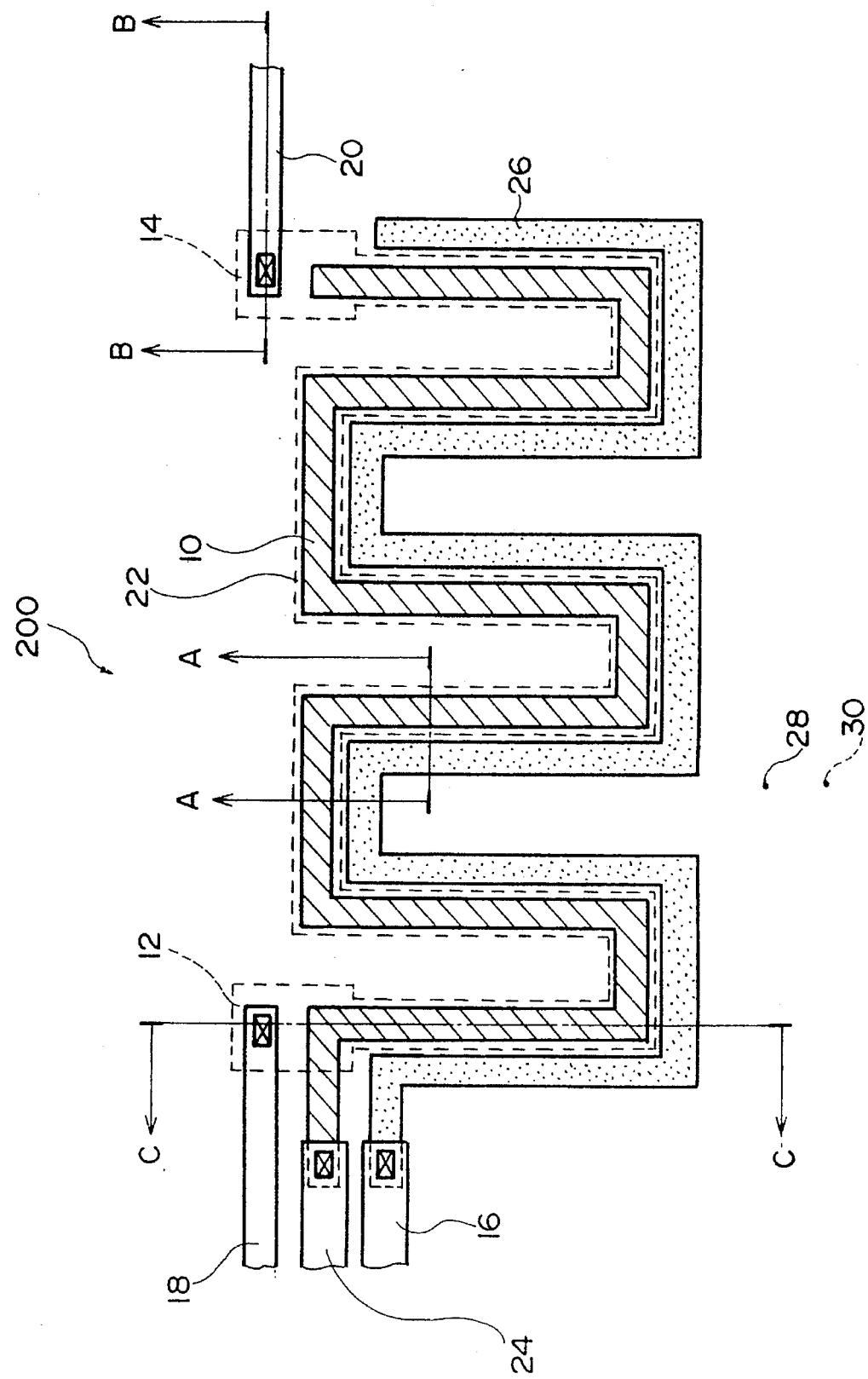
FIG. 14 is a plan view of an LC element in accordance with a second embodiment of this invention.
Figure 15:
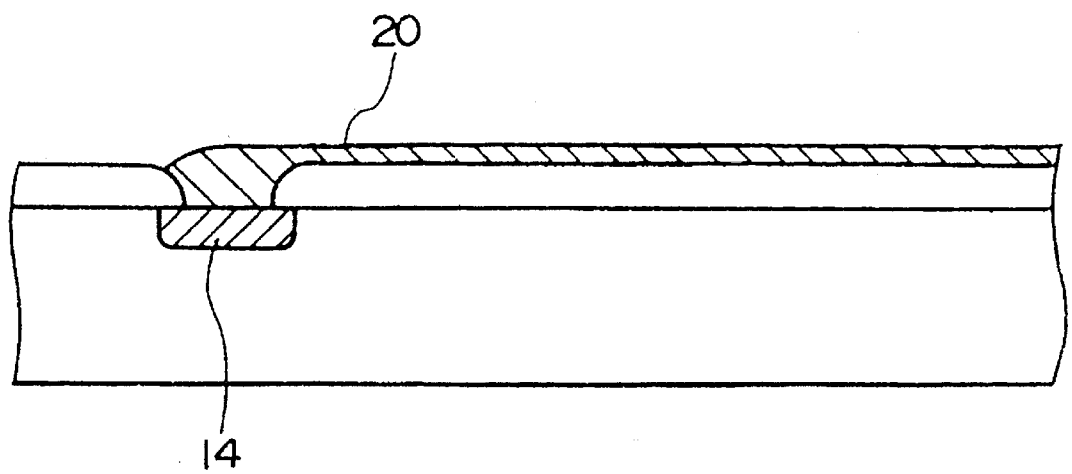
FIG. 15 is an enlarged cross-sectional view viewed along line B—B in FIG. 14.
Figure 16:
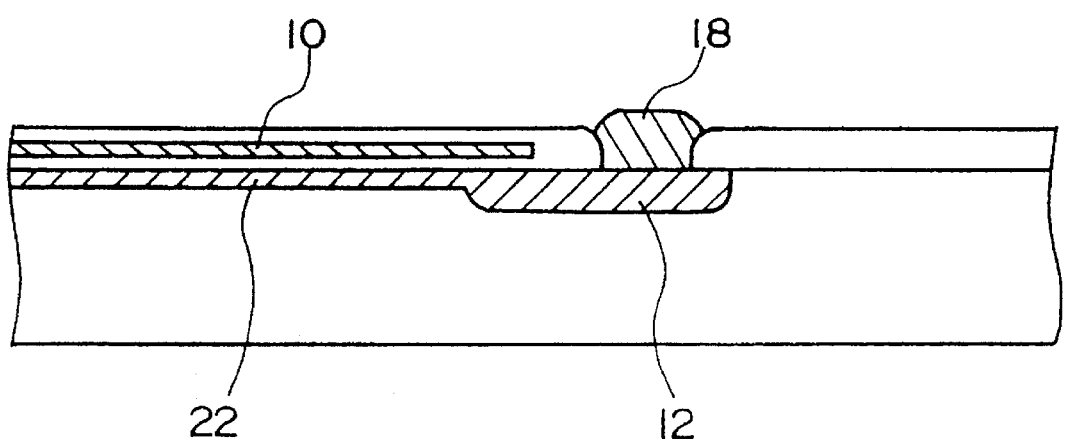
FIG. 16 is an enlarged cross-sectional view viewed along line C—C in FIG. 14.

FIG. 14 is a plan view of an LC element according to the second embodiment. FIGS. 15 and 16 are enlarged cross-sectional views viewed respectively along lines B—B and C—C in FIG. 14. The enlarged cross-sectional view viewed along line A—A in FIG. 14 is the same as the first embodiment indicated in FIGS. 2A and 2B.

Figure 17:
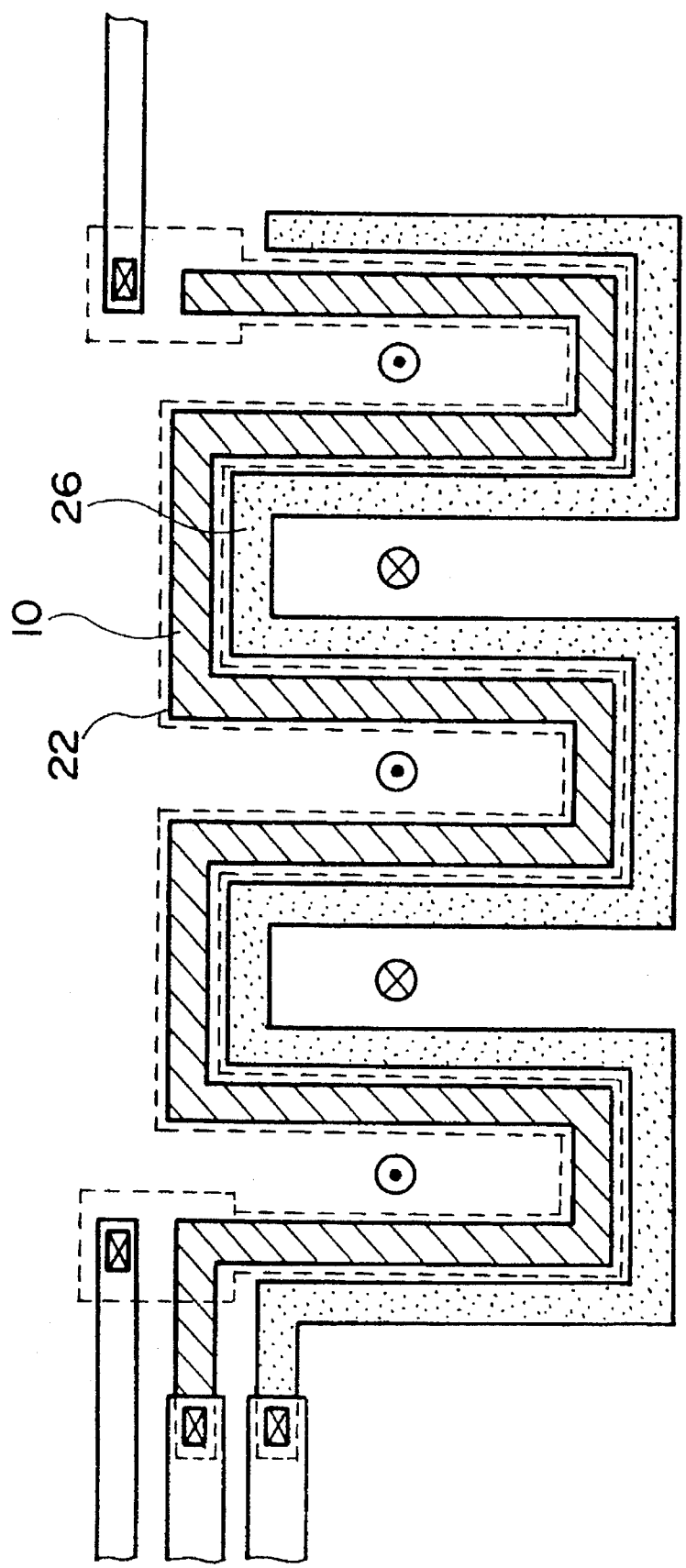
FIG. 17 indicates the principle of an inductor formed by a meander shaped electrode.

FIG. 17 indicates the principle of an inductor formed by a meander shaped electrode. When current flows in a single direction in a meander shaped electrode 10 having concave and convex bends, magnetic flux is alternately produced so as to reverse the direction in adjacent concave and convex bends (for example, perpendicularly upward from the figure near the locations indicated by circled dots in FIG. 17, and perpendicularly downward near the locations indicated by circled Xs), thereby resembling the state when ½ turn coils are connected in series. Consequently, an element having a meander shape such as indicated in FIG. 17 can be made to function as an inductor having an overall predetermined inductance.

Also, in the case of a spiral shaped electrode, one of the electrode ends is positioned at the center portion, and the other end is positioned at the circumference portion. In contrast, in the case of a meander shaped electrode, since both ends of the electrode are positioned at the peripheral portion, the arrangement is favorable for providing terminals and connecting to other circuit components.

In this manner, in the case of the LC element 200 of this embodiment, in the same manner as the LC element 100 of the first embodiment, the channel 22 formed in correspondence to the first electrode 10 and the second electrode 26 respectively function as inductors, while a distributed constant type capacitor is formed between the channel 22 and second electrode 26.

Consequently, in the case when the channel 22 is used as the signal transmission line, while the ground electrode 16 provided at one end of the second electrode 26 is grounded or connected to a fixed potential, an LC element is comprised having excellent attenuation over a wide band with respect to the input signal.

Figure 18:
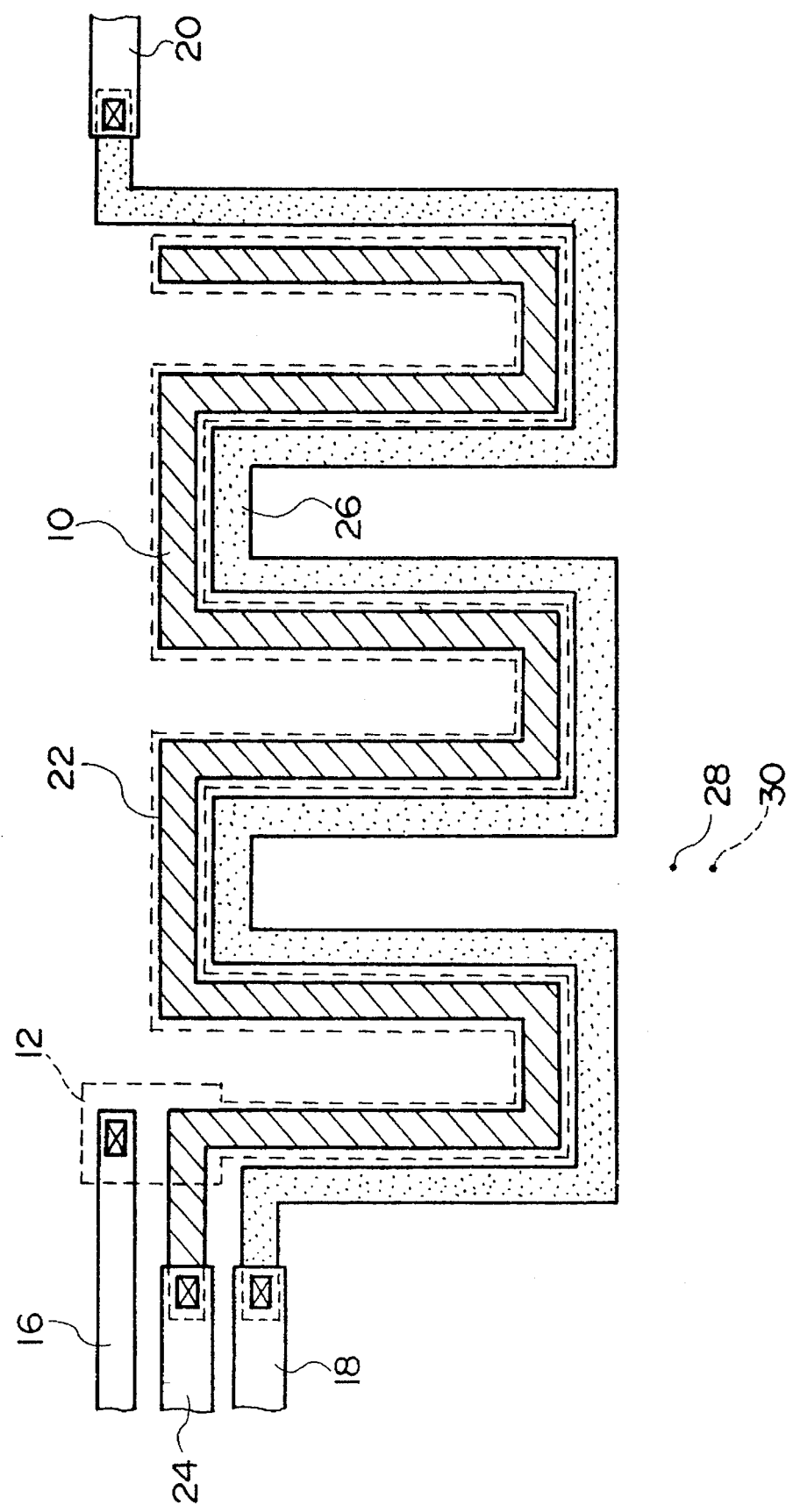
FIG. 18 indicates an example of a variation of an LC element in accordance with the second embodiment.

Also, as indicated in FIG. 18, without using the channel 22 formed in correspondence to the first electrode 10 as the signal transmission line, by connecting the input/output electrodes 18 and 20 to the respective ends of the second electrode 26, connecting the ground electrode 16 to the source 12 (or drain 14) formed at one end of the channel 22 and connecting the ground electrode 16 to a ground or fixed potential, the second electrode 26 can also be used as the signal transmission line in the same manner as the LC 100 of the first embodiment.

Figure 19:
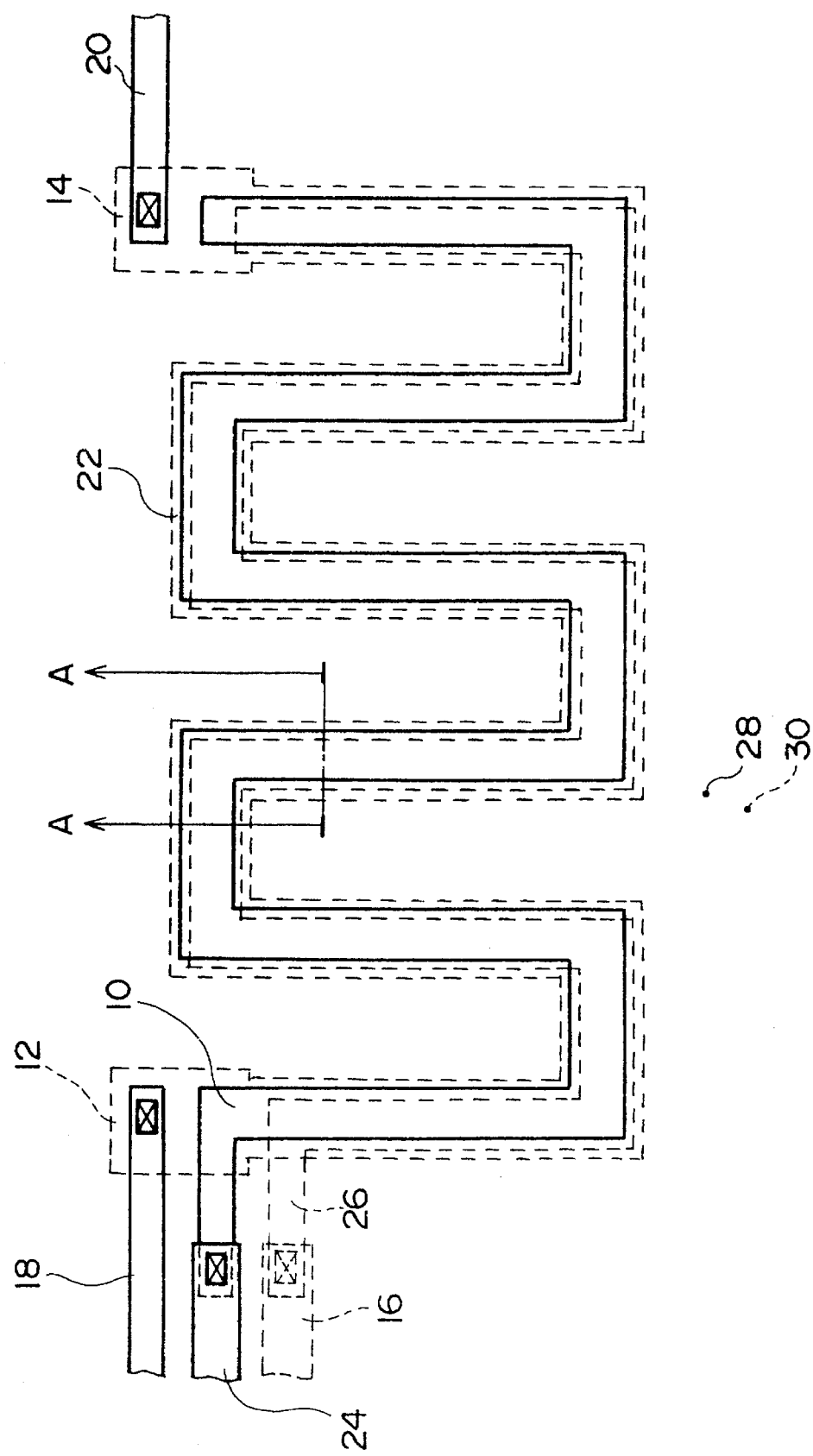
FIG. 19 indicates an example of a variation of an LC element in accordance with the second embodiment.
Figure 20:
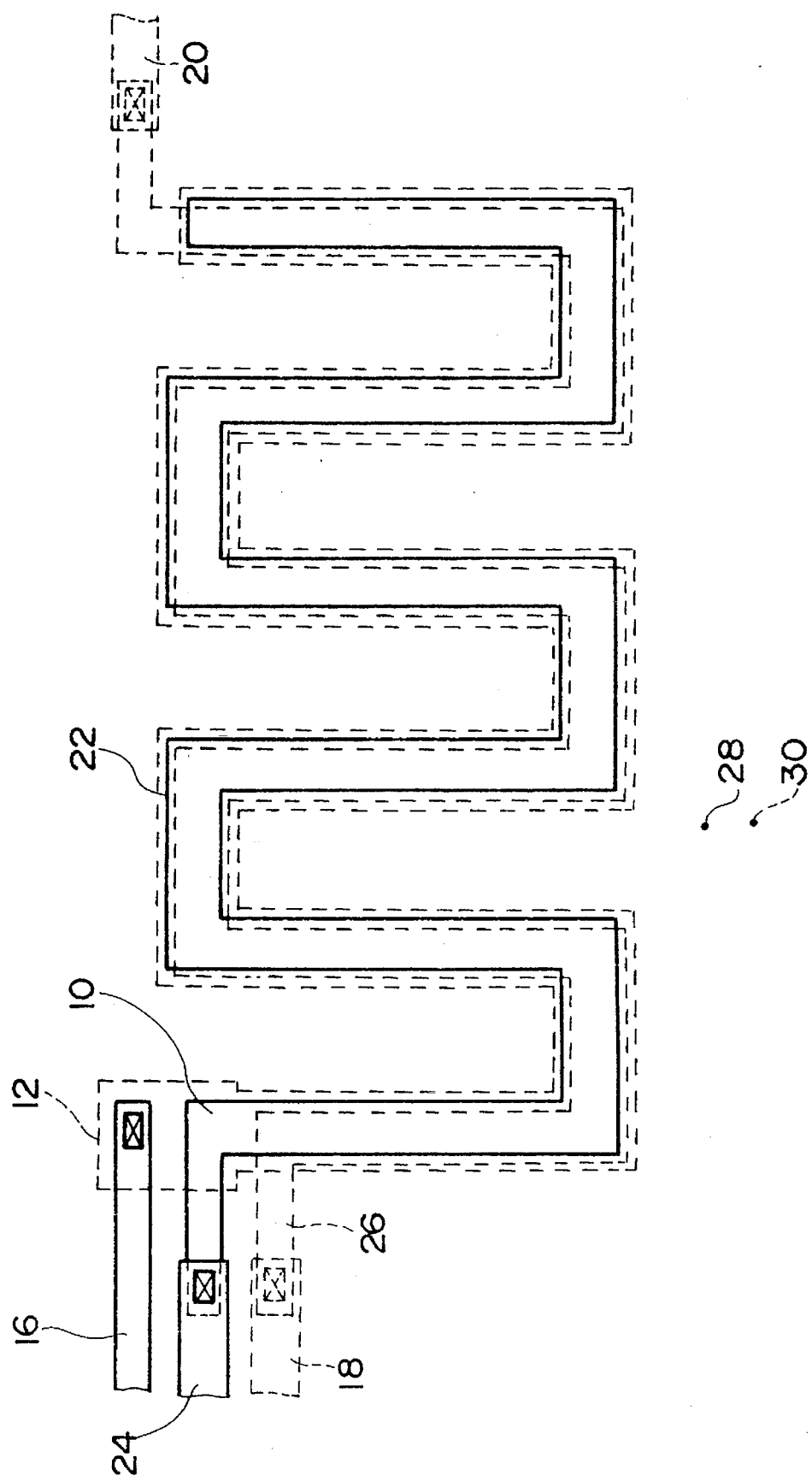
FIG. 20 indicates an example of a variation of an LC element in accordance with the second embodiment.

FIG. 19 indicates an example of a variation of the second embodiment wherein the second electrode 26 is disposed so as to essentially oppose the first electrode 10 on the opposite (rear) side of the p-Si substrate 30. For the sake of illustration in order to allow discerning the rear electrode shape, the position is shifted slightly toward the lower right in the figure. An enlarged cross-sectional view viewed along line A—A in the FIG. 19 is the same as FIGS. 12A and 12B. FIG. 20 indicates an example wherein the second electrode 26 of the FIG. 19 LC element is used as the signal transmission line and corresponds to FIG. 18.

In this manner, even when the meander shaped first and second electrodes are disposed essentially in opposition on opposite sides of the p-Si substrate 30, i.e., the channel 22 and second electrode 26 are disposed essentially in opposition, in the same manner as the LC element 200 indicated in FIGS. 14 and others, the channel 22 and second electrode 26 respectively function as inductors, while a distributed constant type capacitor is formed between these. Consequently, an LC element having such advantages as excellent frequency response and easy manufacture can be obtained. In particular, when the first and second electrodes 10 and 26 are essentially opposingly arranged in this manner, compared to the case where these are disposed essentially in parallel on the same plane as indicated in FIG. 14, an advantage of reduced installation area is obtained.

Also, as mentioned above, since this LC element 200 can be manufactured by utilizing ordinary MOSFET type manufacturing technology, production is both easy and applicable to down-sizing and other requirements. In addition, when the LC element is manufactured as a portion of a semiconductor substrate, wiring to other components can be performed simultaneously, and assembly and other work during subsequent processing becomes unnecessary. By varying the gate voltage (control voltage Vc) applied to the first electrode 10, the channel 22 resistance and the capacitance of the distributed constant type capacitor formed between the channel 22 and second electrode 26 can be variably controlled, thereby enabling the overall frequency response of the LC element 200 to be adjusted or changed as in the LC element 100 of the first embodiment.

Third Embodiment

Following is a description of an LC element in accordance with a third embodiment of this invention with reference to the attached drawings.

The above described first and second embodiments respectively referred to LC elements 100 and 200 wherein the channel 22 formed in correspondence to the first electrode 10 and second electrode 26 were essentially parallel over their entire length and thus were formed at essentially the same length. In the case of an LC element 300 of the third embodiment, the second electrode 26 is formed at approximately ½ the length indicated in FIG. 1.

Figure 21:
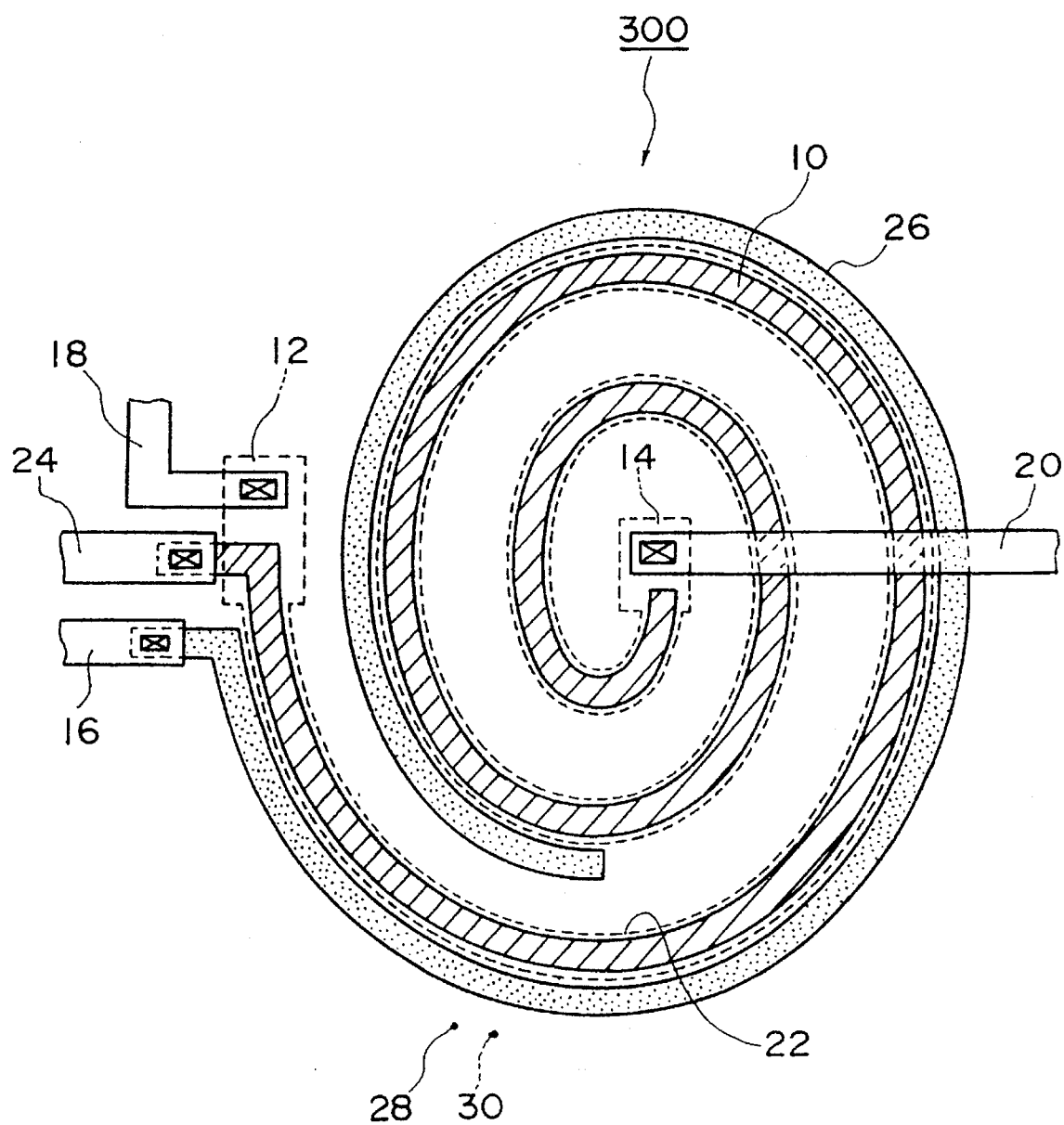
FIG. 21 is a plan view of an LC element in accordance with a third embodiment of this invention.

FIG. 21 is a plan view of an LC element 300 according to the third embodiment, As indicated in the figure, even when a portion of the second electrode 26 is omitted, the shortened second electrode 26 and the channel 22 formed longer than the second electrode 26 in correspondence with the first electrode 10 respectively comprise inductors, while a distributed constant type capacitor is formed by the channel 22 and second electrode 26. Therefore, excellent attenuation characteristics are obtained as in the LC element 100 of the first embodiment indicated in FIG. 1.

Figure 22:
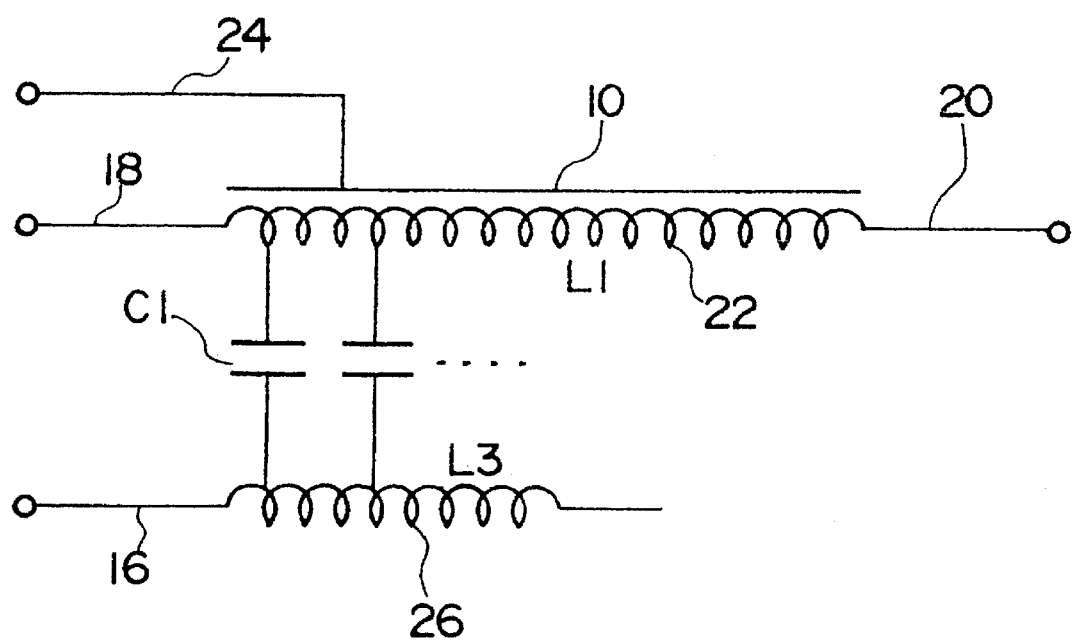
FIG. 22 is a schematic diagram indicating an equivalent circuit of the LC element in accordance with the third embodiment.

FIG. 22 shows an equivalent circuit of the LC element 300. As indicated in the figure, the inductance L3 is reduced to only the extent the number of second electrode 26 turns are reduced, while the corresponding distributed constant type capacitance C1 is also reduced.

Also, by varying the gate voltage applied to the control electrode 24, the resistance of the channel 22 formed in correspondence to the first electrode 10 and the capacitance between the channel 22 and second electrode 26 having reduced turns are varied, thereby enabling the LC element 300 attenuation characteristics to be variably control led as in the LC elements 100 and 200 of the respective first and second embodiments described above.

In this manner, the channel 22 formed in correspondence to the first electrode 10 and the second electrode 26 formed shorter than the first electrode 10 comprise inductors, while a distributed constant type capacitor is formed between these, thereby enabling the LC element 300 to function as an element having excellent attenuation characteristics.

The above description referred to an LC element 300 wherein the channel 22 formed in correspondence to the first electrode 10 is used as the signal transmission line. However, it can also be arranged such that the second electrode 26 is used as the signal transmission line, and that the channel 22 formed in correspondence to the first electrode 10 is connected to a ground or fixed potential.

Figure 23:
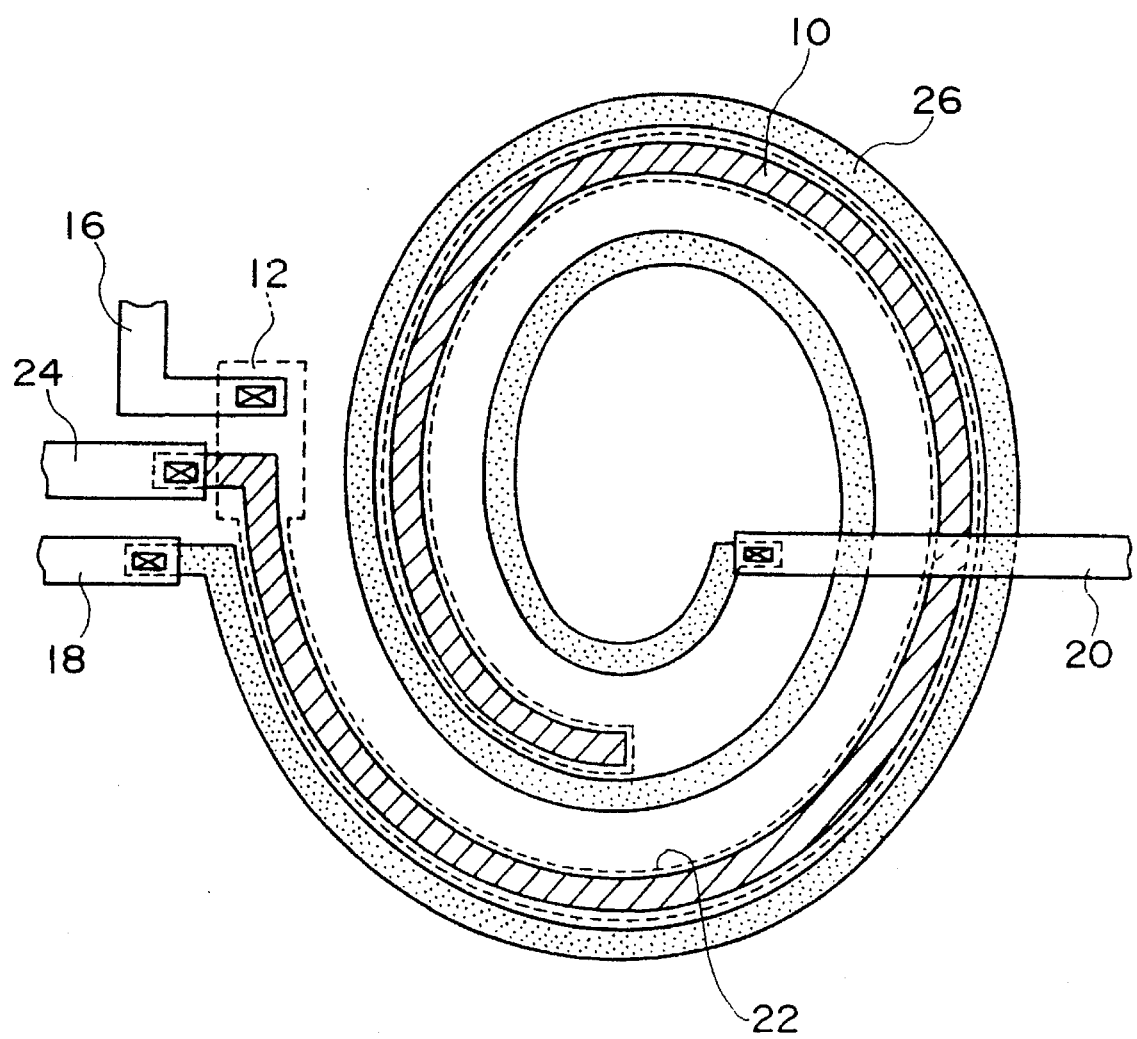
FIG. 23 indicates an example of a variation of an LC element in accordance with the third embodiment.

FIG. 23 indicates an example of a variation wherein the second electrode 26 is used as the signal transmission line and corresponds to FIG. 10 of the first embodiment. In this case, the respective input/output electrodes 18 and 20 are connected to the respective ends of the second electrode 26, while the ground electrode 16 is connected to the source 12 (or drain 14) provided at one end of the channel 22 formed in correspondence to the first electrode 10. By forming the first electrode 10 approximately half the length of the second electrode 26, the channel 22 formed in correspondence to the first electrode 10 is also formed at approximately half length.

Even in this case as well, the channel 22 formed in correspondence to the first electrode 10 and second electrode 26 respectively function as inductors, while a distributed constant type capacitor is formed between these. Therefore, excellent attenuation characteristics can be obtained in the same manner as the LC element 300 indicated in FIG. 21.

Figure 24:
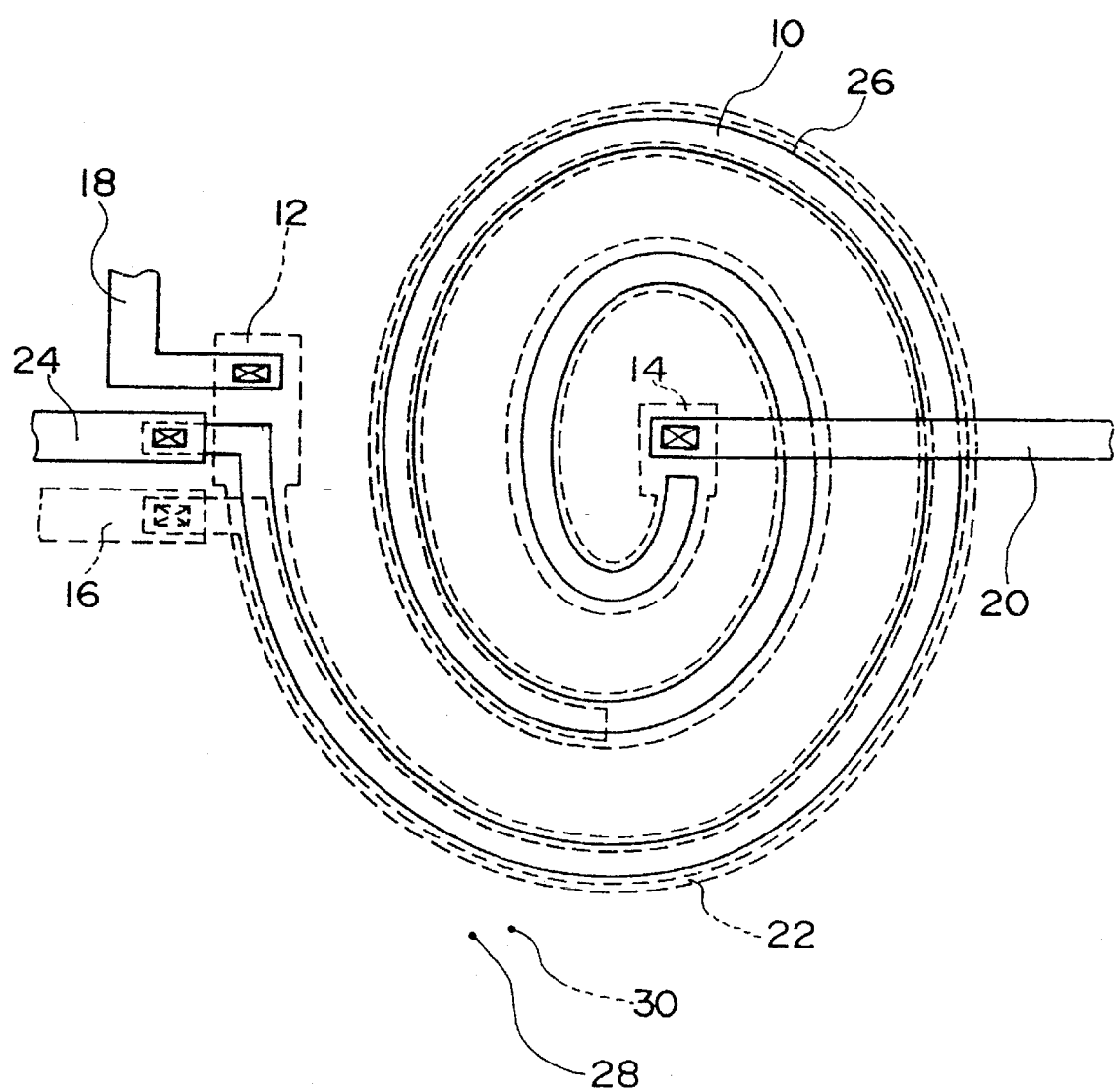
FIG. 24 indicates an example of a variation of an LC element in accordance with the third embodiment.
Figure 25:
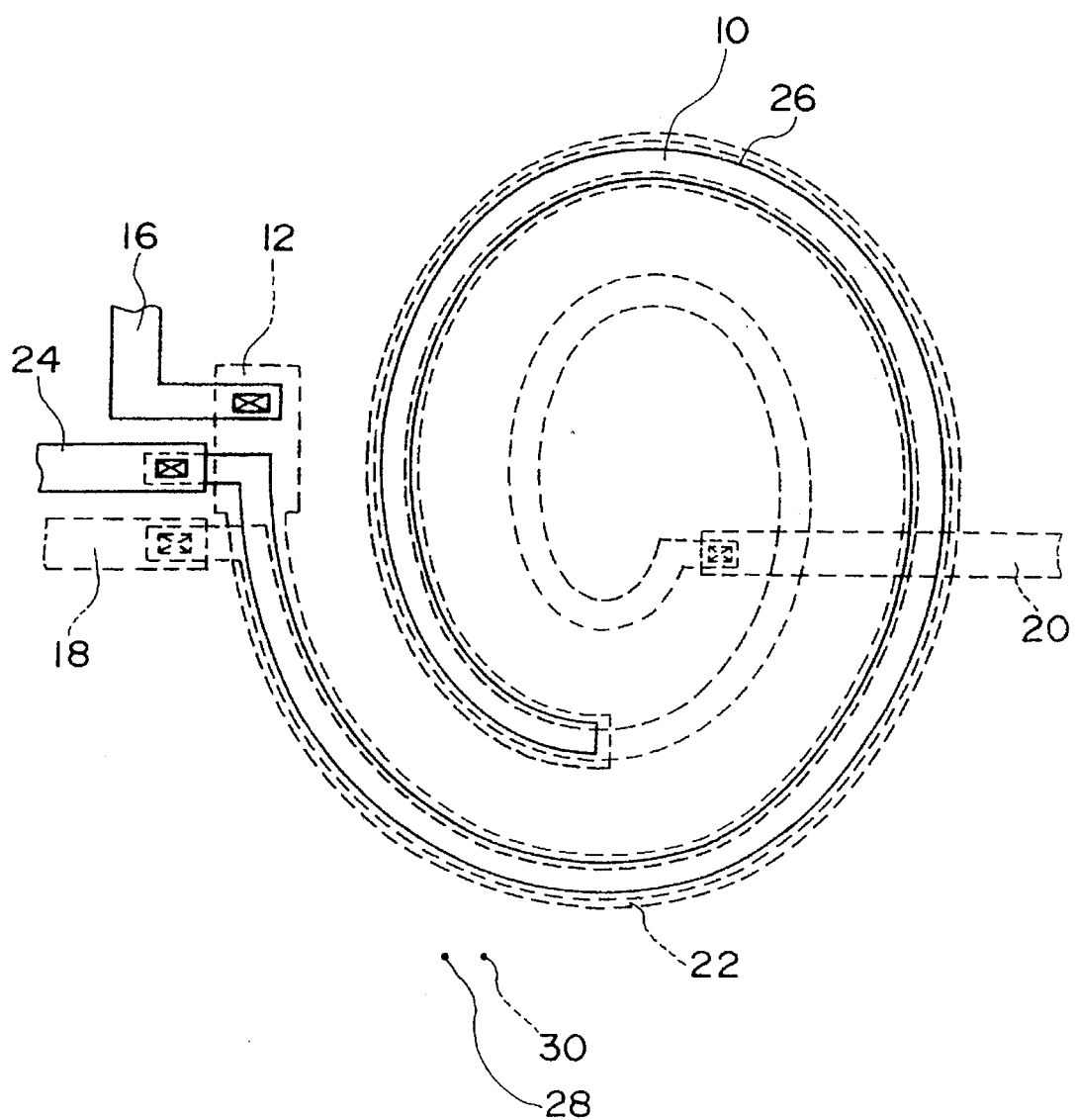
FIG. 25 indicates an example of a variation of an LC element in accordance with the third embodiment.

FIG. 24 indicates an example of a variation wherein the shortened second electrode 26 is disposed essentially in opposition to the first electrode 10 (i.e., channel 22) on the opposite face of the p-Si substrate 30 and corresponds to FIG. 21. FIG. 25 corresponds to FIG. 23 and indicates an example of a variation wherein the second electrode 26 is disposed essentially in opposition to the first electrode 10 on the opposite face of the p-Si substrate 30, and the first electrode 10 and channel 22 formed in correspondence thereto are shortened.

As indicated in FIGS. 24 and 25, even when the spiral shaped different length channel 22 and second electrode 26 are disposed essentially in opposition, in the same manner as the LC element 300 indicated in FIGS. 21 and others, the channel 22 and second electrode 26 respectively function as inductors, while a distributed constant type capacitor is formed between these, thereby providing such advantages as excellent frequency response and easy manufacture.

The LC element 300 also features the same advantages as the LC elements 100 and 200 of the respective first and second embodiments such as ability to be manufactured by utilizing semiconductor manufacturing technology and ability of formation as a portion of an LSI or other device, in which case wiring work in subsequent processing can be abbreviated.

Fourth Embodiment

Following is a description of an LC element in accordance with a fourth embodiment of this invention with reference to the attached drawings.

An LC element in accordance with the fourth embodiment differs from the third embodiment mainly by using non-spiral shapes for the first electrode 10 and second electrode 26. The channel 22 formed along the first electrode 10 is also non-spiral shaped. In the figures, the same designations are used for items that correspond to those of the third embodiment.

In the case of an LC element 400 of the fourth embodiment, the second electrode 26 is formed at approximately ½ the length in the second embodiment indicated in FIG. 14.

Figure 26:
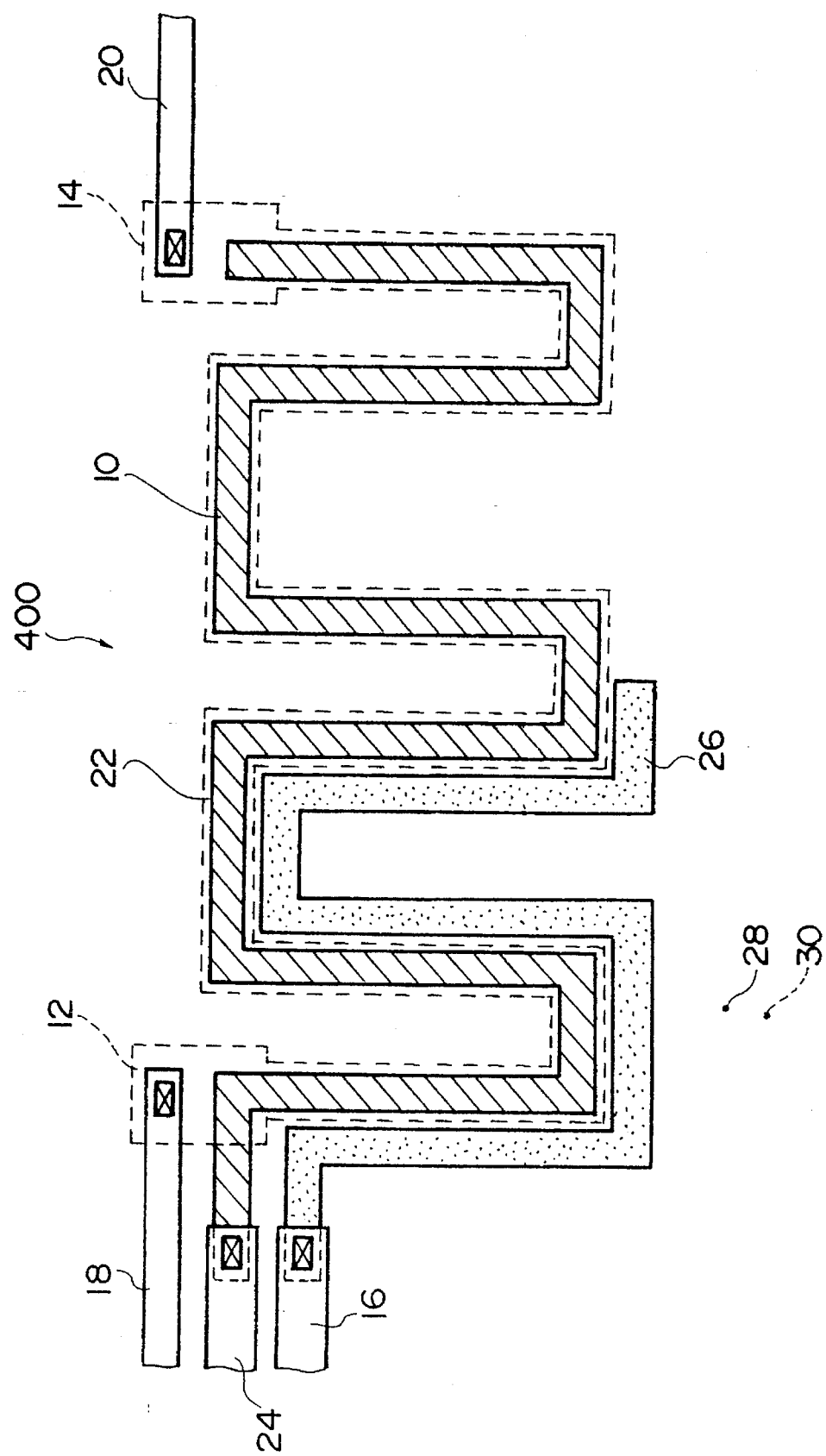
FIG. 26 is a plan view of an LC element in accordance with a fourth embodiment of this invention.

FIG. 26 is a plan view of an LC element 400 according to the third embodiment. As indicated in the figure, even when a portion of the second electrode 26 is omitted, the shortened second electrode 26 and the channel 22 formed longer than the second electrode 26 in correspondence with the first electrode 10 respectively comprise inductors, while a distributed constant type capacitor is formed by the channel 22 and second electrode 26. Therefore, excellent attenuation characteristics are obtained in the same manner as the LC element 200 of the second embodiment indicated in FIG. 14.

Except for the inductance and capacitance values, the LC element 400 equivalent circuit is the same as the third embodiment shown in FIG. 22. As indicated in the figure, the inductance L3 is reduced by only the extent the number of second electrode 26 meander bends is reduced, while the corresponding distributed constant type capacitance C1 is also reduced.

In this manner, the channel 22 formed in correspondence to the first electrode 10 and the second electrode 26 formed shorter than the first electrode 10 comprise inductors, while a distributed constant type capacitor is formed between these, thereby enabling the LC element 300 to function as an element having excellent attenuation characteristics.

The above description referred to an LC element 400 wherein the channel 22 formed in correspondence to the first electrode 10 is used as the signal transmission line. However, it can also be arranged such that the second electrode 26 is used as the signal transmission line, and that the channel 22 formed in correspondence to the first electrode 10 is connected to a ground or fixed potential.

Figure 27:
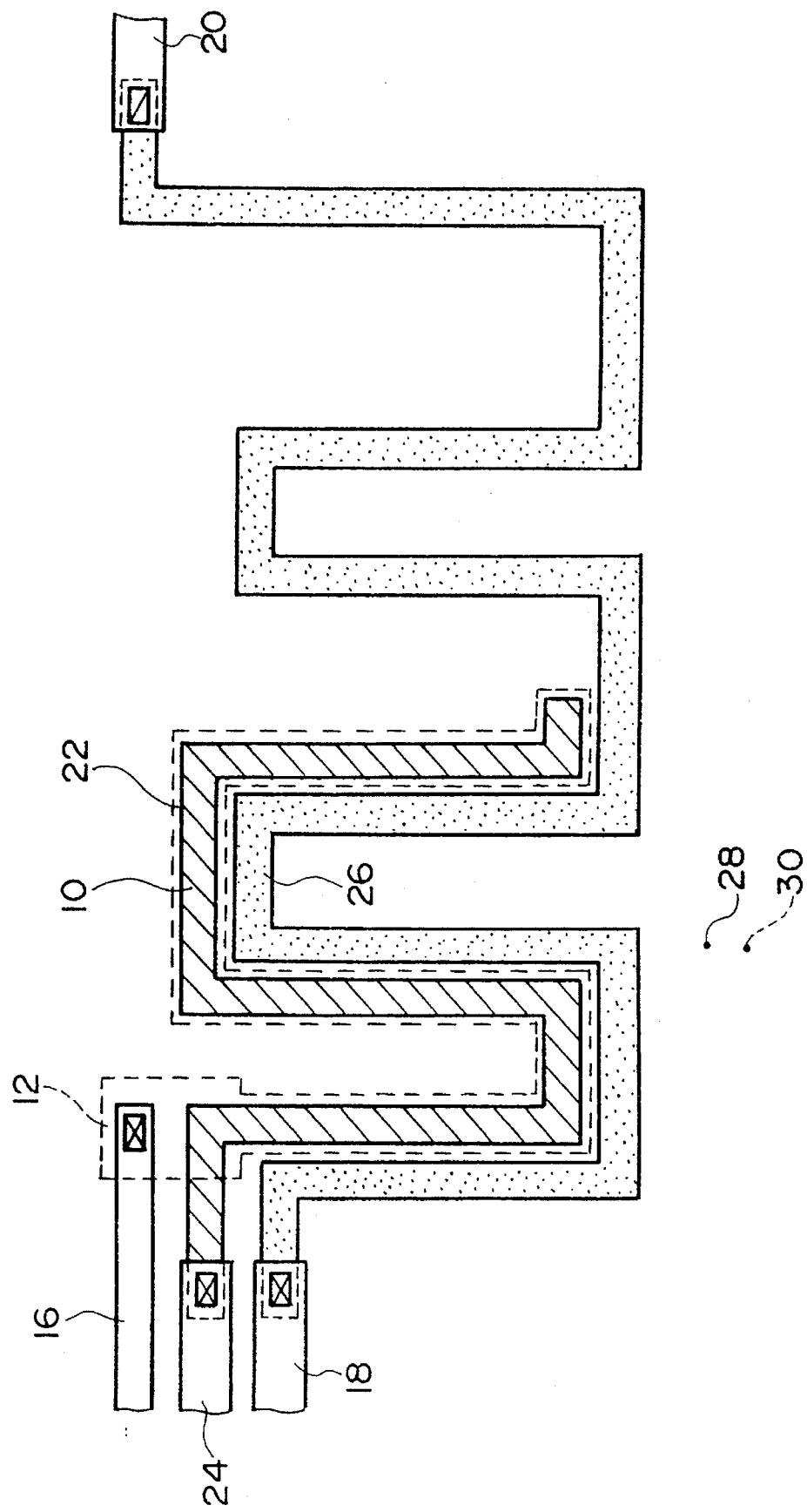
FIG. 27 indicates an example of a variation of an LC element in accordance with the fourth embodiment.

FIG. 27 indicates an example of a variation wherein the second electrode 26 is used as the signal transmission line and corresponds to FIG. 18 of the second embodiment. In this case, the respective input/output electrodes 18 and 20 are connected to the respective ends of the second electrode 26, while the ground electrode 16 is connected to the source 12 (or drain 14) provided at one end of the channel 22 formed in correspondence to the first electrode 10. By forming the first electrode 10 approximately half the length of the second electrode 26, the channel 22 formed in correspondence to the first electrode 10 is also formed at approximately half length.

Even in this case as well, the channel 22 formed in correspondence to the first electrode 10 and second electrode 26 respectively function as inductors, while a distributed constant type capacitor is formed between these. Therefore, excellent attenuation characteristics can be obtained as in the LC element 400 indicated in FIG. 26.

Figure 28:
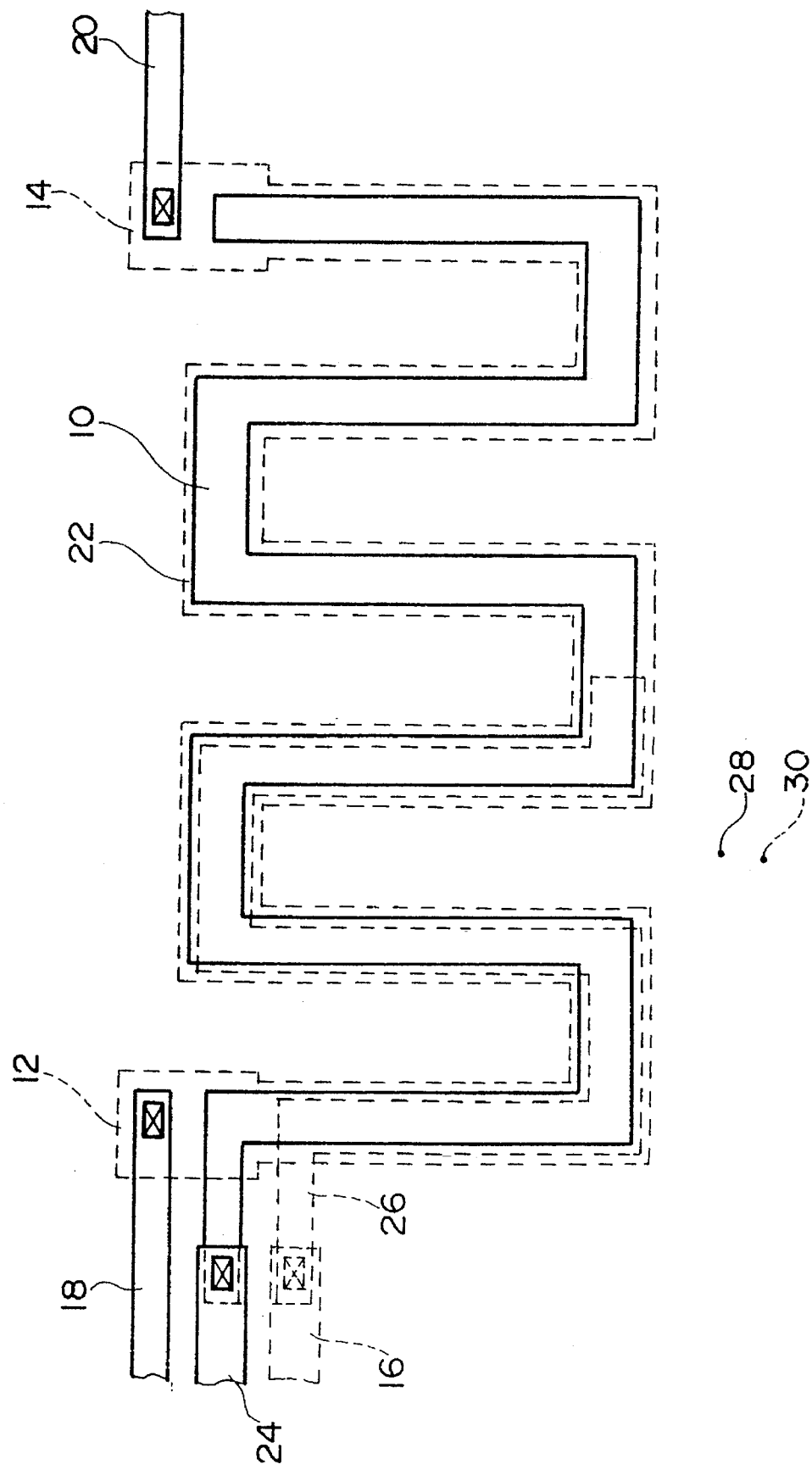
FIG. 28 indicates an example of a variation of an LC element in accordance with the fourth embodiment.
Figure 29:
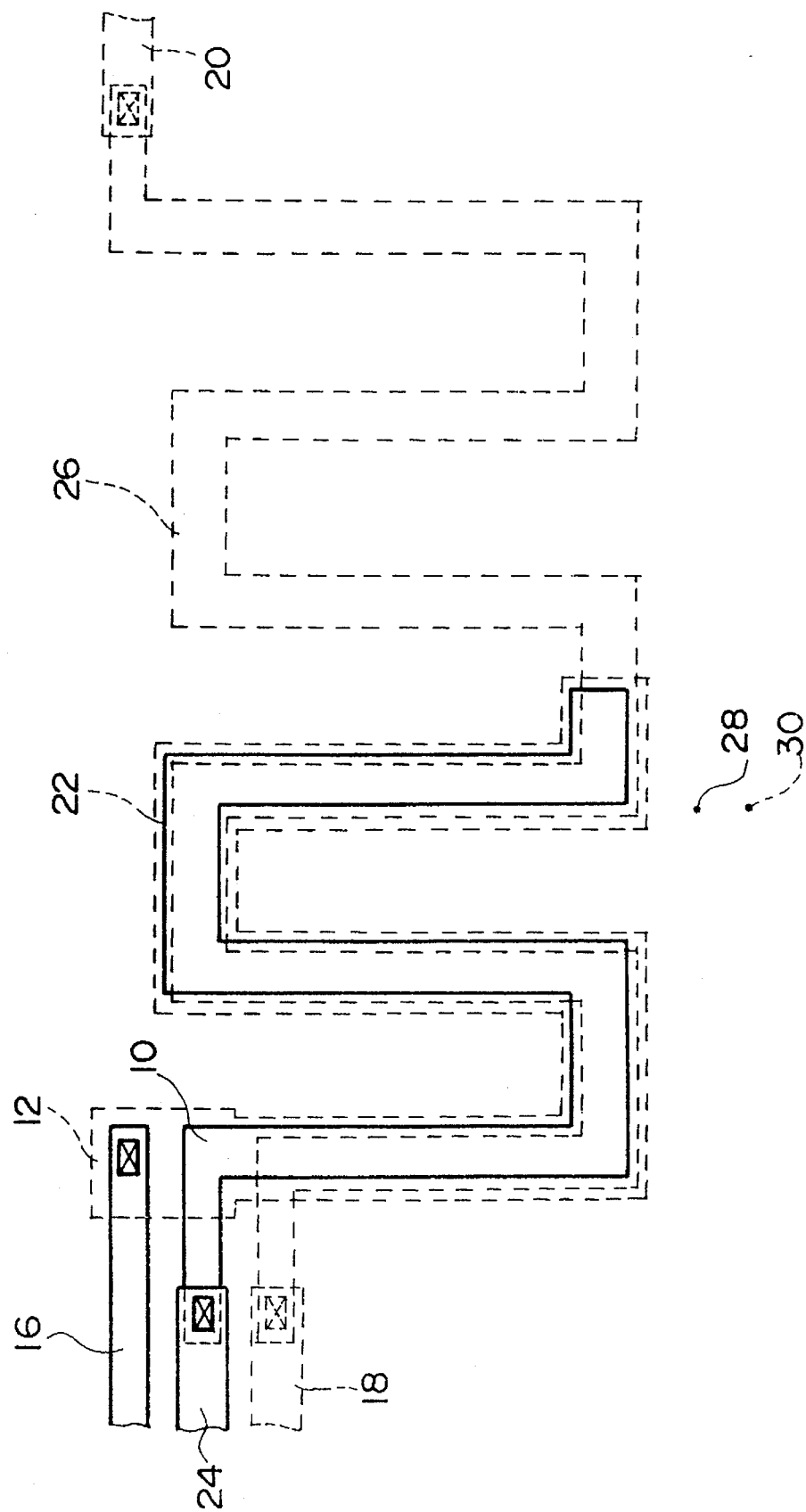
FIG. 29 indicates an example of a variation of an LC element in accordance with the fourth embodiment.

FIG. 28 indicates an example of a variation wherein the shortened second electrode 26 is disposed essentially in opposition to the first electrode 10 (i.e., channel 22) on the opposite face of the p-Si substrate 30 and corresponds to FIG. 26. In order to allow discerning the rear electrode shape, the position is shifted slightly toward the lower right in FIG. 28. FIG. 29 corresponds to FIG. 27 and indicates an example of a variation wherein the second electrode 26 is disposed essentially in opposition to the first electrode 10 on the opposite face of the p-Si substrate 30, and the first electrode 10 and channel 22 formed in correspondence thereto are shortened.

As indicated in FIGS. 28 and 29, even when the meander shaped different length channel 22 and second electrode 26 are disposed essentially in opposition, as in the LC element 400 indicated in FIGS. 26 and others, the channel 22 and second electrode 26 respectively function as inductors, while a distributed constant type capacitor is formed between these, thereby providing such advantages as excellent frequency response and easy manufacture.

The LC element 400 also features the same advantages as the LC elements of the above described embodiments such as ability to be manufactured by utilizing ordinary semiconductor manufacturing technology, easy manufacture and suitability for down-sizing and other requirements. Also, when the LC element is manufactured as a portion of a semiconductor substrate, wiring with other components can be performed simultaneously, in which case assembly work in subsequent processing is unnecessary. In addition, by varying the gate voltage (control voltage) applied to the first electrode 10, the channel 22 resistance and the capacitance of the distributed constant type capacitor formed between the channel 22 and second electrode 26 can be variably controlled, thereby enabling the overall frequency response of the LC element 400 to be adjusted or changed.

Fifth Embodiment

Following is a description of an LC element 500 in accordance with a fifth embodiment of this invention with reference to the attached drawings.

The foregoing descriptions referred to LC elements functioning as three-terminal normal mode type elements. The LC element 500 of the fifth embodiment is comprised so as to function as a four-terminal common mode type element.

Figure 30:
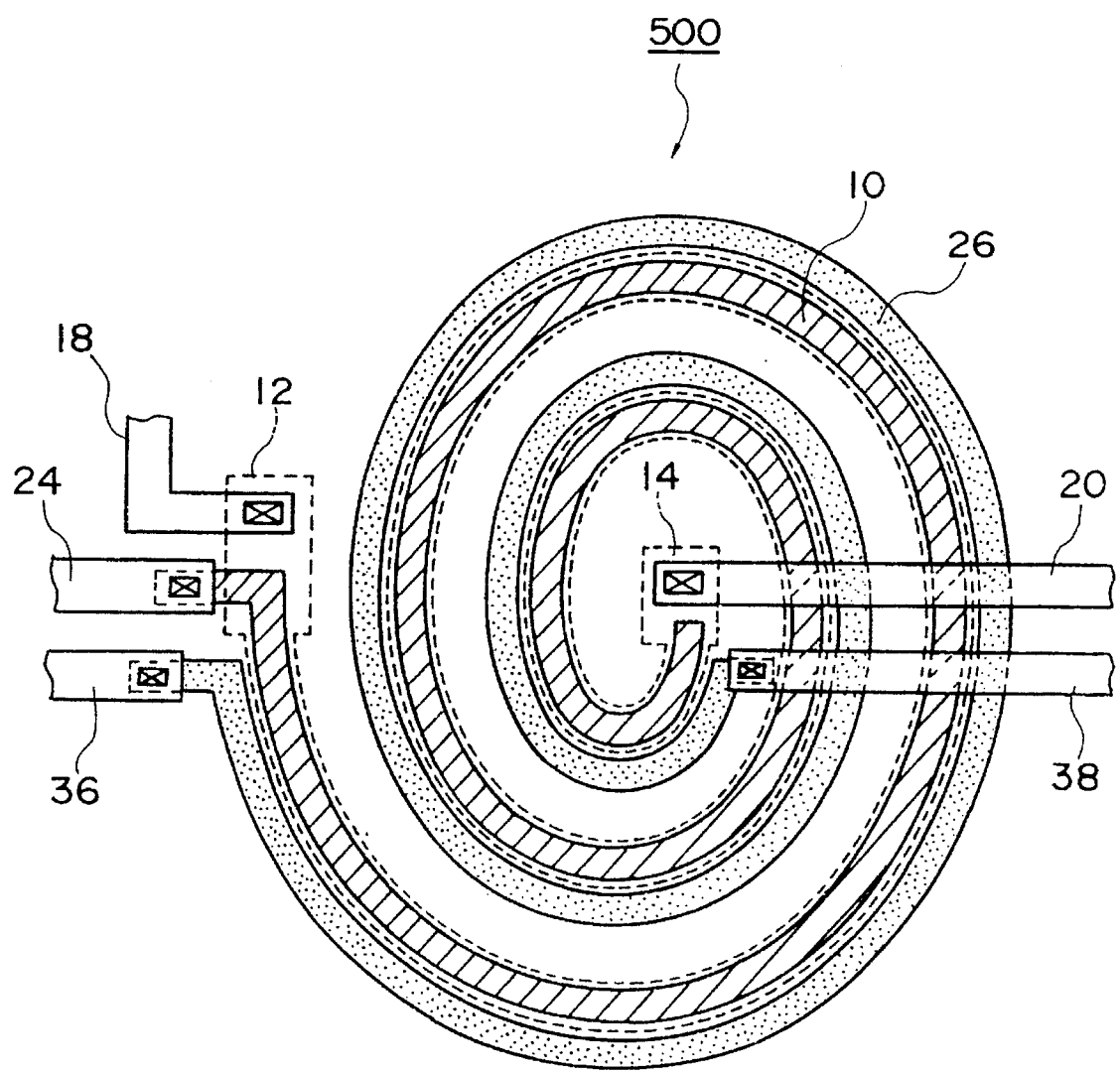
FIG. 30 is a plan view of an LC element in accordance with a fifth embodiment of this invention.

FIG. 30 is a plan view of the LC element 500 according to the fifth embodiment. As indicated in the figure, the LC element 500 differs from the LC element 100 indicated in FIG. 1 in that input/output electrodes 36 and 38 are provided at the respective ends of the second electrode 26.

Figure 31:
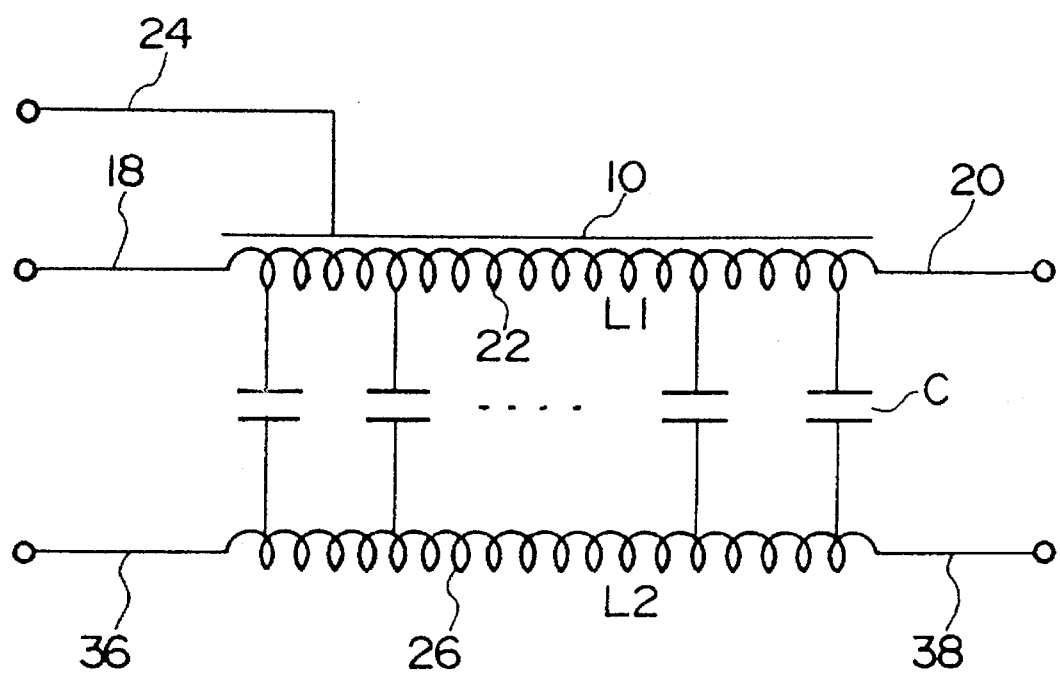
FIG. 31 is a schematic diagram indicating an equivalent circuit of the LC element in accordance with the fifth embodiment.

FIG. 31 shows an equivalent circuit of the LC element 500. As indicated in the figure, the channel 22 formed via the source 12 and drain 14 between the two input/output electrodes 18 and 20 functions as an inductor having inductance L1; and the second electrode 26 formed between the two input/output electrodes 36 and 38 functions as an inductor having inductance L2. Both the channel 22 and second electrode 26 are respectively used as signal transmission lines, while between these, a distributed constant type capacitor having capacitance C is formed in the same manner as the LC element 100 of the first embodiment.

In this manner, in the case of the LC element 500, not only the channel 22 formed in correspondence to the first electrode 10, but by also providing input/output electrodes 36 and 38 at the respective ends of the second electrode 26, the functions of a four-terminal common mode type element having excellent attenuation characteristics can be comprised. Also, by varying the gate voltage applied to the control electrode 24, the resistance including the above mentioned inductor having inductance L1 and the distributed constant type capacitance C can be changed, thereby enabling variable control of the LC element 500 overall attenuation characteristics.

Figure 32:
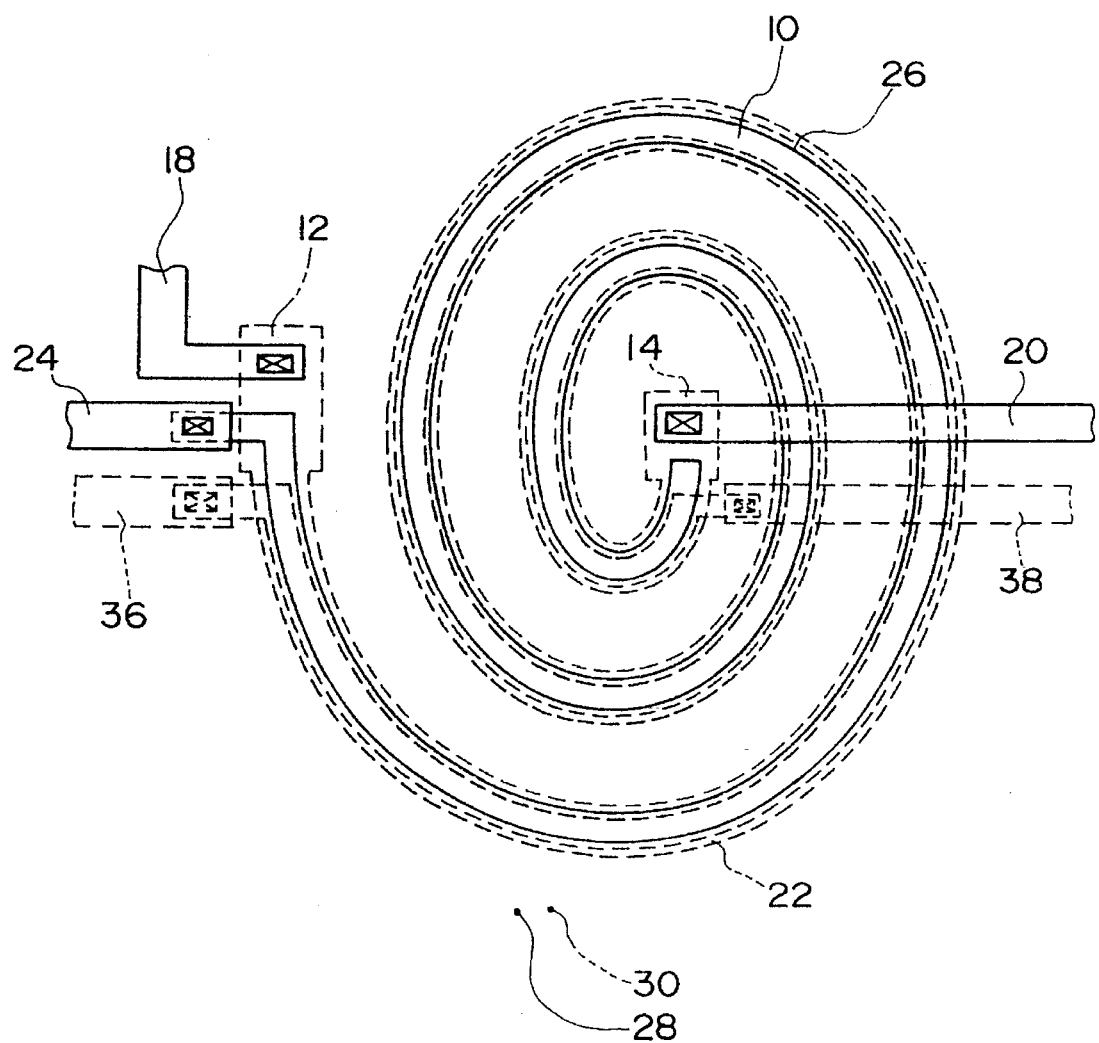
FIG. 32 indicates an example of a variation of an LC element in accordance with the fifth embodiment.

FIG. 32 indicates an example of a variation wherein the second electrode 26 is disposed essentially in opposition to the first electrode 10 (i.e., channel 22) on the opposite face of the p-Si substrate 30. As indicated in the figure, even when the spiral shaped channel 22 and second electrode 26 are arranged essentially in opposition, a distributed constant type capacitor is formed between these, and a four-terminal common mode type element can be comprised having such advantages as excellent frequency response and easy manufacture as in the LC element 500 shown in FIG. 30.

The LC element 500 also features the same advantages as the LC elements of the above described embodiments such as ability to be manufactured by utilizing ordinary semiconductor manufacturing technology, ease of manufacture and suitability for down-sizing and other requirements. Also, when the LC element is manufactured as a portion of a semiconductor substrate, wiring with other components can be performed simultaneously, in which case assembly work in subsequent processing is unnecessary. In addition, by varying the gate voltage (control voltage) applied to the first electrode 10, the channel 22 resistance and the capacitance of the distributed constant type capacitor formed between the channel 22 and second electrode 26 can be variably controlled, thereby enabling the overall frequency response of the LC element 500 to be adjusted or changed.

Sixth Embodiment

Following is a description of an LC element 600 in accordance with a sixth embodiment of this invention with reference to the attached drawings.

An LC element in accordance with the sixth embodiment differs from the fifth embodiment mainly by using non-spiral shapes for the first electrode 10 and second electrode 26. Naturally, the channel 22 formed along the first electrode 10 is also non-spiral shape. In the figures, the same designations are used for items that correspond to those of the fifth embodiment.

The foregoing descriptions of LC elements 100, 200, 300 and 400 of the respective first–fourth embodiments referred to LC elements functioning as three-terminal normal mode type elements. The LC element 600 of the sixth embodiment is comprised so as to function as a four-terminal common mode type element.

Figure 33:
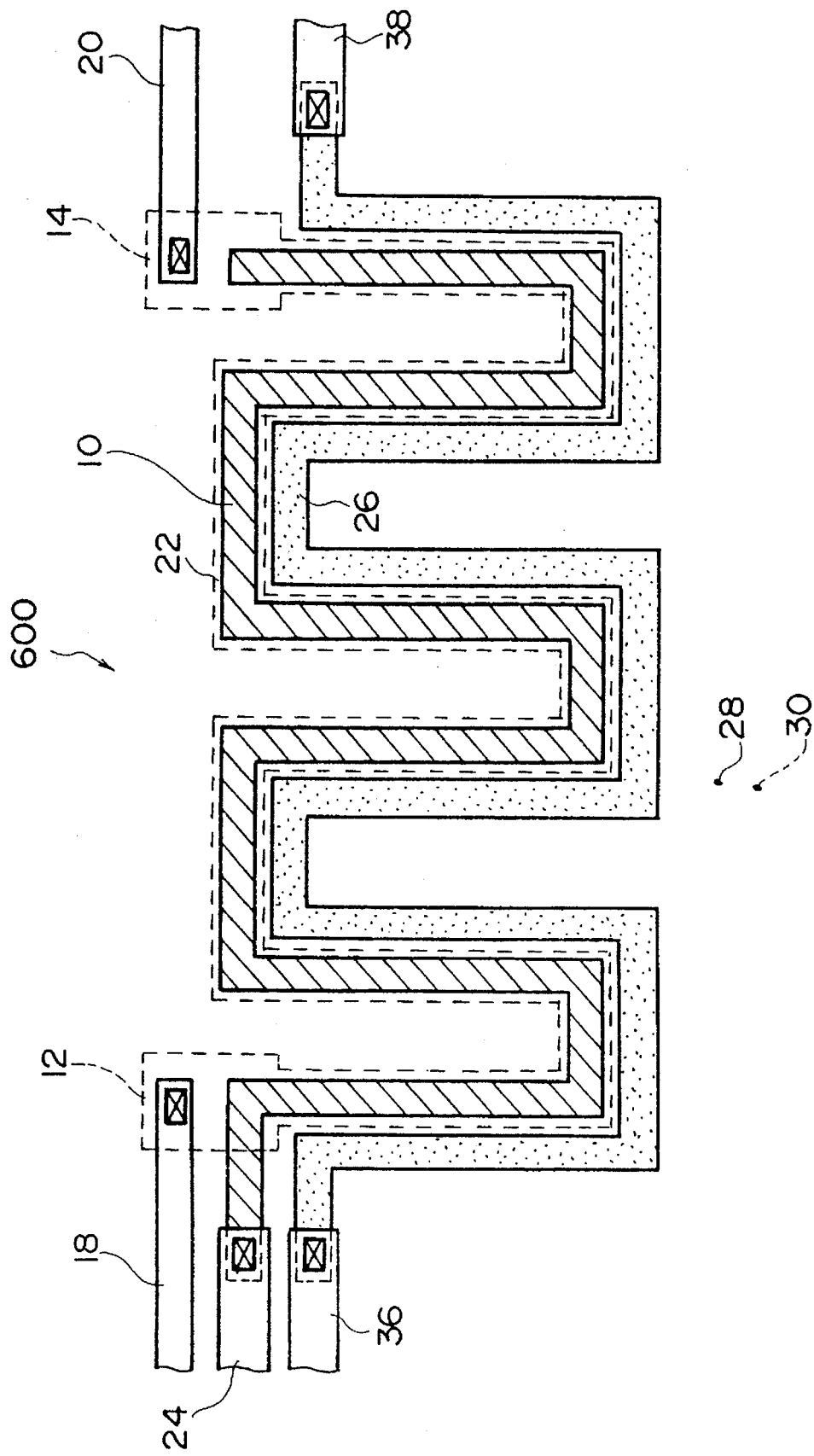
FIG. 33 is a plane view of an LC element in accordance with a sixth embodiment of this invention.

FIG. 33 is a plan view of the LC element 600 according to the sixth embodiment. As indicated in the figure, the LC element 600 differs from the LC element 200 indicated in FIG. 14 in that input/output electrodes 36 and 38 are provided at the respective ends of the second electrode 26.

Except for the inductance and capacitance values, an equivalent circuit of the LC element 600 is the same as that of the fifth embodiment shown in FIG. 31. As indicated in the figure, the channel 22 formed via the source 12 and drain 14 between the two input/output electrodes 18 and 20 functions as an inductor having inductance L1; and the second electrode 26 formed between the two input/output electrodes 36 and 38 functions as an inductor having inductance L2. Both the channel 22 and second electrode 26 are respectively used as signal transmission lines, while between these, a distributed constant type capacitor having capacitance C is formed in the same manner as the LC element 100 of the first embodiment.

In this manner, in the case of the LC element 600, not only the channel 22 formed in correspondence to the first electrode 10, but by also providing input/output electrodes 36 and 38 at the respective ends of the second electrode 26, the functions of a four-terminal common mode type element having excellent attenuation characteristics can be comprised. Also, by varying the gate voltage applied to the control electrode 24, the resistance contained in the above mentioned inductor having inductance L1 and the distributed constant type capacitance C can be changed, thereby enabling variable control of the LC element 600 overall attenuation characteristics.

Figure 34:
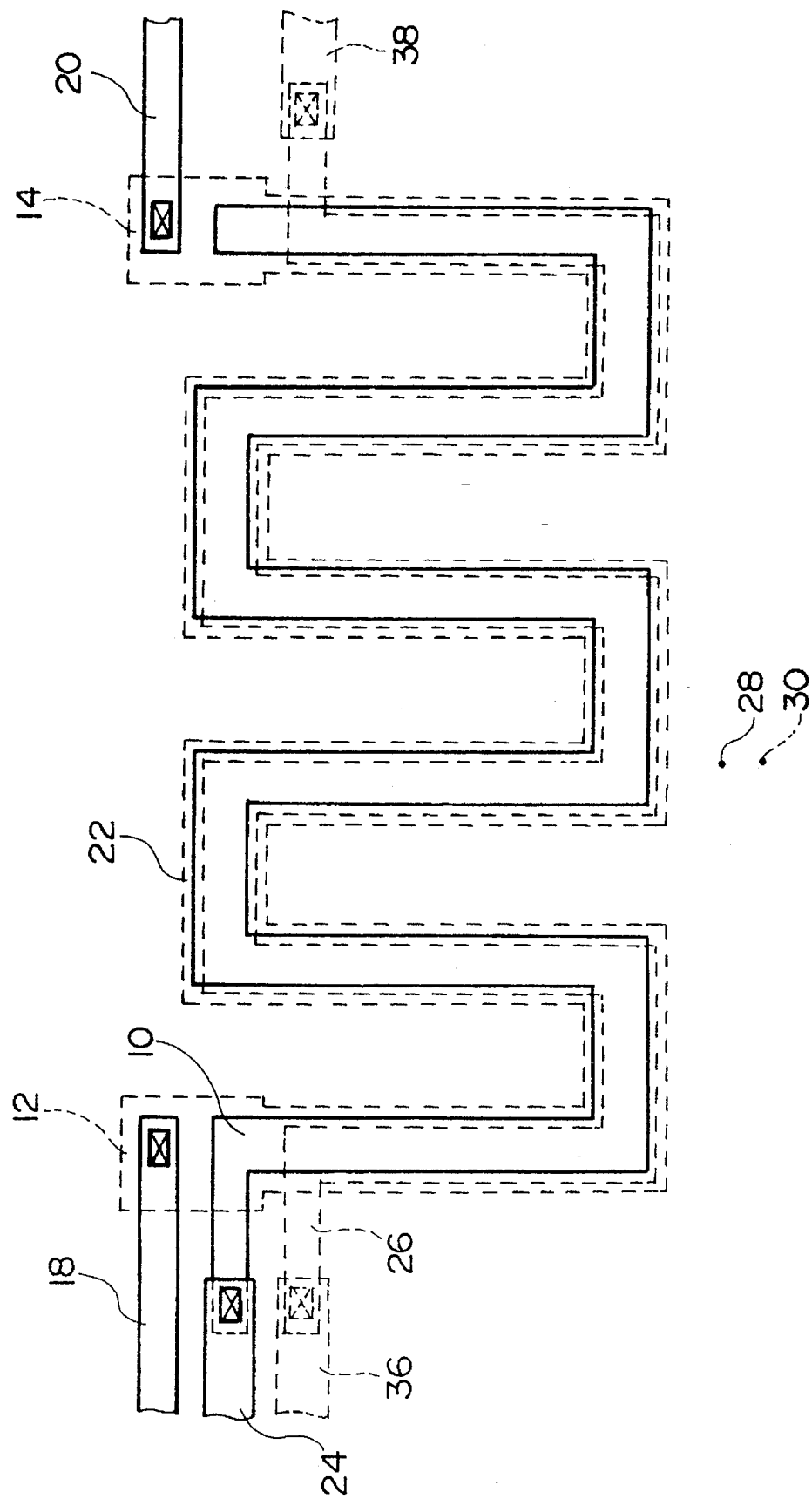
FIG. 34 indicates an example of a variation of an LC element in accordance with the sixth embodiment.

FIG. 34 indicates an example of a variation wherein the second electrode 26 is disposed essentially in opposition to the first electrode 10 (i.e., channel 22) on the opposite face of the p-Si substrate 30. As indicated in the figure, even when the meander shaped channel 22 and second electrode 26 are arranged essentially in opposition, a distributed constant type capacitor is formed between these in the same manner as the LC element 600 indicated in FIG. 33, and a four-terminal common mode type element can be comprised having such advantages as excellent frequency response and ease of manufacture.

The LC element 600 also features the same advantages as the LC elements of the above described embodiments such as ability to be manufactured by utilizing ordinary semiconductor manufacturing technology, easy manufacture and suitability for down-sizing and other requirements. Also, when the LC element is manufactured as a portion of a semiconductor substrate, wiring with other components can be performed simultaneously, in which case assembly work in subsequent processing is unnecessary. In addition, by varying the gate voltage (control voltage) applied to the first electrode 10, the channel 22 resistance and the capacitance of the distributed constant type capacitor formed between the channel 22 and second electrode 26 can be variably controlled, thereby enabling the overall frequency response of the LC element 600 to be adjusted or changed.

Seventh Embodiment

Following is a description of an LC element in accordance with a seventh embodiment of this invention with reference to the attached drawings.

In the respective LC elements of the above described embodiments, the second electrode 26 comprised a single conductor. In the case of the LC element 700 of the seventh embodiment, the second electrode 26 comprises a plurality (for example, two) of divided electrode segments 26-1 and 26-2.

Figure 35:
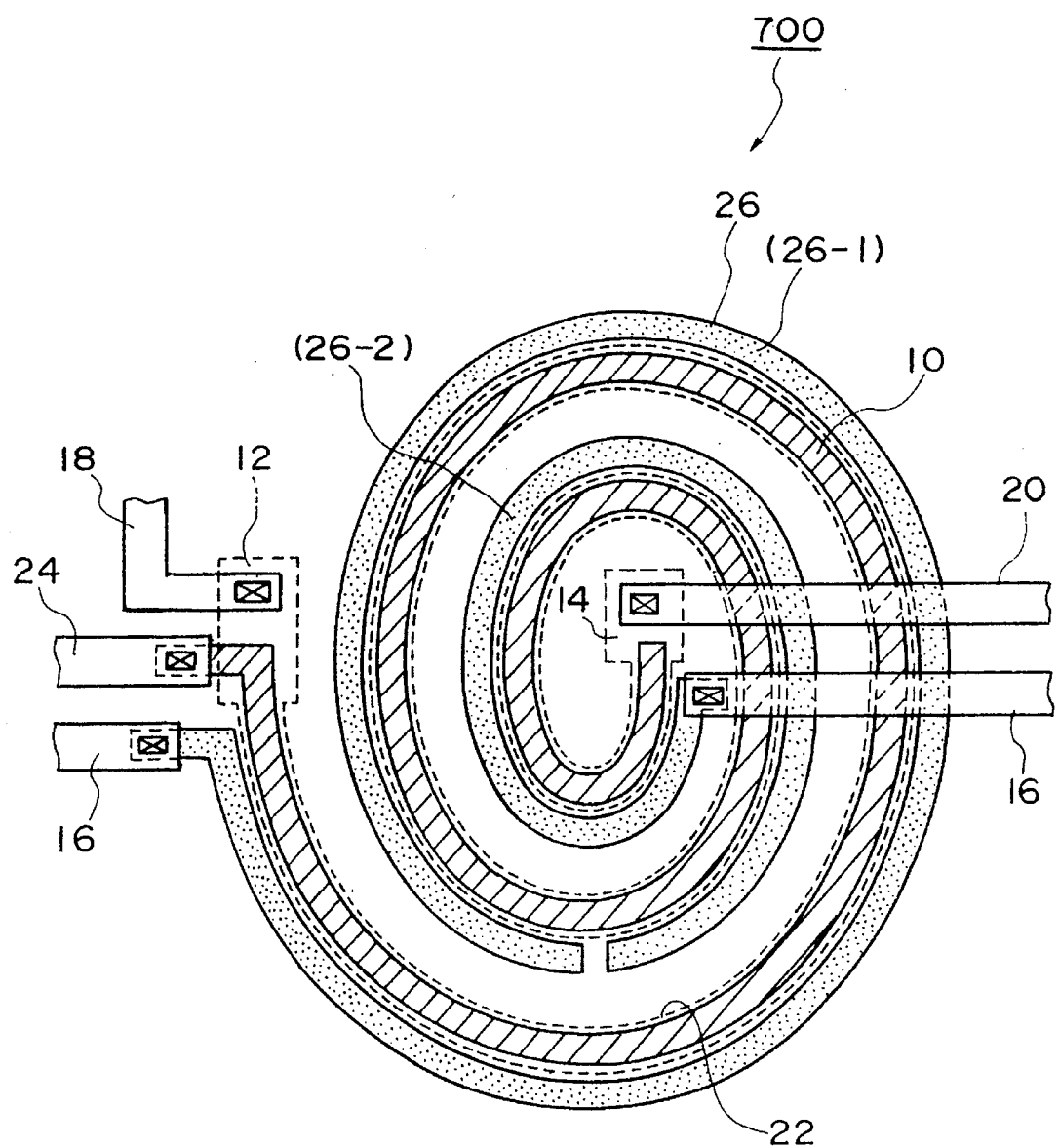
FIG. 35 is a plan view of an LC element in accordance with a seventh embodiment of this invention.

FIG. 35 is a plan view of the LC element 700. As indicated in the figure, the LC element 700 is constructed whereby the second electrode 26 used for the LC element 100 indicated in FIG. 1 is replaced by divided electrode segments 26-1 and 26-2. These divided electrode segments 26-1 and 26-2 having an overall spiral shape are respectively connected to ground electrodes 16. By grounding the two ground electrodes 16, the inductors respectively formed by the two divided electrode segments 26-1 and 26-2 are grounded. Alternatively, by connecting the two ground electrodes 16 to a fixed potential power supply, portions of the inductors respectively formed by the two divided electrode segments 26-1 and 26-2 are fixed to this potential.

Figure 36:
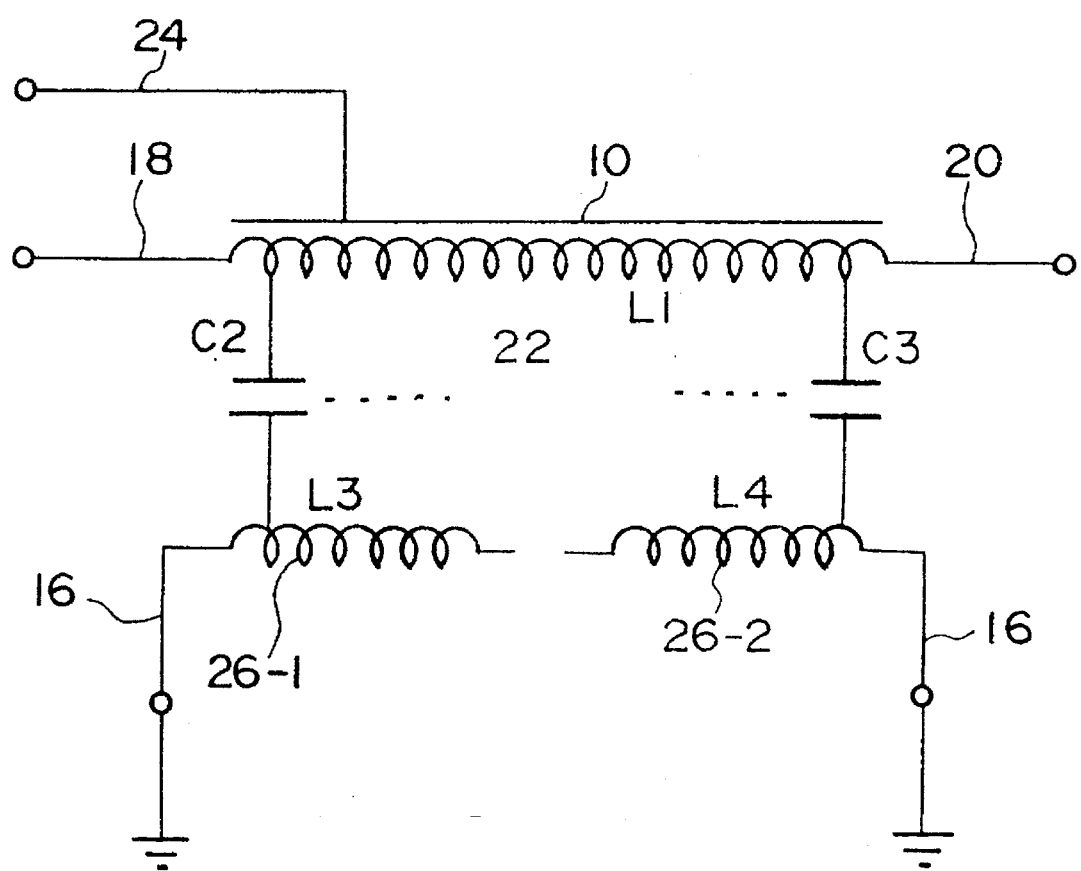
FIG. 36 is a schematic diagram indicating an equivalent circuit of the element in accordance with the seventh embodiment.

FIG. 36 shows an equivalent circuit of the LC element 700. As indicated in the figure, the channel 22 formed in correspondence to the first electrode 10 functions as an inductor having an overall inductance L1, while the divided electrode segments 26-1 and 26-2 respectively function as inductors having inductances L3 and L4. In addition, the channel 22 and respective divided electrode segments 26-1 and 26-2 function as distributed constant type capacitors having capacitances C2 and C3.

The self-inductances of the divided electrode segments 26-1 and 26-2 are small and their influence on the overall characteristics of the LC element 700 is likewise small. Consequently, the overall characteristics of the LC element 700 are largely determined by the channel 22 formed in correspondence to the first electrode 10 having inductance L1 and the distributed constant type capacitances C2 and C3.

The FIG. 35 plan view indicates the case where the channel 22 formed in correspondence to the first electrode 10 is used as the signal transmission line and the second electrode 26 is divided into two segments. However, the opposite construction can also be used wherein the second electrode 26 is used as the signal transmission line and the first electrode 10 is divided into a plurality. In this case, since the channel 22 is also formed in a plurality in respective correspondence to the plurality of divided first electrodes 10, a source 12 or drain 14 can be provided near one end of each channel and ground electrodes 16 connected to these.

Figure 37:
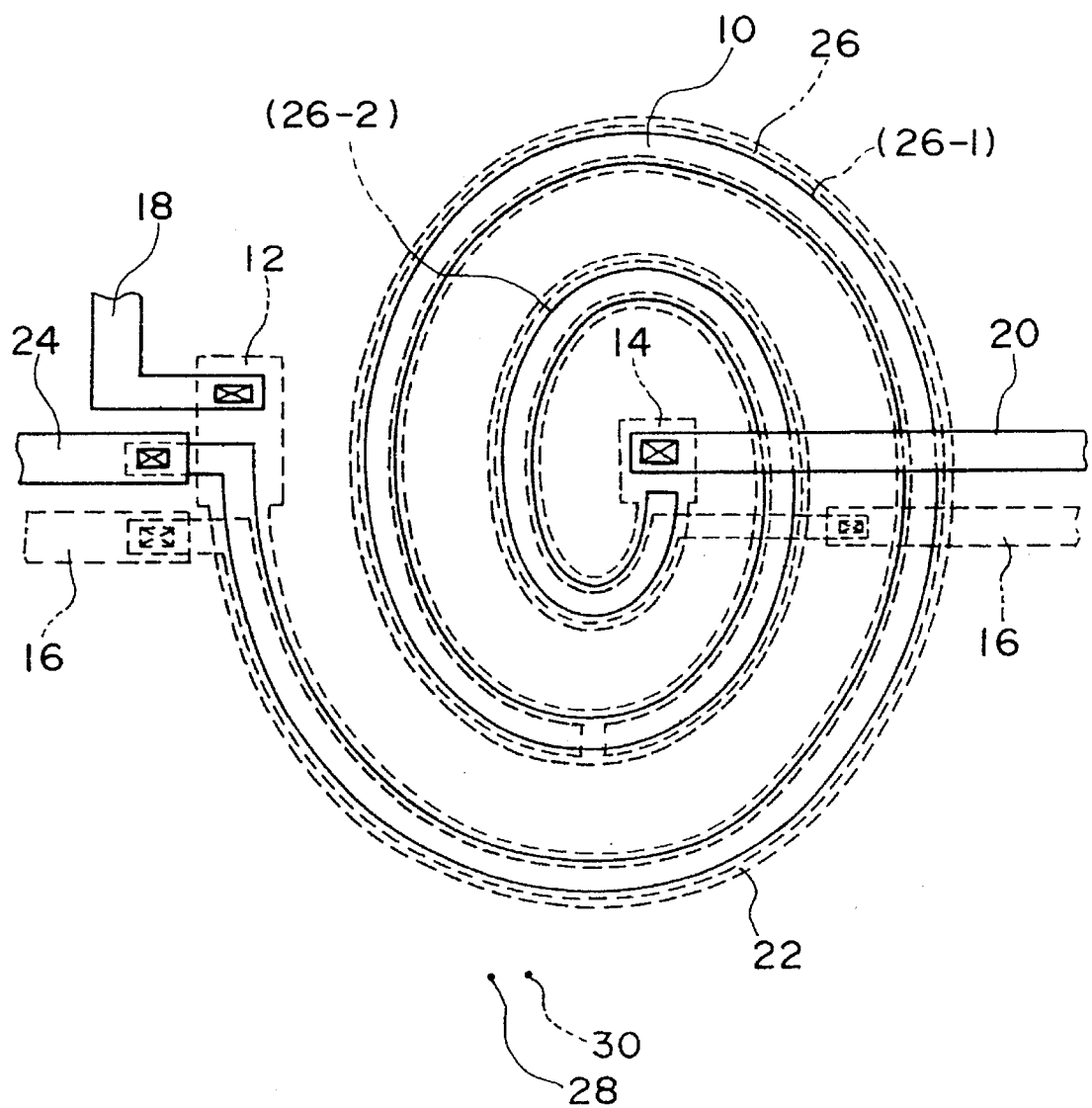
FIG. 37 indicates an example of a variation of an LC element in accordance with the seventh embodiment.

FIG. 37 shows an example of a variation wherein the two divided electrode segments 26-1 and 26-2 are disposed essentially in opposition to the first electrode 10 on the opposite side of the p-Si substrate 30. As indicated in the figure, even when the spiral shaped channel 22 and the two divided electrode segments 26-1 and 26-2 are arranged essentially in opposition, the channel 22 and divided electrode segments 26-1 and 26-2 respectively function as inductors in the same manner as the LC element 700 indicated in FIG. 35, while a distributed constant type capacitor is formed between these, thereby providing such advantages as excellent frequency response and easy manufacture.

The LC element 700 also features the same advantages as the LC elements of the above described embodiments such as ability to be manufactured by utilizing ordinary semiconductor manufacturing technology, easy manufacture and suitability for down-sizing and other requirements. Also, when the LC element is manufactured as a portion of a semiconductor substrate, wiring with other components can be performed simultaneously, in which case assembly work in subsequent processing is unnecessary. In addition, by varying the gate voltage (control voltage) applied to the first electrode 10, the channel 22 resistance and the capacitance of the distributed constant type capacitor formed between the channel 22 and divided electrode segments 26-1 and 26-2 can be variably controlled, thereby enabling the overall frequency response of the LC element 700 to be adjusted or changed.

Eighth Embodiment

Following is a description of an LC element in accordance with a eighth embodiment of this invention with reference to the attached drawings.

In the respective LC elements of the above described first–sixth embodiments, the second electrode 26 comprised a single conductor. In the case of the LC element 800 of the eighth embodiment, the second electrode 26 comprises a plurality (for example, two) of divided electrode segments 26-1 and 26-2.

Figure 38:
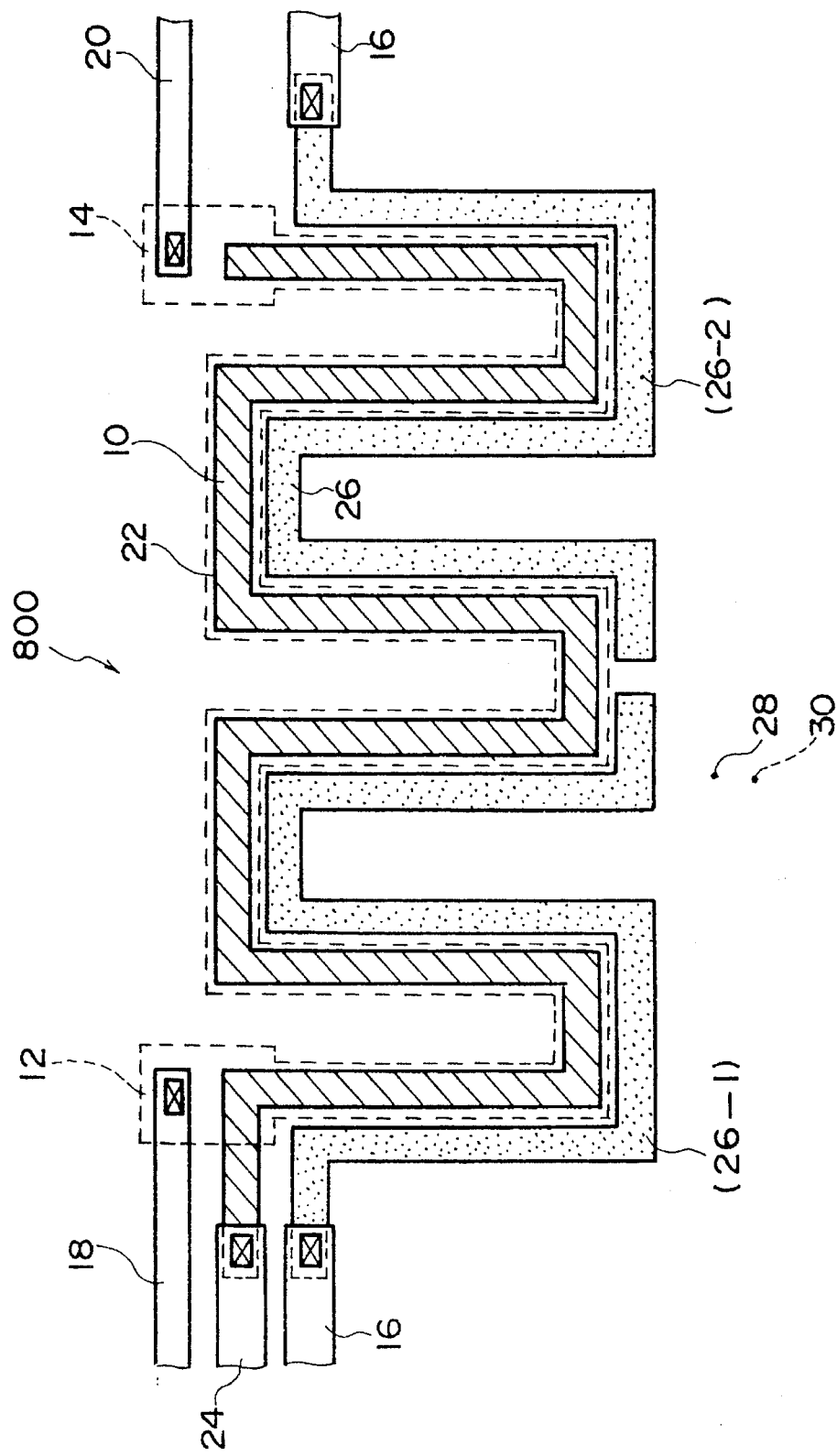
FIG. 38 is a plan view of an LC element in accordance with an eighth embodiment of this invention.

FIG. 38 is a plan view of the LC element 800. As indicated in the figure, the LC element 800 is constructed whereby the second electrode 26 used for the LC element 200 indicated in FIG. 14 is replaced by divided electrode segments 26-1 and 26-2. These divided electrode segments 26-1 and 26-2 having an overall meander shape are respectively connected to ground electrodes 16. By grounding the two ground electrodes 16, the inductors respectively formed by the two divided electrode segments 26-1 and 26-2 are grounded. Alternatively, by connecting the two ground electrodes 16 to a fixed potential power supply, portions of the inductors respectively formed by the two divided electrode segments 26-1 and 26-2 are fixed to this potential.

Except for the inductance and capacitance values, the LC element 800 equivalent circuit is the same as the seventh embodiment shown in FIG. 36. As indicated in the figure, the channel 22 formed in correspondence to the first electrode 10 functions as an inductor having an overall inductance L1, while the divided electrode segments 26-1 and 26-2 respectively function as inductors having inductances L3 and L4. In addition, the channel 22 and respective divided electrode segments 26-1 and 26-2 function as distributed constant type capacitors having capacitances C2 and C3.

The self-inductances of the divided electrode segments 26-1 and 26-2 are small and their influence on the overall characteristics of the LC element 800 is likewise small. Consequently, the overall characteristics of the LC element 800 are largely determined by the channel 22 formed in correspondence to the first electrode 10 having inductance L1 and the distributed constant type capacitances C2 and C3.

The FIG. 38 plan view indicates the case where the channel 22 formed in correspondence to the first electrode 10 is used as the signal transmission line and the second electrode 26 is divided into two segments. However, the opposite construction can also be used wherein the second electrode 26 is used as the signal transmission line and the first electrode 10 is divided into a plurality. In this case, since the channel 22 is also formed in a plurality in respective correspondence to the plurality of divided first electrodes 10, a source 12 0F drain 14 can be provided near one end of each channel and ground electrodes 16 connected to these.

Figure 39:
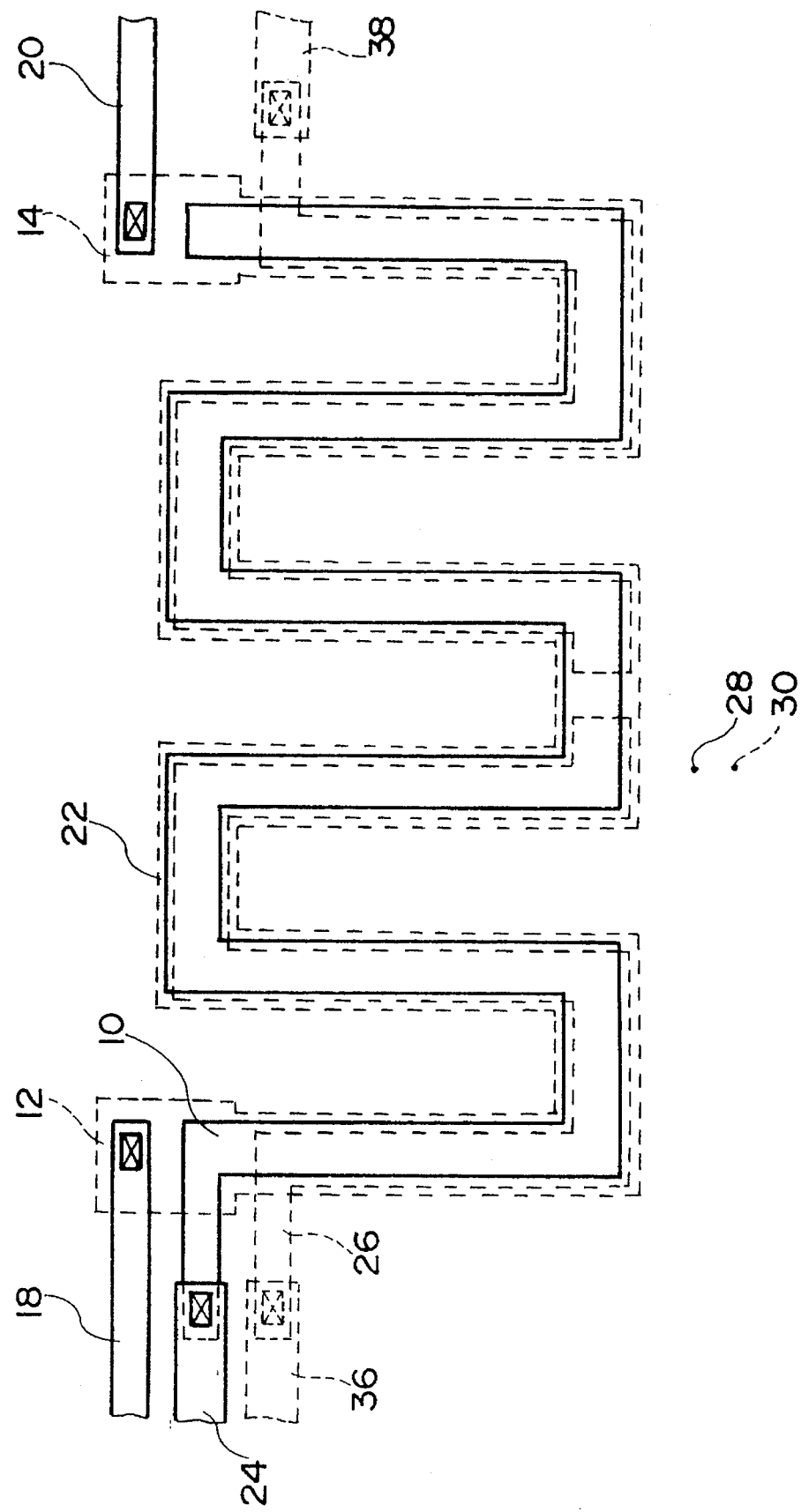
FIG. 39 indicates an example of a variation of an LC element in accordance with the eighth embodiment.

FIG. 39 shows an example of a variation wherein the two divided electrode segments 26-1 and 26-2 are disposed essentially in opposition to the first electrode 10 on the opposite side of the p-Si substrate 30. As indicated in the figure, even when the meander shaped channel 22 and the two divided electrode segments 26-1 and 26-2 are arranged essentially in opposition, the channel 22 and divided electrode segments 26-1 and 26-2 respectively function as inductors in the same manner as the LC element 800 indicated in FIG. 38, while a distributed constant type capacitor is formed between these, thereby providing such advantages as excellent frequency response and easy manufacture.

The LC element 800 also features the same advantages as the LC elements of the above described embodiments such as ability to be manufactured by utilizing ordinary semiconductor manufacturing technology, ease of manufacture and suitability for down-sizing and other requirements. also, when the LC element is manufactured as a portion of a semiconductor substrate, wiring with other components can be performed simultaneously, in which case assembly work in subsequent processing is unnecessary. In addition, by varying the gate voltage (control voltage) applied to the first electrode 10, the channel 22 resistance and the capacitance of the distributed constant type capacitor formed between the channel 22 and divided electrode segments 26-1 and 26-2 can be variably controlled, thereby enabling the overall frequency response of the LC element 800 to be adjusted or changed.

Ninth Embodiment

Following is a description of LC elements in accordance with a ninth embodiment of this invention with reference to the attached drawings.

In general, a function as an inductor having a predetermined inductance is obtained by forming a conductor into a spiral shape. As mentioned above, channel 22 and second electrode 26 of meander shape also function as inductors having predetermined inductances. However, when the input signal is limited to the high frequency band, other shapes than spiral or meander shapes, and in extreme cases, even straight line shapes, function as inductors having inductance components. In view of these factors, the LC elements according to the present embodiment comprise a channel 22 formed in correspondence to the first electrode 10 and a second electrode 26 formed in shapes other than spiral.

FIGS. 40A, 40B, 41A and 41B are plan views of LC elements wherein the channel 22 formed in correspondence to the first electrode 10 and the second electrode 26 respectively comprise straight line shapes.

FIG. 40A corresponds to FIG. 1 and indicates a three-terminal type LC element wherein the channel 22 and second electrode 26 are formed essentially the same length and essentially in parallel. FIG. 40B corresponds to FIG. 21 and indicates an LC element wherein the second electrode 26 is provided in correspondence with a portion of the channel 22 formed in correspondence to the first electrode 10.

FIG. 41A corresponds to FIG. 30 and indicates a four-terminal common mode type element wherein input/output electrodes 36 and 38 are provided at the respective ends of the second electrode 26.

FIG. 41B corresponds to FIG. 35 and indicates an LC element wherein the second electrode 26 is divided into two divided electrode segments 26-1 and 26-2.

Although FIGS. 40A, 40B, 41A and 41B indicate LC elements wherein the first electrode 10 and second electrode 26 are formed essentially on the same plane, as indicates in FIGS. 11, 12 and others, the first electrode 10 and second electrode 26 can also be arranged in essentially opposing manner on opposite sides of the p-Si substrate 30.

Figure 42:
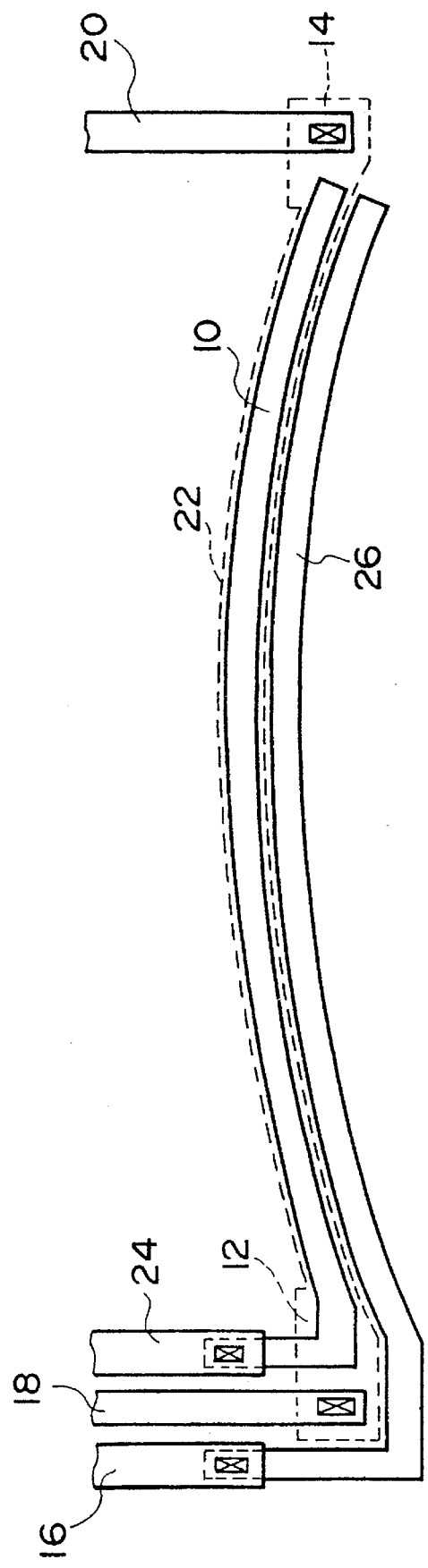
FIG. 42 indicates an example of a variation of an LC element in accordance with the ninth embodiment.

FIG. 42 is a plan view of an LC element wherein the second electrode 26 and the channel 22 formed in correspondence to the first electrode 10 comprise curved line shapes having large radius of curvature. Curved line shapes shown in the figure can be used for the first electrode 10 and second electrode 26 in such situations as when other components must be disposed at positions on a straight line joining the two input/output electrodes 18 and 20.

Figure 43:
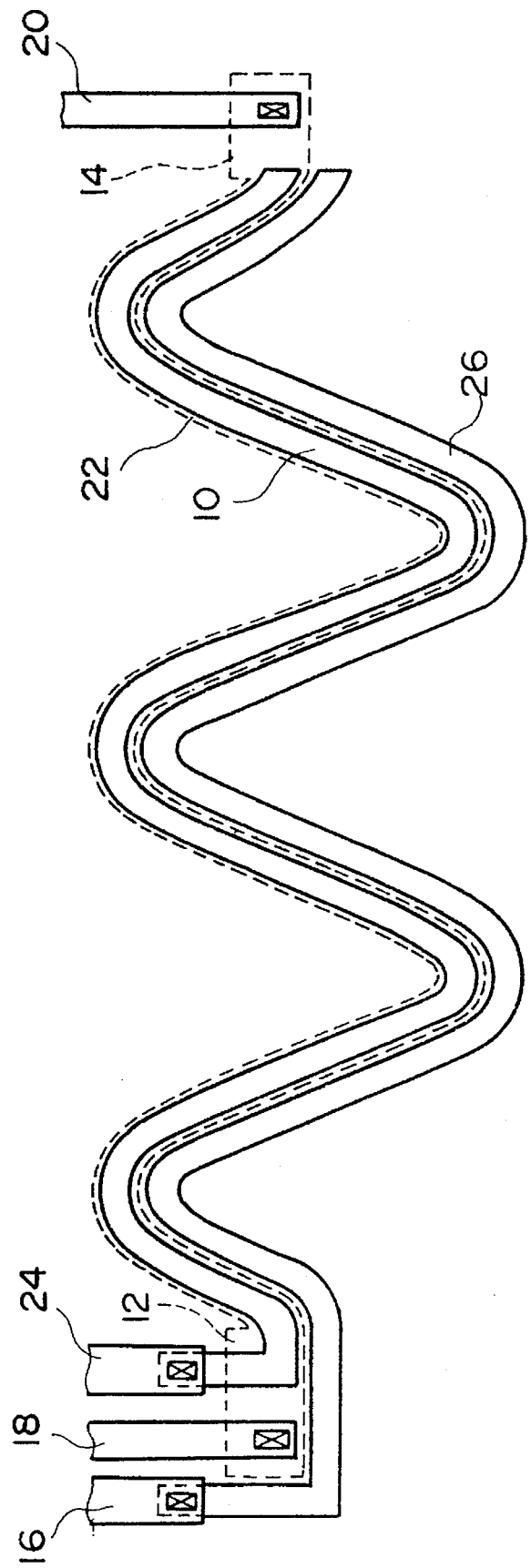
FIG. 43 indicates an example of a variation of an LC element in accordance with the ninth embodiment.

FIG. 43 is a plan view of an LC element wherein the channel 22 formed in correspondence to the first electrode 10 and second electrode 26 comprise wave shapes. Although not to the degree of the spiral shapes indicated in FIGS. 1 and others, this LC element possesses a larger inductance compared to straight or large curved line shapes for the channel 22 and second electrode 26.

Figure 44:
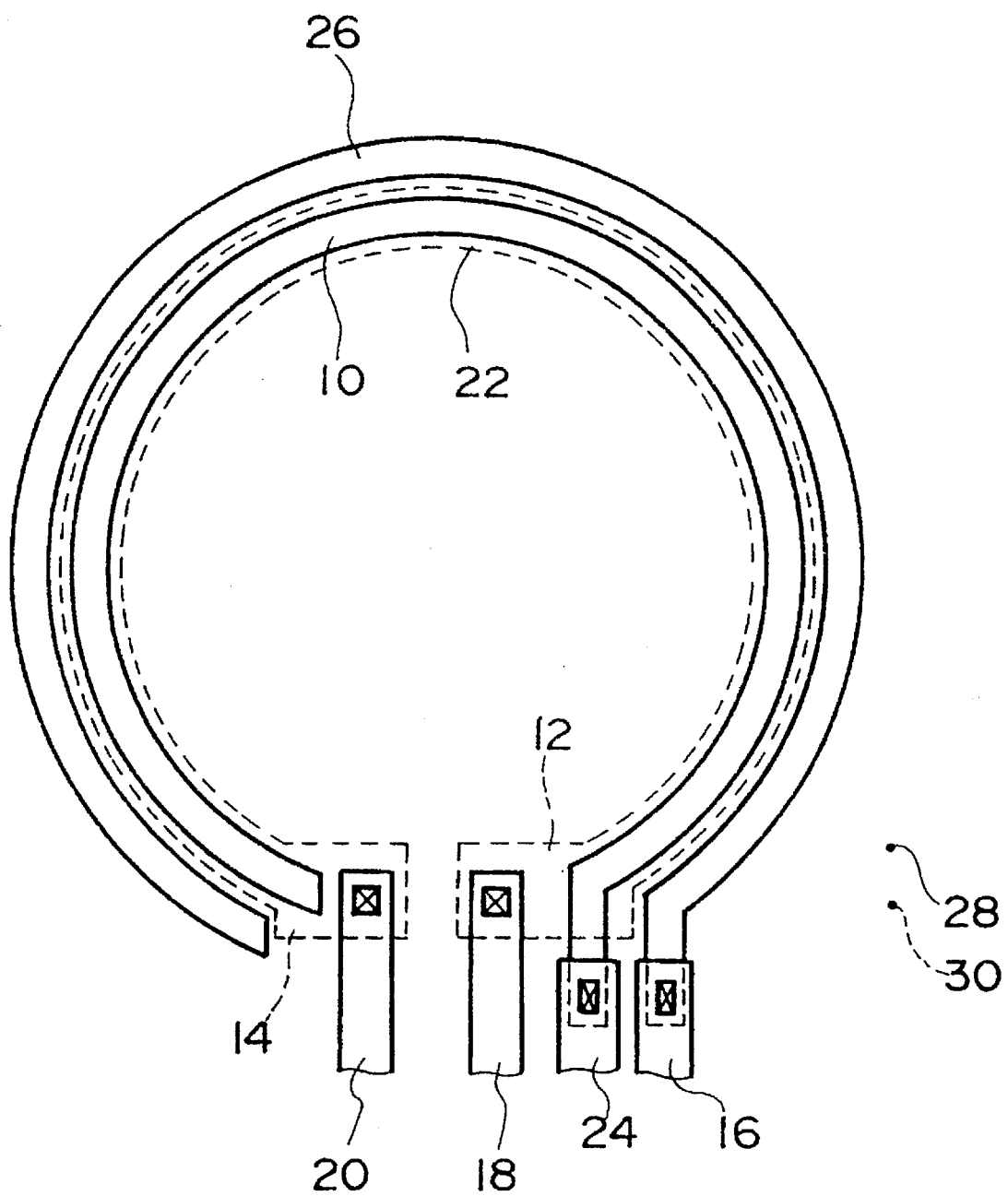
FIG. 44 indicates an example of a variation of an LC element in accordance with the ninth embodiment.

FIG. 44 is a plan view of an LC element wherein the second electrode 26 and the channel 22 formed in correspondence to the first electrode 10 are formed in incomplete circular shapes. As indicated in the figure, by forming the channel 22 and second electrode 26 in incomplete circular shapes, an LC element having a small inductance can be comprised. Also, by folding back either one or both ends of the first electrode 10 (channel 22) and the second electrode 26, the generated magnetic flux can be partially cancelled to reduce the inductance. Consequently, the overall inductance, i.e., frequency response of the LC element can be adjusted.

In order to simplify the description, only the examples corresponding to the LC element shown in FIG. 40A is indicated in FIGS. 42–44. However, the same concepts can also be applied to the LC element types indicated in FIGS. 40B, 41A and 41B, as well as to types wherein the first electrode 10 and second electrode 26 are essentially arranged in opposition on opposite sides of the p-Si substrate 30.

In this manner, the LC elements indicated in FIGS. 40A–44 comprise neither spiral nor meander shapes for the first electrode 10, channel 22 formed in correspondence thereto and the second electrode 26. Consequently, in the same manner as the above described first–eighth embodiments, functions as elements having excellent attenuation characteristics can be obtained. Also, the same advantages are obtained as the LC elements of the above described embodiments such as ability to be manufactured by utilizing ordinary semiconductor manufacturing technology, easy manufacture and suitability for down-sizing and other requirements. Also, when the LC element is manufactured as a portion of a semiconductor substrate, wiring with other components can be performed simultaneously, in which case assembly work in subsequent processing is unnecessary. In addition, by varying the gate voltage applied to the first electrode 10, the channel 22 resistance and the capacitance of the formed distributed constant type capacitor can be controlled, thereby enabling the overall characteristics of the LC elements to be variably controlled.

Other Embodiments

Following is a description of other embodiments of this invention with reference to the attached drawings.

In the above described embodiments, the two input/output electrodes 18 and 20 are disposed at separated positions near the respective ends of the first electrode 10. However, the first electrode 10 shape can be modified so as to allow close positioning of the input/output electrodes 18 and 20.

Figure 45:
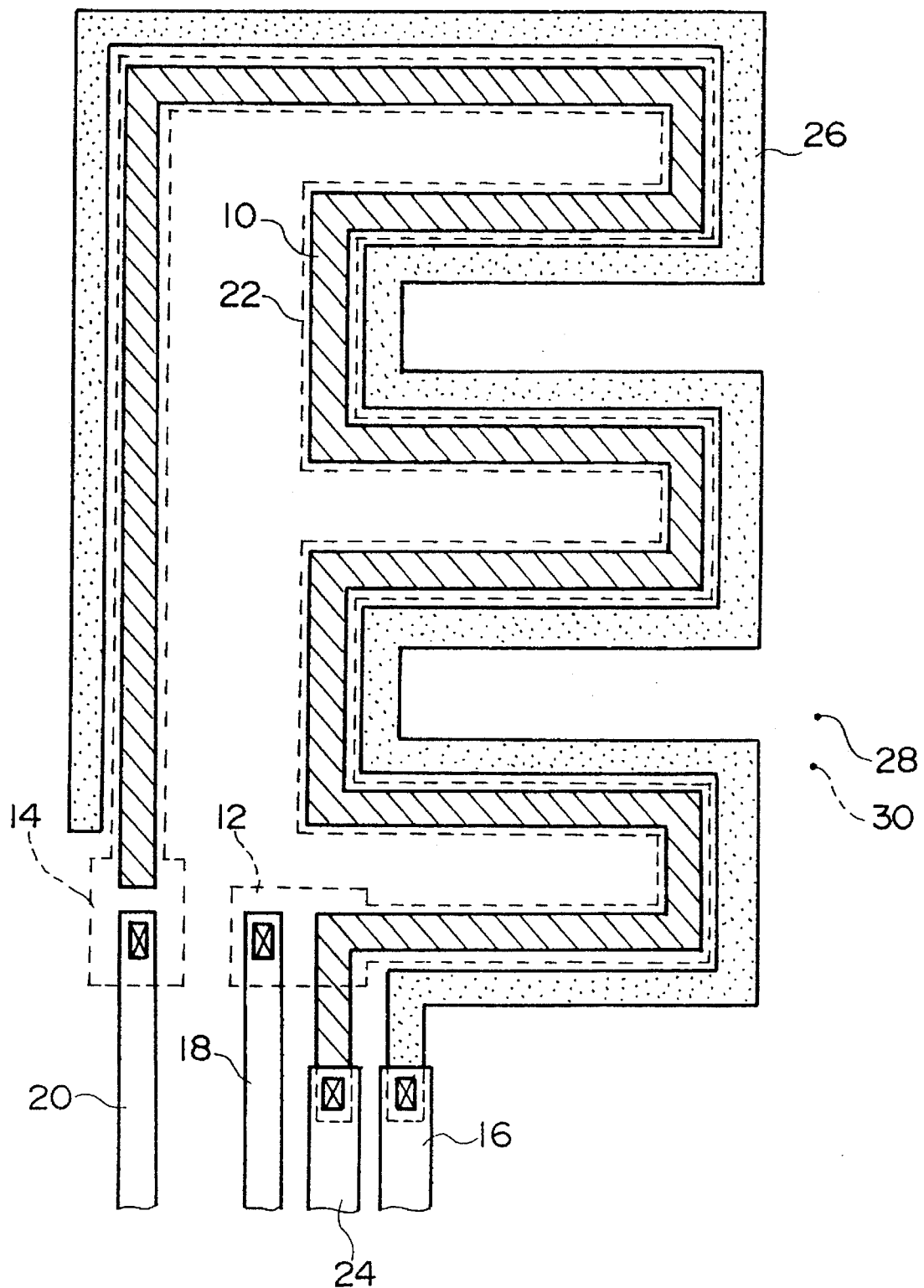
FIGS. 45 and 46 indicate examples of variations wherein the input/output electrode positions are changed.
Figure 46:
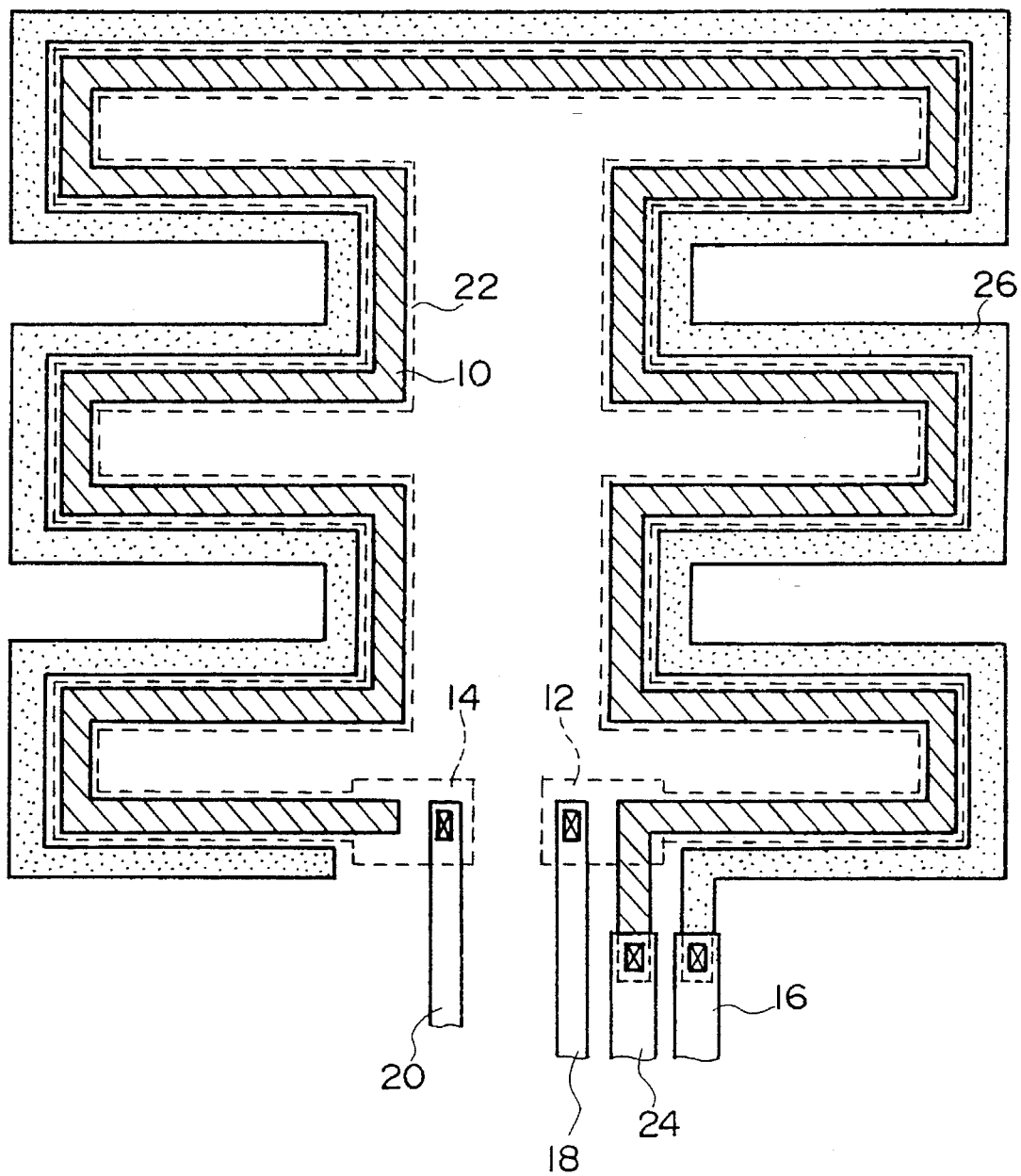

For example, in the case of meander or similar shaped electrodes, as indicated in FIG. 45, the source 12 and drain 14 are adjacently disposed, while one end each of the first and second electrodes 10 and 26 indicated in FIG. 14 is extended to the drain 14. Alternatively, as indicated in FIG. 46, the source 12 and drain 14 are adjacently disposed, and the first and second electrodes 10 and 26 indicated in FIG. 14 are folded back in a manner preserving their meander shapes.

In this manner, by modifying the shape of the first electrode 10 (or both the first and second electrodes 10 and 26), the two input/output electrodes 18 and 20 are positioned closely, and ground electrode 16, control electrode 24, and input/output electrodes 18 and 20 can all be formed at nearly the same position. Consequently, wiring can be performed easily when applying terminals and manufacturing processes can be abbreviated.

Figure 47:
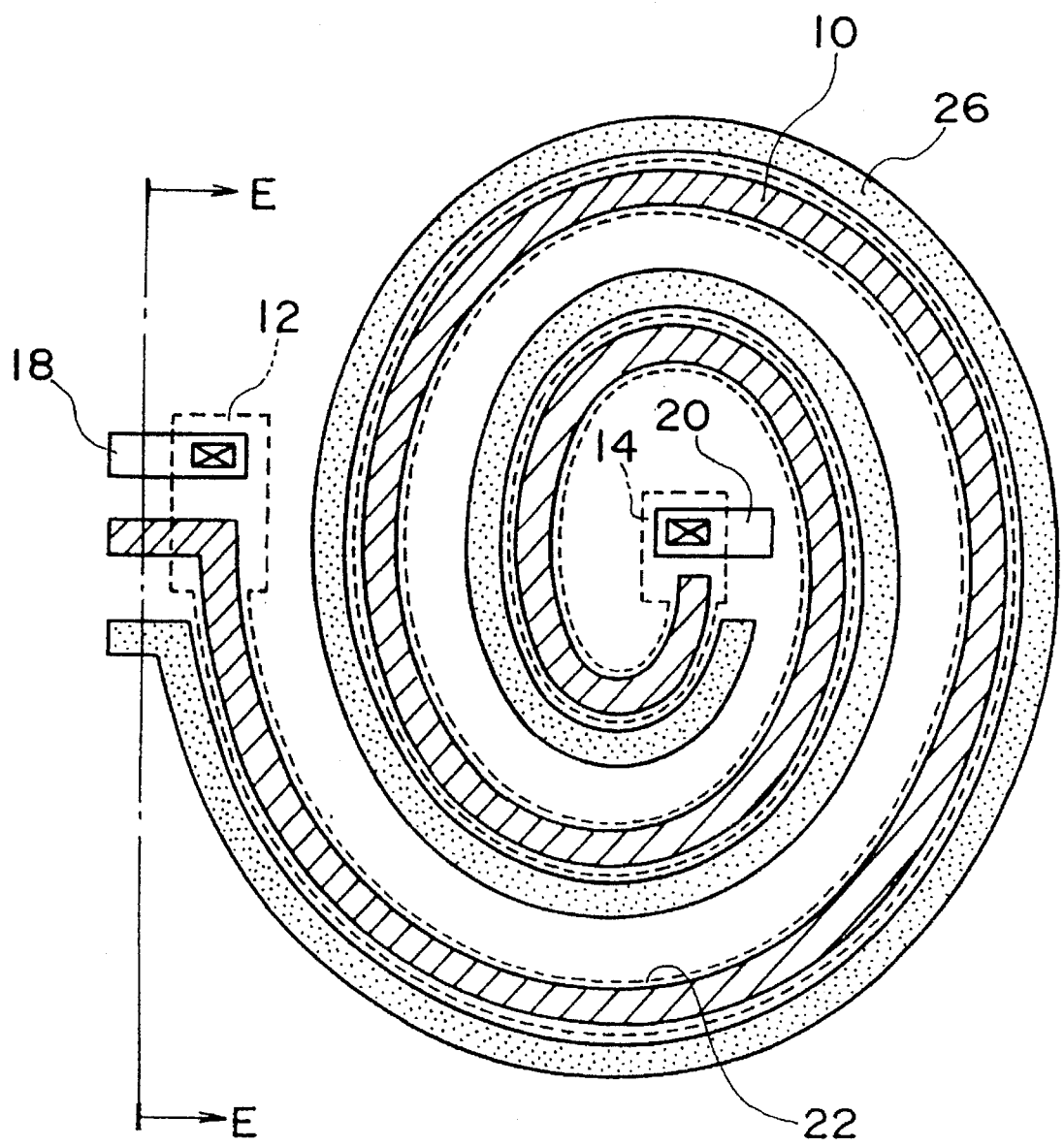
FIGS. 47 and 48 are abbreviated views of providing terminals by chemical liquid phase deposition.
Figure 48:
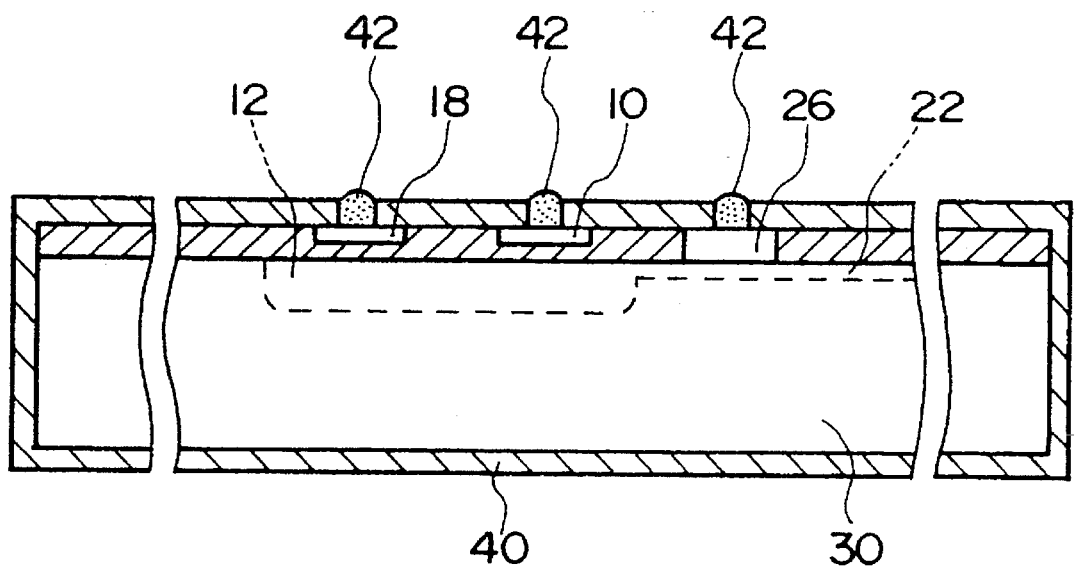

FIGS. 47 and 48 are descriptive drawings showing the provision of terminals by such methods as chemical liquid phase deposition. FIG. 47 is a plan view of an LC element corresponding to FIGS. 1 and others. As indicated in the figure, the control electrode 24 and ground electrode 16 are not provided for the first electrode 10 and second electrode 26.

After separating the individual LC elements from a semiconductor substrate that includes first and second electrodes 10 and 26 having this type of shape, a silicon oxide film 40 is formed as an insulation film on the entire surface of the separated chips (elements) by chemical liquid phase deposition. Perforations are then opened by etching to remove the silicon oxide film 40 over one end respectively of the first and second electrodes 10 and 26. The perforations are closed by applying solder 42 to the extent of protruding slightly above the surface, thereby allowing the protruding solder 42 to directly contact such structures as printed wiring board lands. Consequently, favorable conditions are provided for surface mounting. FIG. 48 is a cross-sectional view of a chip (element) that has undergone this type of process viewed along line E—E in FIG. 47.

Synthetic resin or other insulating material can be used for the element surface protective film and laser light used to perforate the protective film. As indicated in FIG. 48, by adjusting the film thickness for each electrode so that the input/output electrodes 18 and 20 and the first and second electrodes 10 and 26 etc. are the same height, since the protruding solder 42 height also becomes nearly the same, conditions are favorable for surface mounting. Also, as indicated in FIGS. 11, 12A and others, in cases where the second electrode 26 is disposed essentially in opposition to the first electrode 10, by using through-holes to have the wiring on one side and applying solder 42 so as to protrude in the same manner, wiring and other work in subsequent processing is rendered easy.

Figure 49:
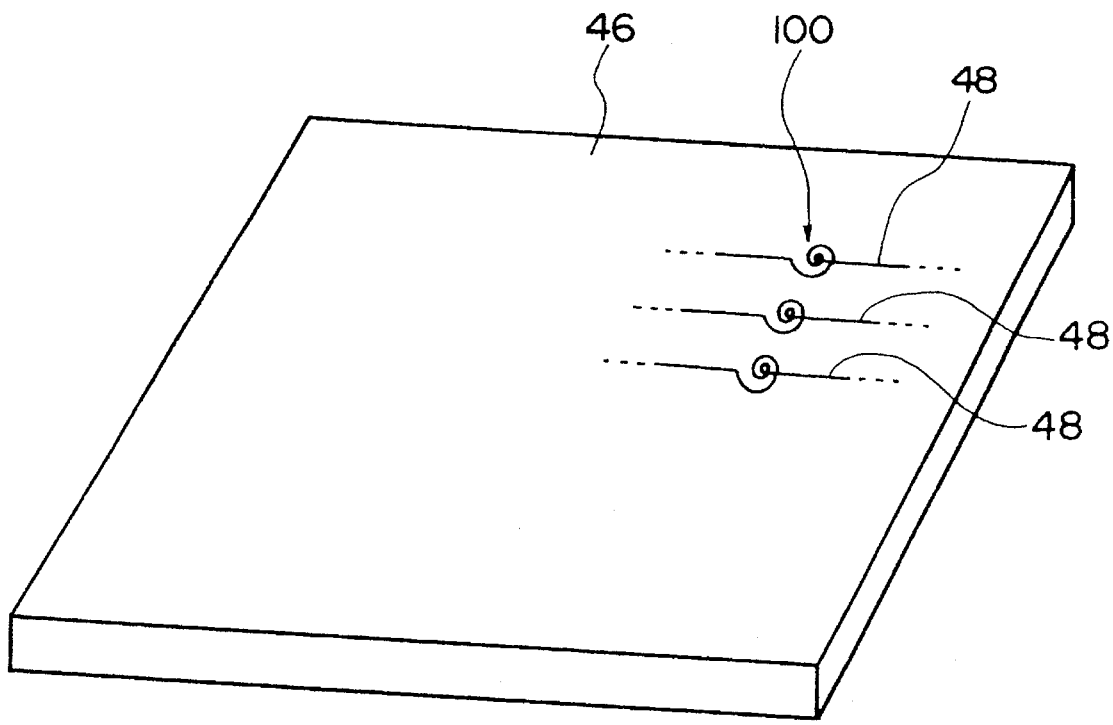
FIG. 49 is an explanatory drawing of forming LC elements of each embodiment as portions of an LSI or other device.

FIG. 49 is a descriptive drawing for describing the formation of the LC elements 100 and others of the foregoing embodiments as portions of an LSI or other device. As indicated in the figure, the LC elements 100 are inserted into the signal or power supply lines 48 on the semiconductor chip 46. In particular, since the LC elements 100 etc. of the above mentioned embodiments can be manufactured simultaneously with forming other circuits on the semiconductor chip 46, work such as wiring becomes unnecessary in subsequent processing.

In FIG. 49 and the below mentioned FIGS. 50A–50E, although the LC element 100 of the first embodiment is shown as a representative, the LC element can be replaced by one of LC elements of other embodiments, such as LC element 300.

In general, the channel 22 comprising an inductor in the e.g., LC element 100 has a high resistance. Also, since the overall length of this channel 22 is long, signal level attenuation is produced between the two input/output electrodes 18 and 20. For this reason, a more practical construction when using the LC element 100 and others as a portion of an actual circuit is to connect a high input impedance buffer to the output side.

FIGS. 50A–50E show examples of buffer connection to the output side of the LC element 100 of the first embodiment.

Figure 50A:
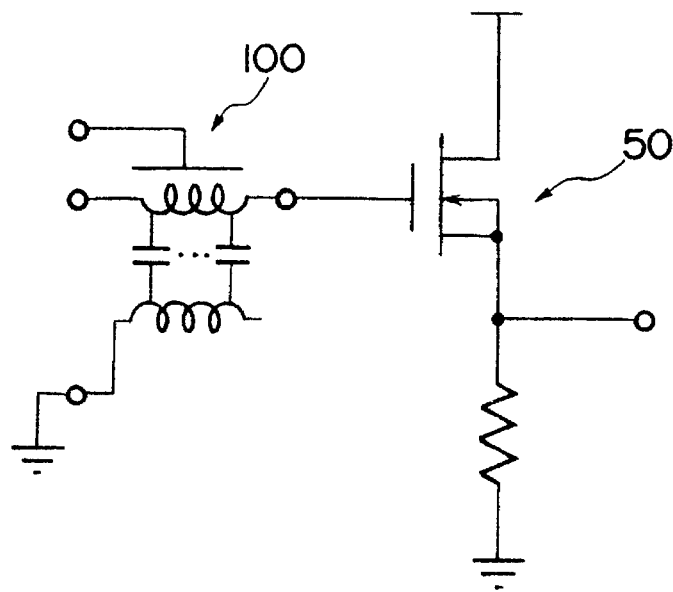
FIGS. 50A–50E are schematic diagrams showing examples of buffer circuit connection to the output side of the LC elements of each embodiment.

FIG. 50A indicates use of a source-follower circuit 50 comprising a MOSFET and a resistor as a buffer. Since the MOSFET has the same construction as any one of the LC elements of the above mentioned embodiments, an overall LC element including the source-follower circuit 50 can be easily formed in an integrated manner.

Figure 50B:
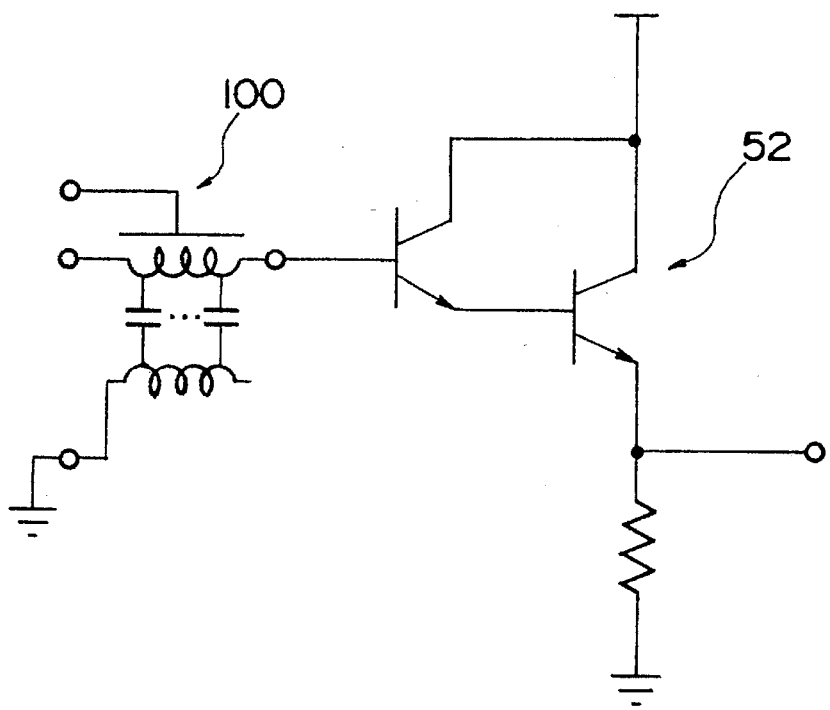

FIG. 50B indicates use of an emitter-follower circuit 52 comprising two bipolar transistors in a Darlington connection and a resistor as a buffer. Since the bipolar transistor construction differs only slightly from the construction of the LC elements of the above mentioned embodiments, the overall LC element including the emitter-follower circuit 52 can be formed in an integrated manner on the same semiconductor substrate. Also, by grounding the base of the transistor closer to the output through a resistor, the transistor operating point can be further stabilized.

Figure 50C:
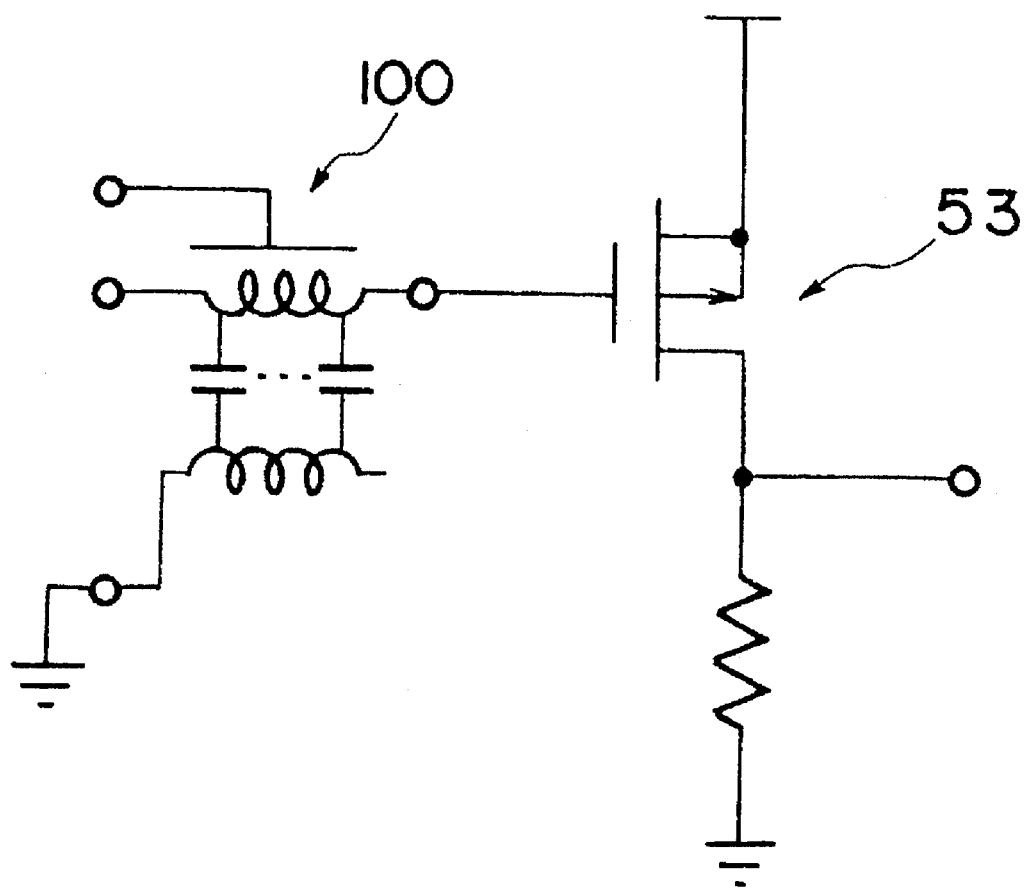

FIG. 50C shows an example of a circuit comprising a p-channel MOSFET used with reverse bias as a buffer.

Figure 50D:
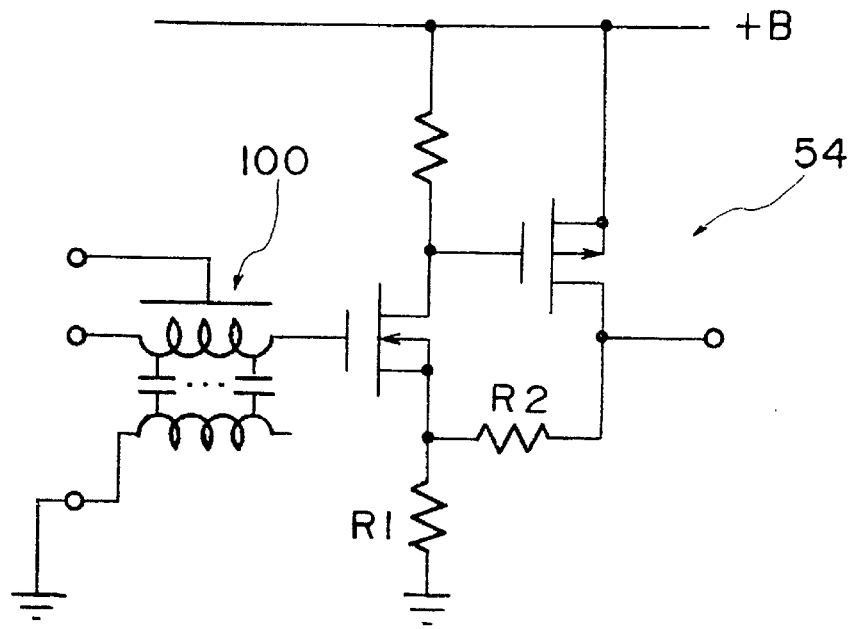

FIG. 50D shows an example of an amplifier circuit 54 comprising two MOSFETs and resistors used as a buffer. Since the MOSFET construction is the same as the construction of the LC elements of the above mentioned embodiments, the overall LC element including the amplifier circuit 54 can be formed in unitized manner on the same semiconductor substrate. The voltage amplification factor of this circuit is 1+(R2/R1) and by setting R2=0, the circuit is equivalent to a source-follower.

Figure 50E:
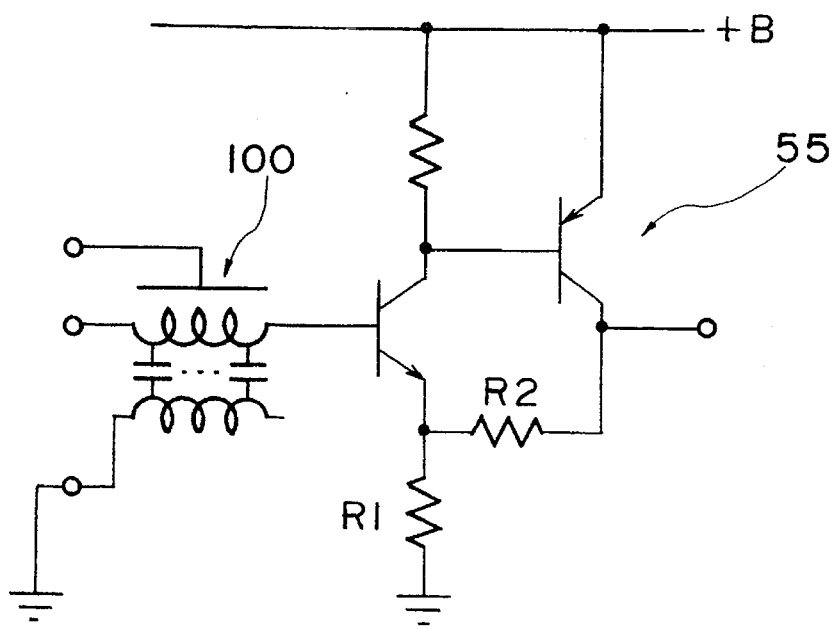

FIG. 50E shows an example of an amplifier circuit 55 comprising two bipolar transistors and resistors used as a buffer. Since the bipolar transistor construction differs only slightly from the construction of the LC elements of the above mentioned embodiments, the overall LC element including the amplifier circuit 55 can be formed in an integrated manner on the same semiconductor substrate. The voltage amplification factor of this circuit is 1+(R2/R1) and by setting R2=0, the circuit is equivalent to an emitter-follower.

In cases where the LC element 100 indicated in FIGS. 50A–50E is replaced by a common mode type LC element, for example, an LC element 500 of the fifth embodiment, since both the channel 22 and second electrode 26 are used as signal transmission lines, an above mentioned buffer circuit 50, 52, 53, 54, 55 is also connected to the second electrode 26 output side.

In this manner, by providing a buffer at the output side, the signal level attenuated by the inductor (channel 22) portion can be restored and an output signal with excellent SN ratio can be obtained.

Also, by connecting a level converter circuit to the output side of the LC element 100 etc., amplification of the signal level attenuated by the inductor portion, conversion to a predetermined level, or level correction can be easily performed. Like the above mentioned buffers, these level converter circuits can be formed in an integrated manner with the LC elements of the above described embodiments on the same substrate.

In addition, a voltage controlled oscillator (VCO) can be constructed using the LC elements 100 and others of any one of the above mentioned embodiments. By changing an externally applied gate voltage to the control electrode 24, i.e., changing the capacitance of the distributed constant type capacitor and the channel 22 resistance, the VCO oscillating frequency can be changed as desired within a certain range.

Figure 51A:
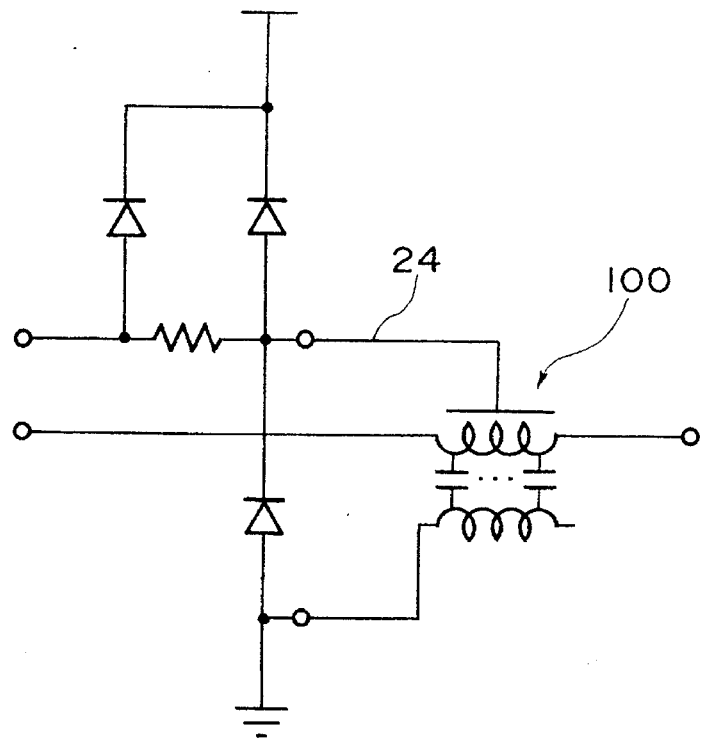
FIGS. 51A and 51B are schematic diagrams showing examples of protector circuit connection to the input side of the LC elements of each embodiment.
Figure 51B:
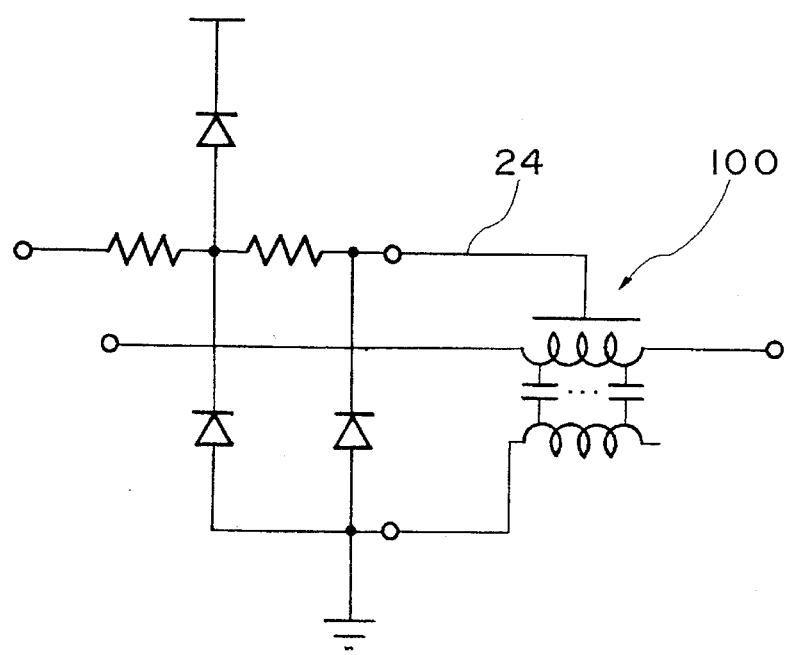

FIGS. 51A and 51B show examples of adding input protector circuits to the LC elements of the above embodiments. Because of their MOS construction, a high voltage due to static electricity applied to the control electrode 24 can destroy the insulation layer 28 between the first electrode 10 and p-Si substrate 30. Therefore, a protector circuit is required in order to prevent destruction of the insulation layer 28 by static electricity.

The protector circuits indicated in the figures both comprise a plurality of diodes and resistors. When a high voltage is applied to the control electrode 24 connected to the first electrode 10, current is bypassed to the operating power supply line or chassis ground. The 51A circuit can withstand several hundred volts, while the FIG. 51B circuit can withstand 1000–2000 volts. The appropriate protector circuit can be selected according to usage environment and other factors.

The foregoing descriptions of the embodiments do not limit this invention, and numerous variations are possible within the scope of this invention.

For example, the above descriptions referred to enhancement type LC elements wherein the channel 22 is formed when a predetermined gate voltage is applied to the control electrode 24. However, depletion type LC elements can also be formed. In other words, carriers (n type impurities) are injected beforehand into the channel 22 area indicated in FIG. 1 and others. As a result, the channel 22 can be formed in the state without an applied gate voltage, or the relationship between the applied gate voltage and the channel width etc. can be changed. Also, carriers (n type impurities) can be injected only partially along the first electrode area and the first electrode corresponding to the injected carrier can be fully or partially omitted.

Also, in the above mentioned embodiments, the second electrode 26 directly contacted the p-Si substrate 30, while the first electrode 10 was formed via the insulation layer 28. However, the opposite is also possible, namely forming the first electrode 10 in direct contact with the p-Si substrate 30 and the second electrode 26 via the insulation layer 28. It is also possible to form both the first and second electrodes 10 and 26 on the insulation layer 28 surface.

Also, in the above described embodiments wherein the first and second electrodes 10 and 26 are formed essentially in the same surface, the first electrode 10 was formed via the insulation layer 28 the first and second electrodes etc. were formed on a p-Si substrate 30 comprising a single p layer. However, by forming a spiral shaped etc. inversion layer along these electrodes, secure isolation can be provided between adjacent channel 22 sections.

Figure 52A:
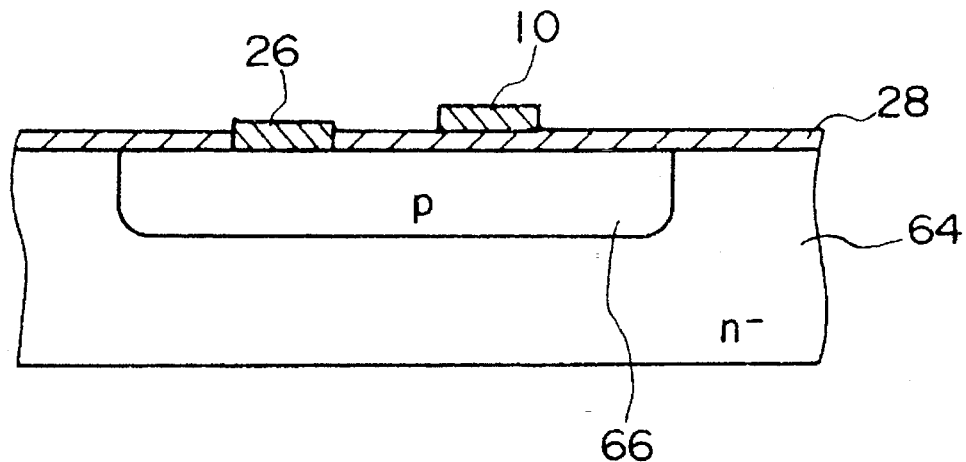
FIGS. 52A and 52B are cross-sectional views showing construction when an inversion layer is formed in the semiconductor substrate.
Figure 52B:
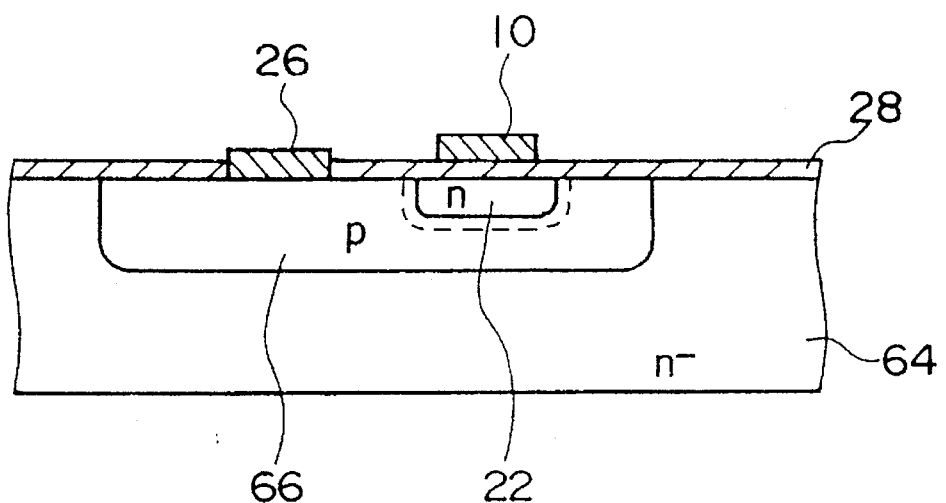

FIGS. 52A and 52B correspond to FIGS. 2A and 2B and show cross-sectional views of an essentially spiral shaped inversion layer 66 formation along the first and second electrodes 10 and 26. As indicated in FIG. 52A, the inversion layer 66 comprising a spiral shaped p region is formed in correspondence to the first and second electrodes 10 and 26 in a portion of a substrate 64 comprising an $n^-$ region. In the case of an LC element having this type of construction, when a predetermined gate voltage is applied to the control electrode 24 connected to the first electrode 10, as indicated in FIG. 52B, the channel 22 is formed near the surface in correspondence to the first electrode 10. In addition, by applying reverse bias to the substrate 64 and the spiral shaped inversion layer 66, these can be mutually separated electrically, thereby securely forming a distributed constant type capacitor between the channel 22 and second electrode 26.

Also, regarding LC elements of the above mentioned embodiments wherein the first and second electrodes 10 and 26 are disposed essentially in opposition, although the first and second electrodes 10 and 26 etc. were formed on a p-Si substrate 30 comprising a single p region, by forming an inversion layer between adjacent first electrode 10 or second electrode 26 sections, isolation can be securely obtained between adjacent channel 22 sections.

Figure 53:
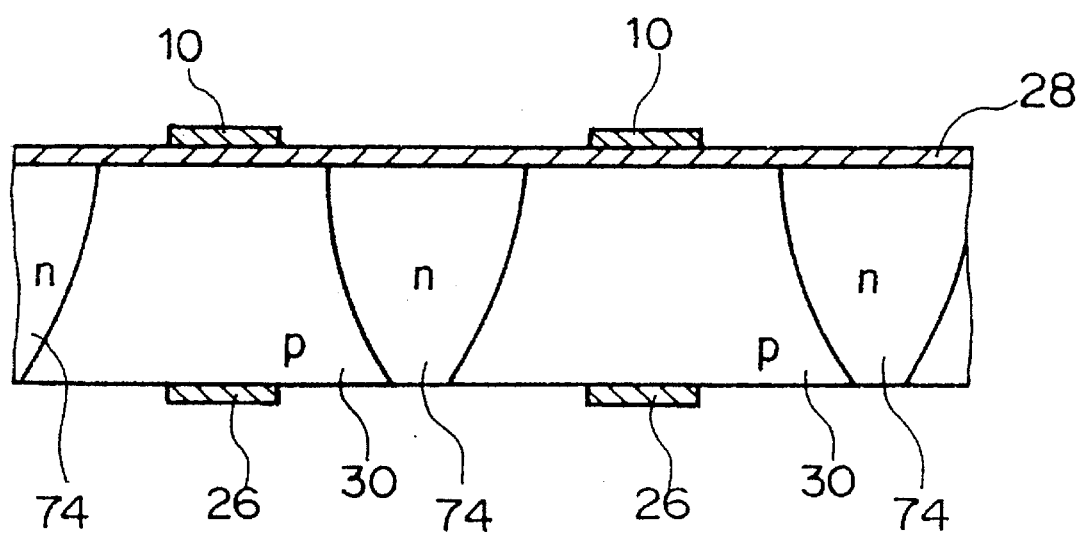
FIG. 53 is a cross-sectional view showing construction when an inversion layer is formed in the semiconductor substrate.

FIG. 53 corresponds to FIG. 12 and indicates cross-sectional construction wherein inversion layers are formed between the first electrode 10 and second electrode 26. As indicated in the figure, the inversion layers comprising n regions 74 are formed in portions of the p-Si substrate 30. In the case of an LC element having this type of construction, since n regions 74 are formed between p-Si substrate 30 sections connected to adjacent second electrode 26 sections, these are electrically separated and secure isolation can be obtained.

Also, when manufacturing an LC element wherein the first and second electrodes 10 and 26 are essentially in opposition utilizing an actually wafer shaped p-Si substrate 30, since the p-Si substrate 30 resistance is comparatively higher than a metal material, the p-Si substrate 30 thickness needs to be thinner than the wafer shape. Also, since n type wafers are generally easier to procure, construction such as indicated in FIGS. 54A and 54B can be used.

Figure 54A:
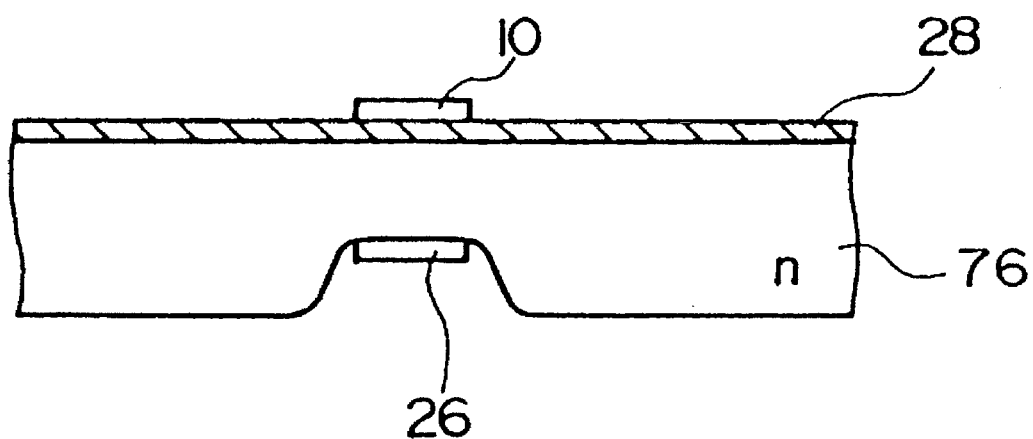
FIGS. 54A and 54B show partial cross-sectional views when etching is performed at a portion of the substrate.
Figure 54B:
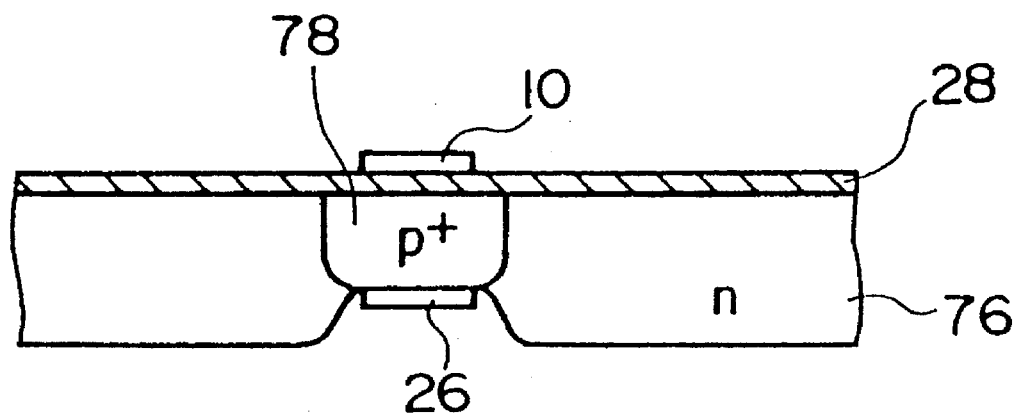

As indicated in FIG. 54A, etching is performed in e.g., a spiral shape on one surface of an n-Si substrate 76 and the first or second electrode 10 or 26 is formed in this etched portion. Also, as indicated in FIG. 54B, a p+ region 78 is formed essentially along the respective first and second electrodes 10 and 26 in a portion of the n-Si substrate 76. Etching is then performed in the portion corresponding to the second electrode 26 on the rear surface of the n-Si substrate 76. Finally, the first and second electrodes 10 and 26 are formed.

Also, in regard to the above embodiments, the ability to form the LC element 100 etc. as a portion of an LSI or other device was mentioned, but formation as a portion of an LSI or other device is not essential. After forming the LC element 100 on the semiconductor substrate, providing respective terminals for the input/output electrodes 18 and 20, ground electrode 16 and control electrode 24 or providing terminals by chemical liquid phase deposition such as indicated in FIGS. 47 and 48, forming as a discrete element is also acceptable. In this case, by simultaneously forming a plurality of LC elements on the same semiconductor substrate, then cutting the semiconductor substrate and providing terminals to the LC elements, easy mass production is enabled.

Also, in the above described embodiments, the ground electrode 16, source 12, and drain 14 were provided at the endmost portions of the first and second electrodes 10 and 26. However, it is not essential that these be provided at the absolute ends and the attachment positions can be shifted according to requirements after investigating the frequency response.

Also, in the LC elements of the above described embodiments, by changing the gate voltage applied to the control electrode 24, the channel 22 resistance and the capacitance of the distributed constant type capacitor are changed, thereby enabling variable control of the LC element overall frequency response. Consequently, by using the LC element 100 and others as a portion of a circuit, variable frequency type circuits such as tuners, modulators, oscillators and filters can be easily constructed.

Also, in the above described embodiments, the example of forming a pn junction layer 26 on a p-Si substrate 30 was given. However, other types of semiconductors such as germanium, or non-crystalline materials such as amorphous silicon can also be used.

What is claimed is:

1. An LC element comprising:
    a first electrode functioning as a gate having a predetermined shape, said first electrode formed on an insulation layer on a semiconductor substrate,
    a second electrode having a predetermined shape, said second electrode formed on said semiconductor substrate at an area adjacent to said first electrode,
    a channel formed in said semiconductor substrate at an area corresponding to said first electrode,
    a first diffusion region formed near one end of said channel,
    a second diffusion region formed near the other end of said channel,
    inductors respectively formed from said channel and said second electrode,
    a distributed constant type capacitor formed between said channel and said second electrode, and
    a signal transmission line formed from at least said channel.

2. An LC element according to claim 1, further comprising:
   first and second input/output electrodes electrically connected respectively to said first and second diffusion regions, and
   a ground electrode electrically connected near one end of said second electrode, wherein a signal is input to one of said first and second input/output electrodes and an output signal is obtained from the other one of the first and second input/output electrodes, and said ground electrode is connected to one of a fixed potential power supply and ground.

3. An LC element according to claim 2, wherein said first and second electrodes comprise spiral shapes.

4. An LC element according to claim 3, wherein
   only said channel is used as a signal transmission line,
   said second electrode is divided into a plurality of electrode segments, and
   the respective divided plurality of electrode segments are mutually connected electrically.

5. An LC element according to claim 3, wherein by a gate voltage applied to said first electrode controls a channel resistance.

6. An LC element according to claim 2, wherein said first and second electrodes comprise meander shapes.

7. An LC element according to claim 6, wherein
   only said channel is used as a signal transmission line,
   said second electrode is divided into a plurality of electrode segments, and
   the respective divided plurality of electrode segments are mutually connected electrically.

8. An LC element according to claim 6, wherein by a gate voltage applied to said first electrode controls a channel resistance.

9. An LC element according to claim 2, wherein said first and second electrodes comprise curved line shapes.

10. An LC element according to claim 2, wherein said first and second electrodes comprise straight line shapes.

11. An LC element according to claim 2, wherein
    only said channel is used as a signal transmission line,
    said second electrode is divided into a plurality of electrode segments, and
    the respective divided plurality of electrode segments are mutually connected electrically.

12. An LC element according to claim 2, wherein a gate voltage applied to said first electrode controls a channel resistance.

13. An LC element according to claim 2, wherein said semiconductor substrate is a semiconductor substrate comprising an inversion layer comprising one of an n region and a p region formed along said first and second electrodes.

14. An LC element according to claim 2, wherein a value of the distributed constant type capacitor is changed by setting a length of said second electrode either longer or shorter with respect to said first electrode.

15. An LC element according to claim 2, further comprising a buffer connected to the other one of the first and second input/output electrodes.

16. An LC element according to claim 1, further comprising:
    first and second input/output electrodes electrically connected respectively to said first and second diffusion regions,
    third and fourth input/output electrodes electrically connected respectively to one end and the other end of said second electrode, and
    signal transmission lines formed from said channel and said second electrode.

17. An LC element according to claim 16, wherein said first and second electrodes comprise spiral shapes.

18. An LC element according to claim 17, wherein by a gate voltage applied to said first electrode controls a channel resistance.

19. An LC element according to claim 16, wherein said first and second electrodes comprise meander shapes.

20. An LC element according to claim 19, wherein by a gate voltage applied to said first electrode controls a channel resistance.

21. An LC element according to claim 16, wherein said first and second electrodes comprise curved line shapes.

22. An LC element according to claim 16, wherein said first and second electrodes comprise straight line shapes.

23. An LC element according to claim 16, wherein a gate voltage applied to said first electrode controls a channel resistance.

24. An LC element according to claim 16, wherein said semiconductor substrate is a semiconductor substrate comprising an inversion layer comprising one of an n region and a p region formed along said first and second electrodes.

25. An LC element according to claim 16, wherein a value of the distributed constant type capacitor is changed by setting a length of said second electrode either longer or shorter with respect to said first electrode.

26. An LC element according to claim 16, further comprising a buffer connected to one of the third and fourth input/out electrodes connected to the second electrode.

27. An LC element comprising:
    a first electrode having a predetermined shape functioning as a gate, said first electrode formed on an insulation layer on one side of a semiconductor substrate,
    a second electrode having a predetermined shape, said second electrode formed at a position essentially opposing said first electrode on an opposite side of said semiconductor substrate,
    a channel formed in said semiconductor substrate at an area corresponding to said first electrode,
    a first diffusion region formed near one end of the channel,
    a second diffusion region formed near the other end of said channel,
    inductors respectively formed from said channel and said second electrode,
    a distributed constant type capacitor formed between said channel and said second electrode, and
    a signal transmission line formed from at least said channel.

28. An LC element according to claim 27, further comprising:
    first and second input/output electrodes electrically connected respectively to said first and second diffusion regions, and
    a ground electrode electrically connected near one end of said second electrode, wherein a signal is input to one of said first and second input/output electrodes and an output signal is obtained from the other one of the first and second input/output electrodes, and said ground electrode is connected to one of a fixed potential power supply and ground.

29. An LC element according to claim 28, wherein
said first and second electrodes comprise spiral shapes.

30. An LC element according to claim 29, wherein
only said channel is used as a signal transmission line,
said second electrode is divided into a plurality of electrode segments, and
the respective divided plurality of electrode segments are mutually connected electrically.

31. An LC element according to claim 29, wherein
a gate voltage applied to said first electrode controls a channel resistance.

32. An LC element according to claim 28, wherein
said first and second electrodes comprise meander shapes.

33. An LC element according to claim 32, wherein
only said channel is used as a signal transmission line,
said second electrode is divided into a plurality, and
the respective divided plurality of electrode segments are mutually connected electrically.

34. An LC element according to claim 32, wherein
a gate voltage applied to said first electrode controls a channel resistance.

35. An LC element according to claim 28, wherein
said first and second electrodes comprise curved line shapes.

36. An LC element according to claim 28, wherein
said first and second electrodes comprise straight line shapes.

37. An LC element according to claim 28, wherein
only said channel is used as a signal transmission line,
said second electrode is divided into a plurality of electrode segments, and
the respective divided plurality of electrode segments are mutually connected electrically.

38. An LC element according to claim 28, wherein
a gate voltage applied to said first electrode controls a channel resistance.

39. An LC element according to claim 28, wherein
said semiconductor substrate is a semiconductor substrate comprising an inversion layer comprising one of an n region and a p region formed between portions of said first electrode and portions of said second electrode.

40. An LC element according to claim 28, wherein a value of said distributed constant type capacitor is changed by setting a length of said second electrode either longer or shorter with respect to said first electrode.

41. An LC element according to claim 28, further comprising a buffer connected to the other one of the first and second input/output electrodes.

42. An LC element according to claim 27, further comprising:
first and second input/output electrodes electrically connected respectively to said first and second diffusion regions,
third and fourth input/output electrodes electrically connected respectively to one end and the other end of said second electrode, and
signal transmission lines formed from the channel and said second electrode.

43. An LC element according to claim 42, wherein
said first and second electrodes comprise spiral shapes.

44. An LC element according to claim 43, wherein
a gate voltage applied to said first electrode controls a channel resistance.

45. An LC element according to claim 42, wherein
said first and second electrodes comprise meander shapes.

46. An LC element according to claim 45, wherein
a gate voltage applied to said first electrode controls a channel resistance.

47. An LC element according to claim 42, wherein
said first and second electrodes comprise curved line shapes.

48. An LC element according to claim 42, wherein
said first and second electrodes comprise straight line shapes.

49. An LC element according to claim 42, wherein
a gate voltage applied to said first electrode controls a channel resistance.

50. An LC element according to claim 42, wherein
said semiconductor substrate is a semiconductor substrate comprising an inversion layer comprising one of an n region and a p region formed between portions of said first electrode and portions of said second electrode.

51. An LC element according to claim 42, wherein a value of said distributed constant type capacitor is changed by setting a length of said second electrode either longer or shorter with respect to said first electrode.

52. An LC element according to claim 42, further comprising a buffer connected to one of the third and fourth input/output electrodes connected to the second electrode.

53. An LC element comprising:
a first electrode functioning as a gate having a predetermined shape, said first electrode formed on an insulation layer on a semiconductor substrate,
a second electrode having a predetermined shape, said second electrode formed on said semiconductor substrate at an area adjacent to said first electrode,
a channel formed in said semiconductor substrate at an area corresponding to said first electrode,
a diffusion region formed near one end of said channel,
inductors respectively formed from said channel and said second electrode,
a distributed constant type capacitor formed between said channel and said second electrode, and
a signal transmission line formed from said second electrode.

54. An LC element according to claim 53, further comprising:
first and second input/output electrodes electrically connected respectively to one end and the other end of said second electrode, and
a ground electrode electrically connected to said diffusion region, wherein a signal is input to one of said first and second input/output electrodes and an output signal is obtained from the other one of the first and second input/output electrodes, and said ground electrode is connected to one of a fixed potential power supply and ground.

55. An LC element according to claim 54, wherein
said first and second electrodes comprise spiral shapes.

56. An LC element according to claim 55, further comprising a plurality of diffusion regions and a plurality of channels, wherein said first electrode is divided into a plurality of electrode segments, said plurality of channels are formed in said semiconductor substrate at areas respectively corresponding to said plurality of electrode segments, each diffusion region is provided near one end of one of the plurality of channels, and the plurality of diffusion regions are electrically connected.

57. An LC element according to claim 55, wherein a gate voltage applied to said first electrode controls a channel resistance.

58. An LC element according to claim 54, wherein said first and second electrodes comprise meander shapes.

59. An LC element according to claim 58, further comprising a plurality of diffusion regions and a plurality of channels, wherein said first electrode is divided into a plurality of electrode segments, said plurality of channels are formed in said semiconductor substrate at areas respectively corresponding to said plurality of electrode segments, each diffusion region is provided near one end of one of the plurality of channels, and the plurality of diffusion regions are electrically connected.

60. An LC element according to claim 58, wherein a gate voltage applied to said first electrode controls a channel resistance.

61. An LC element according to claim 54, wherein said first and second electrodes comprise curved line shapes.

62. An LC element according to claim 54, wherein said first and second electrodes comprise straight line shapes.

63. An LC element according to claim 54, further comprising a plurality of diffusion regions and a plurality of channels, wherein said first electrode is divided into a plurality of electrode segments, said plurality of channels are formed in said semiconductor substrate at areas respectively corresponding to said plurality of electrode segments, each diffusion region is provided near one end of one of the plurality of channels, and the plurality of diffusion regions are electrically connected.

64. An LC element according to claim 54, wherein a gate voltage applied to said first electrode controls a channel resistance.

65. An LC element according to claim 54, wherein said semiconductor substrate is a semiconductor substrate comprising an inversion layer comprising one of an n region and a p region formed along said first and second electrodes.

66. An LC element according to claim 54, wherein a value of said distributed constant type capacitor is changed by setting a length of said second electrode either longer or shorter with respect to said first electrode.

67. An LC element according to claim 54, further comprising a buffer connected to the other one of the first and second input/output electrodes.

68. An LC element comprising:

a first electrode functioning as a gate having a predetermined shape, said first electrode formed on an insulation layer on a semiconductor substrate, a second electrode having a predetermined shape, said second electrode formed at an essentially opposing position to said first electrode on an opposite side of said semiconductor substrate, a channel formed in said semiconductor substrate at an area corresponding to said first electrode, a diffusion region formed near one end of said channel, inductors respectively formed from said channel and said second electrode, a distributed constant type capacitor formed between said channel and said second electrode, and a signal transmission line formed from said second electrode.

69. An LC element according to claim 68, further comprising:

first and second input/output electrodes electrically connected respectively to one end and the other end of said second electrode, and a ground electrode electrically connected to said diffusion region, wherein a signal is input to one of said first and second input/output electrodes and an output signal is obtained from the other one of the first and second input/output electrodes, and said ground electrode is connected to one of a fixed potential power supply and ground.

70. An LC element according to claim 69, wherein said first and second electrodes comprise spiral shapes.

71. An LC element according to claim 70, further comprising a plurality of diffusion regions and a plurality of channels, wherein said first electrode is divided into a plurality of electrode segments, said plurality of channels are formed in said semiconductor substrate at areas respectively corresponding to said plurality of electrode segments, each diffusion region is provided near one end of one of the plurality of channels, and the plurality of diffusion regions are electrically connected.

72. An LC element according to claim 70, wherein a gate voltage applied to said first electrode controls a channel resistance.

73. An LC element according to claim 69, wherein said first and second electrodes comprise meander shapes.

74. An LC element according to claim 73, further comprising a plurality of diffusion regions and a plurality of channels, wherein said first electrode is divided into a plurality of electrode segments, said plurality of channels are formed in said semiconductor substrate at areas respectively corresponding to said plurality of electrode segments, each diffusion region is provided near one end of one of the plurality of channels, and the plurality of diffusion regions are electrically connected.

75. An LC element according to claim 73, wherein a gate voltage applied to said first electrode controls a channel resistance.

76. An LC element according to claim 69, wherein said first and second electrodes comprise curved line shapes.

77. An LC element according to claim 69, wherein said first and second electrodes comprise straight line shapes.

78. An LC element according to claim 69, further comprising a plurality of diffusion regions and a plurality of channels, wherein said first electrode is divided into a plurality of electrode segments, said plurality of channels are formed in said semiconductor substrate at areas respectively corresponding to said plurality of electrode segments, each diffusion region is provided near one end of one of the plurality of channels, and the plurality of diffusion regions are electrically connected.

79. An LC element according to claim 69, wherein a gate voltage applied to said first electrode controls a channel resistance.

80. An LC element according to claim 69, wherein said semiconductor substrate is a semiconductor substrate comprising an inversion layer comprising one of an n region and a p region formed between neighboring conductor portions of said first electrode and between neighboring conductor portions of said second electrode.

81. An LC element according to claim 69, wherein a value of said distributed constant type capacitor is changed by setting a length of said second electrode either longer or shorter with respect to said first electrode.

82. An LC element according to claim 69, further comprising a buffer connected to the other one of said first and second input/output electrodes.

* * * * *